US012804925B2

(12) United States Patent
Konishi et al.

(10) Patent No.: US 12,804,925 B2
(45) Date of Patent: Nov. 17, 2026

(54) SEMICONDUCTOR DEVICE

(71) Applicant: Mitsubishi Electric Corporation, Tokyo (JP)

(72) Inventors: Kazuya Konishi, Tokyo (JP); Akihiko Furukawa, Tokyo (JP); Koichi Nishi, Tokyo (JP); Hidenori Fujii, Tokyo (JP); Shinya Soneda, Tokyo (JP); Yasuo Konishi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 943 days.

(21) Appl. No.: 17/808,894

(22) Filed: Jun. 24, 2022

(65) Prior Publication Data

US 2023/0083162 A1 Mar. 16, 2023

(30) Foreign Application Priority Data

Sep. 14, 2021 (JP) ................................ 2021-149681

(51) Int. Cl.
*H10D 12/00* (2025.01)
*H10D 8/00* (2025.01)
(Continued)

(52) U.S. Cl.
CPC ........... *H10D 12/481* (2025.01); *H10D 8/422* (2025.01); *H10D 12/038* (2025.01); *H10D 62/127* (2025.01); *H10D 62/142* (2025.01)

(58) Field of Classification Search
CPC ............. H01L 29/7397; H01L 29/0696; H01L 29/0834; H01L 29/66348; H01L 29/8613;
(Continued)

(56) References Cited

U.S. PATENT DOCUMENTS 10,192,977 B2 1/2019 Furukawa et al.
2012/0043581 A1* 2/2012 Koyama ............ H01L 29/8613 257/140
(Continued)

FOREIGN PATENT DOCUMENTS

DE 10 2012 100 349 A1 7/2012
DE 10 2014 109 475 A1 1/2015
(Continued)

OTHER PUBLICATIONS

An Office Action; "Notice of Reasons for Refusal," mailed by the Japanese Patent Office on Jul. 16, 2024, which corresponds to Japanese Patent Application No. 2021-149681 and is related to U.S. Appl. No. 17/808,894; with English language translation.
(Continued)

*Primary Examiner* — Bitew A Dinke
(74) *Attorney, Agent, or Firm* — Studebaker Brackett PLLC

(57) ABSTRACT

A diode region includes: an n-type first semiconductor layer provided on a second-main-surface side in the semiconductor substrate; an n-type second semiconductor layer provided on the first semiconductor layer; a p-type third semiconductor layer provided closer to a first main surface of the semiconductor substrate than the second semiconductor layer; a first main electrode that applies a first potential to the diode; a second main electrode that applies a second potential to the diode; and a dummy active trench gate provided so as to extend from the first main surface of the semiconductor substrate and reach the second semiconductor layer. The dummy active trench gate includes the third semiconductor layer that is not applied with the first potential to be in a floating state on at least one of two side surfaces, and the dummy active trench gate is applied with a gate potential of the transistor.

16 Claims, 32 Drawing Sheets

(51) Int. Cl.
*H10D 12/01* (2025.01)
*H10D 62/10* (2025.01)
*H10D 62/13* (2025.01)

(58) Field of Classification Search
CPC ........... H01L 29/0619; H01L 29/66068; H01L 29/083; H01L 29/1608; H01L 29/6606; H01L 29/407; H10D 12/481; H10D 8/422; H10D 12/038; H10D 62/127; H10D 62/142; H10D 8/043; H10D 62/8325; H10D 62/129; H10D 62/145; H10D 64/117; H10D 62/106
See application file for complete search history.

(56) References Cited

U.S. PATENT DOCUMENTS

| | | | | |
|---|---|---|---|---|
| 2012/0181575 | A1 | 7/2012 | Pfirsch | |
| 2013/0037853 | A1* | 2/2013 | Onozawa | H01L 29/41766 257/E29.198 |
| 2014/0027814 | A1 | 1/2014 | Pfirsch | |
| 2015/0015309 | A1 | 1/2015 | Werber | |
| 2015/0144995 | A1* | 5/2015 | Takahashi | H01L 29/7397 257/139 |
| 2016/0247808 | A1* | 8/2016 | Horiuchi | H10D 30/60 |
| 2016/0372585 | A1* | 12/2016 | Furukawa | H01L 29/1004 |
| 2018/0158815 | A1* | 6/2018 | Onozawa | H01L 21/266 |
| 2018/0204909 | A1* | 7/2018 | Konishi | H01L 29/407 |
| 2018/0269202 | A1* | 9/2018 | Yamano | H01L 29/7397 |
| 2018/0308757 | A1* | 10/2018 | Kakimoto | H01L 27/06 |
| 2018/0323294 | A1* | 11/2018 | Okuda | H01L 29/0619 |
| 2019/0157264 | A1* | 5/2019 | Yoshida | H01L 27/0716 |
| 2019/0181136 | A1* | 6/2019 | Niwa | H10D 62/60 |
| 2019/0326424 | A1* | 10/2019 | Kamibaba | H01L 29/1004 |
| 2020/0006538 | A1* | 1/2020 | Kamibaba | H01L 29/0696 |
| 2020/0091329 | A1* | 3/2020 | Mitsuzuka | H01L 29/417 |
| 2020/0098747 | A1* | 3/2020 | Tamura | H01L 29/7397 |
| 2020/0126973 | A1* | 4/2020 | Kamibaba | H01L 29/1004 |
| 2020/0194562 | A1 | 6/2020 | Yoshimura et al. | |
| 2020/0287028 | A1* | 9/2020 | Kamibaba | H01L 27/0716 |
| 2020/0365582 | A1* | 11/2020 | Yoshida | H01L 29/063 |
| 2021/0091072 | A1* | 3/2021 | Matsudai | H01L 29/407 |
| 2021/0134990 | A1* | 5/2021 | Nishi | H01L 29/66348 |
| 2021/0265491 | A1* | 8/2021 | Soneda | H01L 29/0607 |
| 2021/0280576 | A1* | 9/2021 | Nishi | H01L 29/1095 |
| 2021/0320195 | A1* | 10/2021 | Harada | H01L 29/407 |
| 2022/0157976 | A1* | 5/2022 | Konishi | H10D 12/038 |

FOREIGN PATENT DOCUMENTS

| | | | |
|---|---|---|---|
| DE | 10 2021 101 762 | A1 | 8/2021 |
| JP | 2015-019370 | A | 1/2015 |
| JP | 6253769 | B2 | 12/2017 |
| JP | 2021-136311 | A | 9/2021 |

OTHER PUBLICATIONS

Office Action issued in DE 10 2022 120 566.5; mailed by the German Patent and Trademark Office on Nov. 22, 2024.
An Office Action; mailed by the China National Intellectual Property Administration of the People's Republic of China on Jun. 27, 2025, which corresponds to Chinese Patent Application No. 202211102670.5 and is related to U.S. Appl. No. 17/808,894.

* cited by examiner

SEMICONDUCTOR DEVICE

BACKGROUND OF THE INVENTION

Field of the Invention

The present disclosure relates to a semiconductor device, and particularly to a semiconductor device including a trench gate.

Description of the Background Art

Typical examples of a semiconductor device including a trench gate include an insulated gate bipolar transistor (IGBT).

An IGBT has, as its basic configuration, a configuration in which trenches are provided in one main surface of a semiconductor substrate, inner surfaces of the trenches are covered with a gate insulating film, and a plurality of trench gates formed of gate electrodes embedded in the trenches having their inner surfaces covered with the gate insulating film, are included.

In contrast thereto, an IGBT disclosed in Japanese Patent No. 6253769 has a configuration in which one or more dummy trench gates that do not function as gates are provided between adjacent trench gates. For example, in FIG. 1 of Japanese Patent No. 6253769, three dummy trench gates are provided between adjacent trench gates, and a central dummy trench gate among them is applied with a gate potential, to serve as an active dummy trench gate, and the dummy trench gates on both sides of the central dummy trench gate serve as isolated dummy trench gates applied with an emitter potential.

Those dummy trench gates are covered with a continuous interlayer insulating film, and a p-type base region between the dummy trench gates is not electrically connected to an emitter potential to be in a floating state.

Employing such a configuration allows arrangement in which the floating p-type base regions not applied with an emitter potential are on both sides of the active dummy trench gate applied with a gate potential, thereby increasing gate-collector capacitance (feedback capacitance) Cgc between the gate and the collector of the IGBT. The feedback capacitance (Cgc) is increased in order to reduce a turn-on loss under a condition that dV/dt that is variation in a drain voltage V with time t, is constant, and to increase a gate capacitance ratio Cgc/Cge determined by a capacitance ratio of the feedback capacitance (Cgc) to gate-emitter capacitance Cge.

As described above, in the semiconductor device according to the background art, the active dummy trench gate is provided in one main surface of the semiconductor substrate, in other words, above a collector layer, so that holes injected from the collector layer at the time of turn-on cause variation in the potential of the floating p-type base region. As a result, a displacement current flows through the active dummy trench gate, and the gate voltage is biased. Thus, dV/dt cannot be reduced in spite of an increase of gate resistance (Rg), which results in reduction of gate-resistance controllability of dV/dt, to probably invite an increase of a turn-on loss in a region where dV/dt is low.

SUMMARY

An object of the present disclosure is to provide a semiconductor device that improves the controllability of dV/dt to reduce a turn-on loss.

In a semiconductor device according to the present disclosure, a transistor and a diode are formed on a common semiconductor substrate, wherein the semiconductor substrate includes: a transistor region in which the transistor is formed; and a diode region in which the diode is formed, the diode region includes a first semiconductor layer of a first conductivity type provided on a second-main-surface side in the semiconductor substrate; a second semiconductor layer of the first conductivity type provided on the first semiconductor layer; a third semiconductor layer of a second conductivity type provided closer to a first main surface of the semiconductor substrate than the second semiconductor layer; a first main electrode that applies a first potential to the diode; a second main electrode that applies a second potential to the diode; and at least one dummy active trench gate provided so as to extend from the first main surface of the semiconductor substrate and reach the second semiconductor layer, the at least one dummy active trench gate includes the third semiconductor layer that is not applied with the first potential to be in a floating state on at least one of two side surfaces, and the at least one dummy active trench gate is applied with a gate potential of the transistor.

In the semiconductor device according to the present disclosure, the diode region includes at least one dummy active trench gate that includes the third semiconductor layer that is not applied with the first potential to be in a floating state on one of two side surfaces, and is applied with the gate potential of the transistor. Thus, the controllability of dV/dt that is variation in a drain voltage V with time t is improved, so that a semiconductor device with a reduced turn-on loss can be obtained.

These and other objects, features, aspects and advantages of the present disclosure will become more apparent from the following detailed description of the present disclosure when taken in conjunction with the accompanying drawings.

DESCRIPTION OF THE PREFERRED EMBODIMENTS

<Introduction>

In the following description, the terms "n type" and "p type" mean a conductivity type of a semiconductor, and in the present disclosure, the description will be made on the assumption that a first conductivity type is an n type and a second conductivity type is a p type. However, a first conductivity type may be a p type and a second conductivity type may be an n type. Further, an n type indicates that an impurity concentration is lower than that of an n type, and an $n^+$ type indicates that an impurity concentration is higher than that of an n type. Likewise, a $p^-$ type indicates that an impurity concentration is lower than that of a p type, and a $p^+$ type indicates that an impurity concentration is higher than that of a p type.

Further, the drawings are schematically illustrated, and mutual relationships in size and position between images illustrated in different drawings are not necessarily accurately described, and can be appropriately changed. Moreover, in the following description, similar components are denoted by the same reference signs, and their names and functions are also similar. Therefore, a detailed description thereof is omitted where appropriate.

Furthermore, while terms meaning specific positions and directions such as "upper", "lower", "side", "front", and "back" are used in some portions in the following description, these terms are used for the sake of convenience, to facilitate understanding of the contents of preferred embodiments and are not related to directions in practical applications.

Prior to the description of the preferred embodiments, a reverse conducting IGBT (RC-IGBT) in which an IGBT and a freewheeling diode (FWD) are provided in a common semiconductor substrate will be described below.

Figure 1:
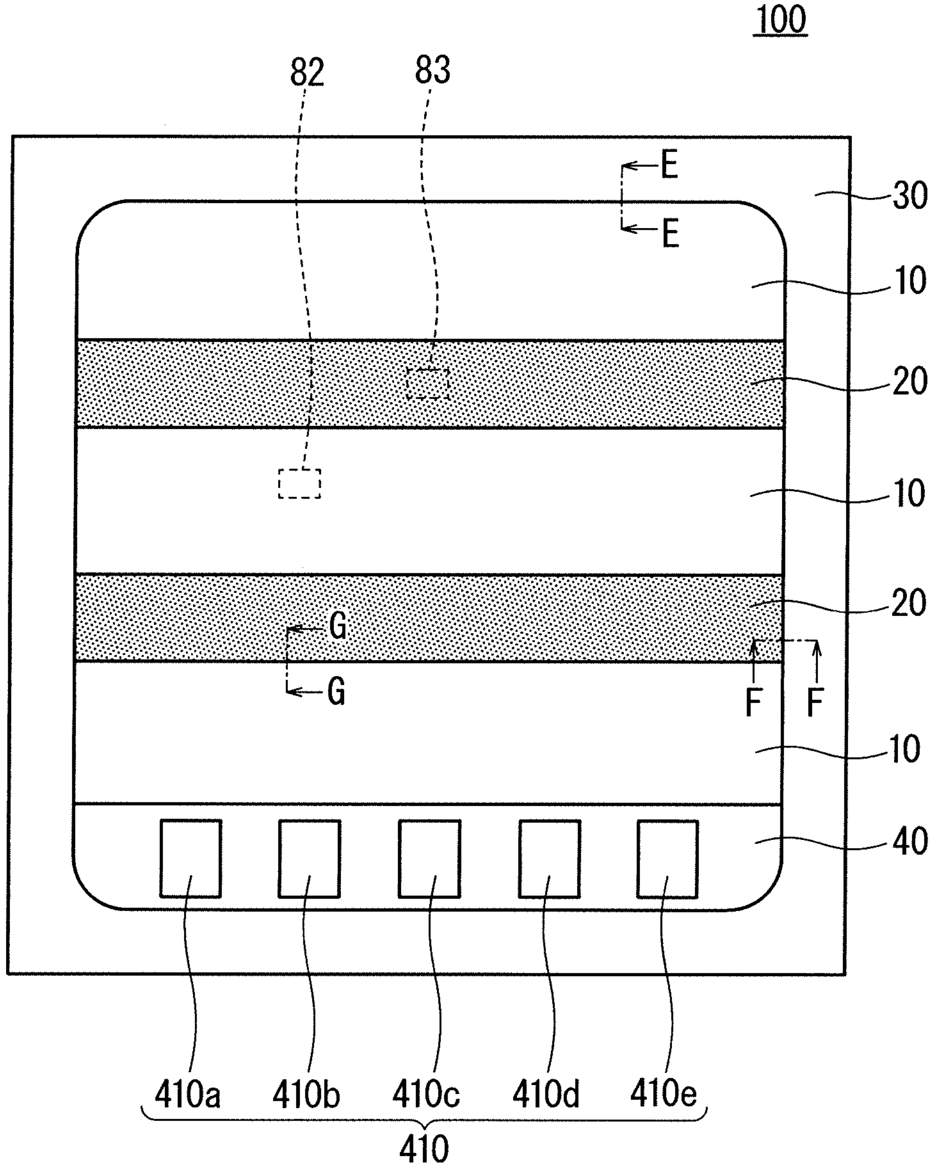
FIGS. 1 and 2 are plan views each illustrating a semiconductor device that is an RC-IGBT.
Figure 2:
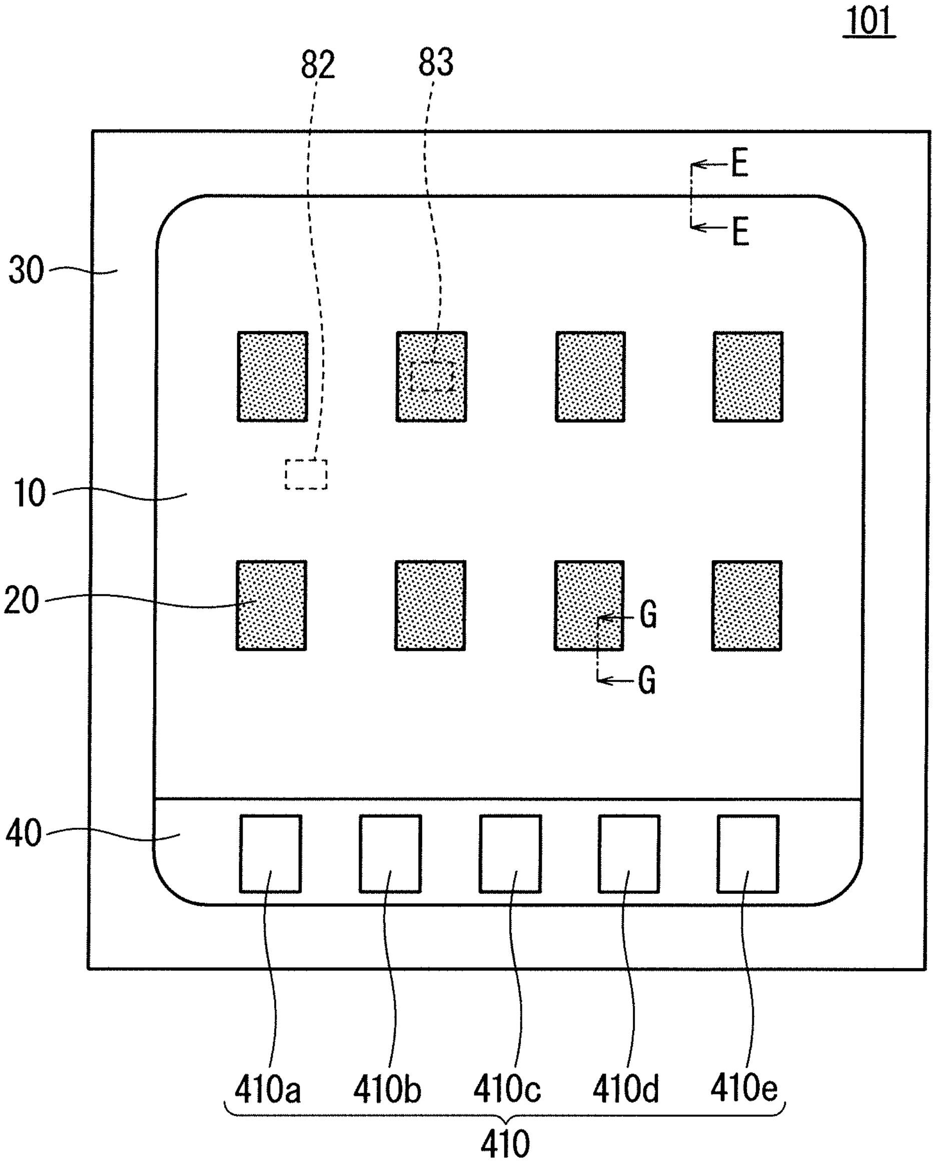

FIG. 1 is a plan view illustrating a semiconductor device that is an RC-IGBT. Further, FIG. 2 is a plan view illustrating a semiconductor device that is an RC-IGBT having a different configuration. A semiconductor device 100 illustrated in FIG. 1 is provided with IGBT regions 10 and diode regions 20 arranged in stripes, and may be simply referred to as a "stripe type". A semiconductor device 101 illustrated in FIG. 2 is provided with a plurality of diode regions 20 arranged along the longitudinal direction and the lateral direction and the IGBT region 10 arranged around the diode regions 20, and may be simply referred to as an "island type".

(1) Overall Configuration of Stripe Type in Plan View

In FIG. 1, the semiconductor device 100 includes the IGBT regions 10 and the diode regions 20 in one semiconductor device. The IGBT regions 10 and the diode regions 20 extend from one end to the other end of the semiconductor device 100, and alternate with each other along a direction perpendicular to the extending direction of the IGBT regions 10 and the diode regions 20 so as to form stripes. In FIG. 1, three IGBT regions 10 and two diode regions are illustrated, and each of all the diode regions 20 is interposed between the IGBT regions 10. However, the number of the IGBT regions 10 and the number of the diode regions 20 are not limited thereto, and the number of the IGBT regions 10 may be three or more and three or less, and the number of the diode regions 20 may be two or more and two or less. Further, the IGBT regions 10 and the diode regions 20 in FIG. 1 may be interchanged in their positions, or each of all the IGBT regions 10 may be interposed between the diode regions 20. Moreover, the IGBT regions 10 and the diode regions 20 may be provided adjacent to each other in one-to-one correspondence.

As illustrated in FIG. 1, a pad region 40 is provided adjacent to the IGBT region 10 on the lower side in the drawing sheet. The pad region 40 is a region where a control pad 410 for controlling the semiconductor device 100 is provided. The IGBT regions 10 and the diode regions 20 are collectively referred to as a cell region. A termination region 30 is provided around a combined region of the cell region and the pad region 40 in order to maintain a breakdown voltage of the semiconductor device 100. The termination region 30 can be provided with a known breakdown-voltage maintaining structure appropriately selected. To form the breakdown-voltage maintaining structure, for example, a field limiting ring (FLR) in which a p-type termination well layer of a p-type semiconductor surrounds a cell region and a region of variation of lateral doping (VLD) in which a p-type well layer with a concentration gradient surrounds a cell region may be provided on a first-main-surface side which is the front-surface side in the semiconductor device 100. The number of ring-shaped p-type termination well layers used for the FLR and the concentration distribution used for the VLD may be appropriately selected in accordance with the breakdown-voltage design of the semiconductor device 100. Moreover, a p-type termination well layer may be provided over the substantially entire pad region 40, and an IGBT cell and a diode cell may be provided in the pad region 40.

The control pad 410 may include a current sensing pad 410*a*, a Kelvin emitter pad 410*b*, a gate pad 410*c*, and temperature sensing diode pads 410*d* and 410*e*, for example. The current sensing pad 410*a* is a control pad for sensing a current flowing through the cell region of the semiconductor device 100, and is a control pad that is electrically connected to a part of IGBT cells or diode cells in the cell region so as to cause flow of a current corresponding to a fraction or one/tens of thousands of a current flowing through the entire cell region when a current flows through the cell region of the semiconductor device 100.

The Kelvin emitter pad 410*b* and the gate pad 410*c* are control pads to which a gate drive voltage for controlling turn-on and turn-off of the semiconductor device 100 is applied. The Kelvin emitter pad 410*b* is electrically connected to a p-type base layer of the IGBT cell, and the gate pad 410*c* is electrically connected to a gate trench electrode of the IGBT cell. The Kelvin emitter pad 410*b* and the p-type base layer may be electrically connected to each other via a $p^+$-type contact layer. The temperature sensing diode pads 410*d* and 410*e* are control pads electrically connected to an anode and a cathode of a temperature sensing diode provided in the semiconductor device 100. A voltage across the anode and the cathode of the temperature sensing diode (not illustrated) provided in the cell region is measured, and the temperature of the semiconductor device 100 is measured.

(2) Overall Configuration of Island Type in Plan View

In FIG. 2, a semiconductor device 101 includes the IGBT region 10 and the diode regions 20 in one semiconductor device. The plurality of diode regions 20 are arranged side by side along the longitudinal direction and the lateral direction in the semiconductor device, and the diode regions 20 are surrounded by the IGBT region 10. In other words, the plurality of diode regions 20 are provided so as to form an island shape in the IGBT region 10. While FIG. 2 illustrates a configuration in which the diode regions 20 are provided in a matrix of four columns along the lateral direction of the drawing sheet and two rows along the longitudinal direction of the drawing sheet, the number and arrangement of the diode regions 20 are not limited thereto. It is only required that one or more diode regions 20 are interspersed in the IGBT region 10, and each diode region 20 is surrounded by the IGBT region 10.

As illustrated in FIG. 2, the pad region 40 is provided adjacent to the IGBT region 10 on the lower side in the drawing sheet. The pad region 40 is a region where the control pad 410 for controlling the semiconductor device 101 is provided. The IGBT regions 10 and the diode regions 20 are collectively referred to as a cell region. The termination region 30 is provided around a combined region of the cell region and the pad region 40 in order to maintain a breakdown voltage of the semiconductor device 101. The termination region 30 can be provided with a known breakdown-voltage maintaining structure appropriately selected. To form the breakdown-voltage maintaining structure, for example, a field limiting ring (FIR) in which a p-type termination well layer of a p-type semiconductor surrounds the combined region of the cell region and the pad region 40 and a region of variation of lateral doping (VLD) in which a p-type well layer with a concentration gradient surrounds the cell region may be provided on a first-main-surface side that is the front-surface side in the semiconductor device 101. The number of ring-shaped p-type termination well layers used for the FLR and the concentration distribution used for the VLD may be appropriately selected in accordance with the breakdown-voltage design of the semiconductor device 101. Moreover, a p-type termination well layer may be provided over the substantially entire pad region 40, and an IGBT cell and a diode cell may be provided in the pad region 40.

The control pad 410 may include a current sensing pad 410*a*, a Kelvin emitter pad 410*b*, a gate pad 410*c*, and temperature sensing diode pads 410*d* and 410*e*, for example. The current sensing pad 410*a* is a control pad for sensing a current flowing through the cell region of the semiconductor device 101, and is a control pad that is electrically connected to a part of IGBT cells or diode cells in the cell region so as to cause flow of a current corresponding to a fraction or one/tens of thousands of a current flowing through the entire cell region when a current flows through the cell region of the semiconductor device 101.

The Kelvin emitter pad 410*b* and the gate pad 410*c* are control pads to which a gate drive voltage for controlling turn-on and turn-off of the semiconductor device 101 is applied. The Kelvin emitter pad 410*b* is electrically connected to a p-type base layer and an $n^+$-type source layer of the IGBT cell, and the gate pad 410*c* is electrically connected to a gate trench electrode of the IGBT cell. The Kelvin emitter pad 410*b* and the p-type base layer may be electrically connected to each other via a $p^+$-type contact layer. The temperature sensing diode pads 410*d* and 410*e* are control pads electrically connected to an anode and a cathode of a temperature sensing diode provided in the semiconductor device 101. A voltage across the anode and the cathode of the temperature sensing diode (not illustrated) provided in the cell region is measured, and the temperature of the semiconductor device 101 is measured.

(3) Typical Configuration of IGBT Region 10

Figure 3:
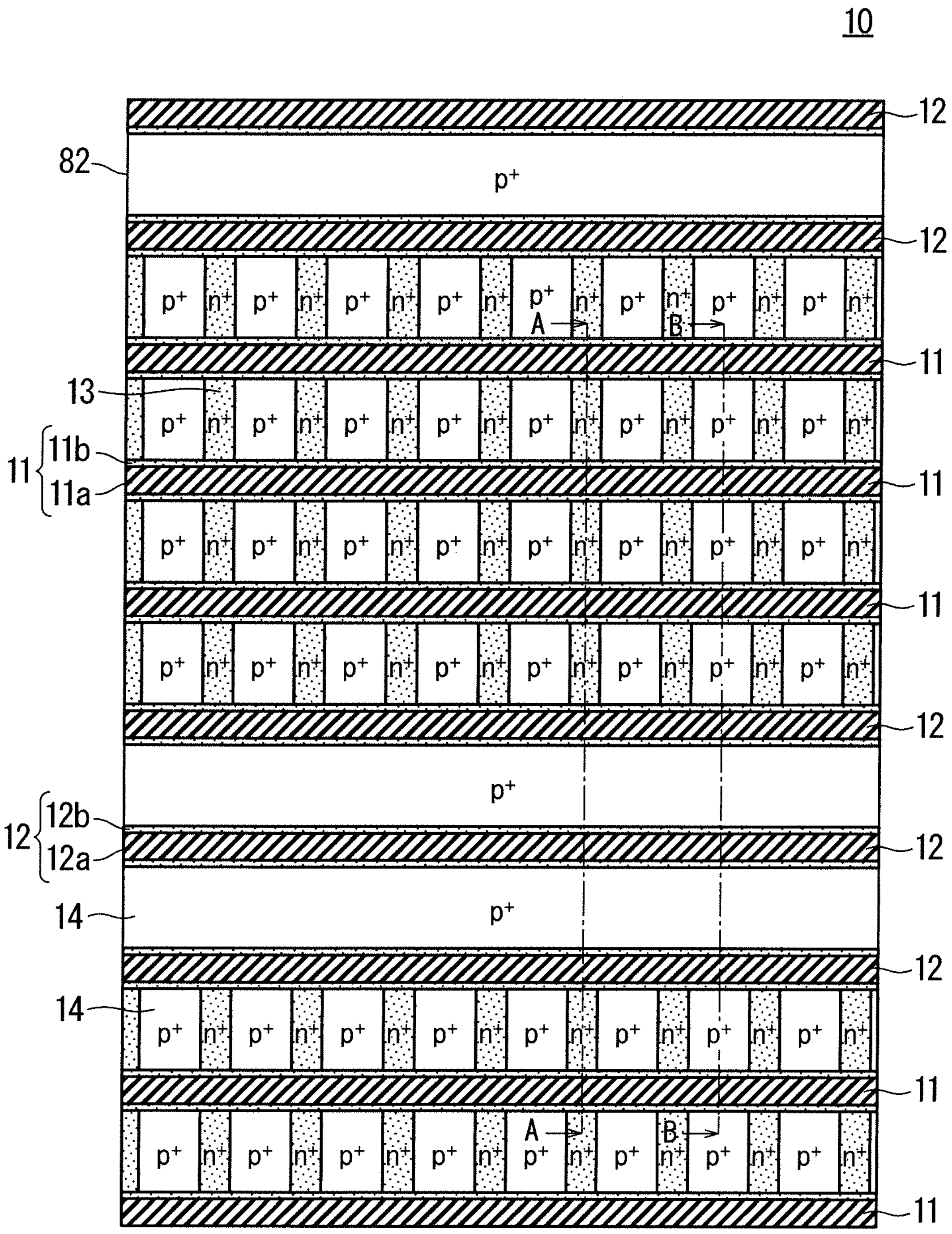
FIG. 3 is a partial plan view of an IGBT region in the RC-IGBT.
Figure 4:
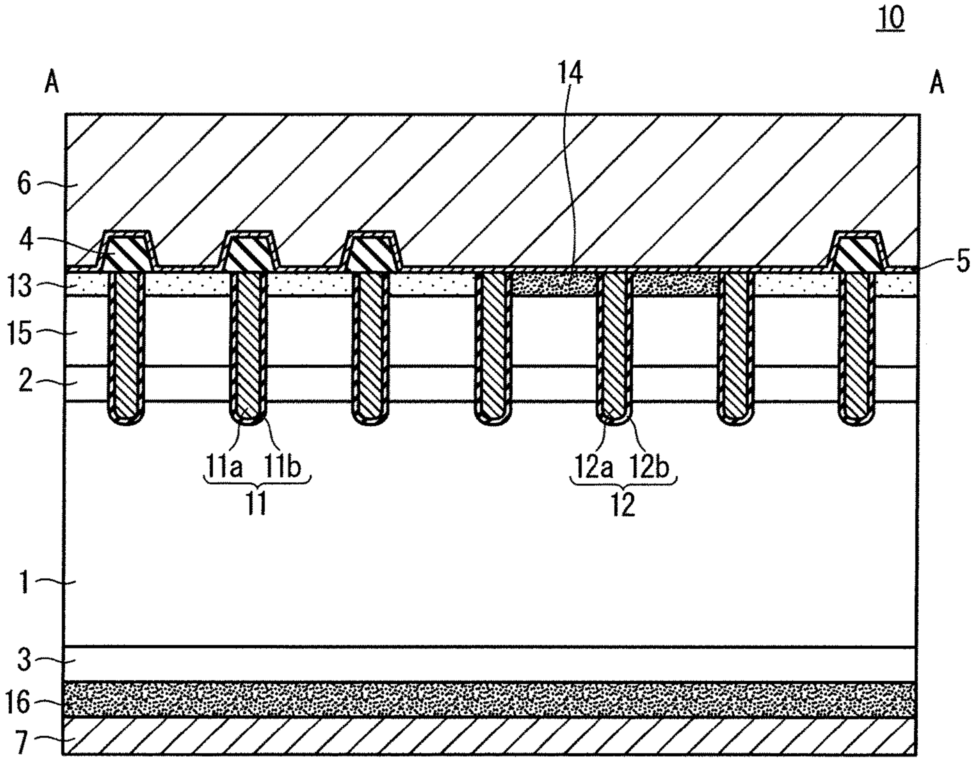
FIGS. 4 and 5 are partial sectional views of the IGBT region in the RC-IGBT.
Figure 5:
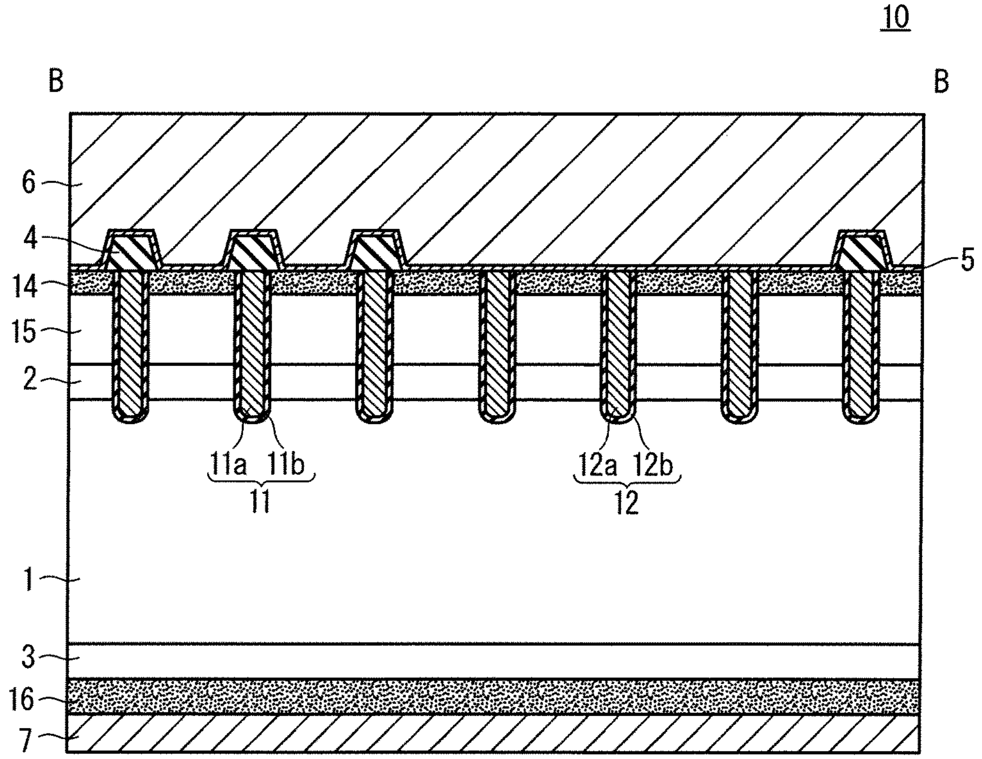

FIG. 3 is an enlarged partial plan view illustrating a configuration of an IGBT region of a semiconductor device that is an RC-IGBT. Further, FIGS. 4 and 5 are sectional views illustrating a configuration of the IGBT region of the semiconductor device that is an RC-IGBT. FIG. 3 is an enlarged view of a region 82 surrounded by a broken line in the semiconductor device 100 illustrated in FIG. 1 or the semiconductor device 101 illustrated in FIG. 2. FIG. 4 is a sectional view taken along a broken line A-A in the semiconductor device 100 or the semiconductor device 101 illustrated in FIG. 3 as seen from the arrow direction, and FIG. 5 is a sectional view taken along a broken line B-B in the semiconductor device 100 or the semiconductor device 101 illustrated in FIG. 3 as seen from the arrow direction.

As illustrated in FIG. 3, in the IGBT region 10, active trench gates 11 and dummy trench gates 12 are provided in stripes. In the semiconductor device 100, the active trench gates 11 and the dummy trench gates 12 extend along the lengthwise direction of the IGBT region 10, and the lengthwise direction of the IGBT region 10 corresponds to the lengthwise direction of the active trench gates 11 and the dummy trench gates 12. On the other hand, in the semiconductor device 101, while there is no definite distinction between the lengthwise direction and the widthwise direction of the IGBT region 10, the lateral direction of the drawing sheet may be regarded as corresponding to the lengthwise direction of the active trench gates 11 and the dummy trench gates 12, and the longitudinal direction of the drawing sheet may be regarded as corresponding to the lengthwise direction of the active trench gates 11 and the dummy trench gates 12.

The active trench gate 11 is formed of a gate trench electrode 11*a* that is provided in a trench formed in a semiconductor substrate with a gate trench insulating film 11*b* interposed therebetween. The dummy trench gate 12 is formed of a dummy trench electrode 12*a* that is provided in a trench formed in the semiconductor substrate with a dummy trench insulating film 12*b* interposed therebetween. The gate trench electrode 11*a* of the active trench gate 11 is electrically connected to the gate pad 410*c*. The dummy trench electrode 12*a* of the dummy trench gate 12 is electrically connected to an emitter electrode provided on the first main surface of the semiconductor device 100 or the semiconductor device 101.

An $n^+$-type source layer 13 is provided on both sides of the active trench gate 11 along the width direction in contact with the gate trench insulating film 11*b*. The $n^+$-type source layer 13 is a semiconductor layer containing arsenic or phosphorus, for example, as an n-type impurity, and the concentration of n-type impurities is $1.0\times10^{17}/cm^3$ to $1.0\times10^{20}/cm^3$. The $n^+$-type source layer 13 is provided so as to alternate with a $p^+$-type contact layer 14 along the extending direction of the active trench gate 11. The $p^+$-type contact layer 14 is also provided between two adjacent ones of the dummy trench gates 12. The $p^+$-type contact layer 14 is a semiconductor layer containing boron or aluminum, for example, as a p-type impurity, and the concentration of p-type impurities is $1.0\times10^{15}/cm^3$ to $1.0\times10^{20}/cm^3$.

As illustrated in FIG. 3, in the IGBT region 10 of the semiconductor device 100 or the semiconductor device 101, three dummy trench gates 12 are arranged adjacent to arrangement of three active trench gates 11, and three active trench gates 11 are arranged adjacent to arrangement of three dummy trench gates 12. The IGBT region 10 has a configuration in which a set of the active trench gates 11 and a set of the dummy trench gates 12 are arranged so as to alternate with each other as described above. Though the number of active trench gates 11 included in one set of the active trench gates 11 is three in FIG. 3, it is only required that one or more active trench gates 11 are included in one set. Further, the number of dummy trench gates 12 included in one set of the dummy trench gates 12 may be one or more, and the number of the dummy trench gates 12 may be zero. In other words, all the trenches provided in the IGBT region 10 may be used as the active trench gates 11.

FIG. 4 is a sectional view taken along a broken line A-A in the semiconductor device 100 or the semiconductor device 101 illustrated in FIG. 3 as seen from the arrow direction, and is a sectional view of the IGBT region 10. The semiconductor device 100 or the semiconductor device 101 includes an $n^-$-type drift layer 1 that is a second semiconductor layer formed of a semiconductor substrate. The $n^-$-type drift layer 1 is a semiconductor layer containing arsenic or phosphorus, for example, as an n-type impurity, and the concentration of n-type impurities is $1.0\times10^{12}/cm^3$ to $1.0\times10^{15}/cm^3$. In FIG. 4, the semiconductor substrate extends over a range from the $n^+$-type source layer 13 and the $p^+$-type contact layer 14 to a p-type collector layer 16. In FIG. 4, the ends of the $n^+$-type source layer 13 and the $p^+$-type contact layer 14 on the upper side in the drawing sheet are referred to as a first main surface of the semiconductor substrate, and the end of the p-type collector layer 16 on the lower side in the drawing sheet is referred to as a second main surface of the semiconductor substrate. The first main surface of the semiconductor substrate is a main surface on the front-surface side in the semiconductor device 100, and the second main surface of the semiconductor substrate is a main surface on the back-surface side in the semiconductor device 100. The semiconductor device 100 includes the $n^-$-type drift layer 1 between the first main surface and the second main surface opposite to the first main surface in the IGBT region 10 that is the cell region.

As illustrated in FIG. 4, in the IGBT region 10, an n-type carrier stored layer 2 having a higher n-type impurity concentration than the $n^-$-type drift layer 1 is provided on the first-main-surface side of the $n^-$-type drift layer 1. The n-type carrier stored layer 2 is a semiconductor layer containing arsenic or phosphorus, for example, as an n-type impurity, and the concentration of n-type impurities is $1.0\times10^{13}/cm^3$ to $1.0\times10^{17}/cm^3$. Additionally, the semiconductor device 100 or the semiconductor device 101 may have a configuration in which the n-type carrier stored layer 2 is not provided and the $n^-$-type drift layer 1 is also provided in the region where the n-type carrier stored layer 2 is provided in FIG. 4. Inclusion of the n-type carrier stored layer 2 can reduce a conduction loss caused during flow of a current through the IGBT region 10. The n-type carrier stored layer 2 and the $n^-$-type drift layer 1 may be collectively referred to as a drift layer.

The n-type carrier stored layer 2 is formed by ion implantation of n-type impurities into the semiconductor substrate forming the $n^-$-type drift layer 1 and subsequent diffusion of the implanted n-type impurities into the semiconductor substrate, i.e., the $n^-$-type drift layer 1, using annealing.

A p-type base layer 15 is provided on the first-main-surface side of the n-type carrier stored layer 2. The p-type base layer 15 is a semiconductor layer containing boron or aluminum, for example, as a p-type impurity, and the concentration of p-type impurities is $1.0\times10^{12}/cm^3$ to $1.0\times10^{19}/cm^3$. The p-type base layer 15 is in contact with the gate trench insulating film 11*b* of the active trench gate 11. On the first-main-surface side of the p-type base layer 15, the $n^+$-type source layer 13 is provided in contact with the gate trench insulating film 11*b* of the active trench gate 11 in a partial region, and the $p^+$-type contact layer 14 is provided in a region other than the partial region. The $n^+$-type source layer 13 and the $p^+$-type contact layer 14 form the first main surface of the semiconductor substrate. Additionally, the $p^+$-type contact layer 14 is a region having a higher p-type impurity concentration than the p-type base layer 15. The $p^+$-type contact layer 14 and the p-type base layer 15 may be individually referred to when it is necessary to distinguish them from each other. Otherwise, the $p^+$-type contact layer 14 and the p-type base layer 15 may be collectively referred to as a p-type base layer.

Further, in the semiconductor device 100 or the semiconductor device 101, an n-type buffer layer 3 having a higher n-type impurity concentration than the $n^-$-type drift layer 1 is provided on the second-main-surface side of the $n^-$-type drift layer 1. The n-type buffer layer 3 is provided to suppress punch-through of a depletion layer extending from the p-type base layer 15 toward the second-main-surface side during an off state of the semiconductor device 100. The n-type buffer layer 3 may be formed by implantation of either phosphorus (P) or protons ($H^+$) thereinto, or may be formed by implantation of both phosphorus (P) and protons ($H^+$) thereinto, for example. The concentration of n-type impurities in the n-type buffer layer 3 is $1.0\times10^{12}/cm^3$ to $1.0\times10^{18}/cm^3$.

Additionally, the semiconductor device 100 or the semiconductor device 101 may have a configuration in which the n-type buffer layer 3 is not provided and the $n^-$ type drift layer 1 is also provided in the region where the n-type buffer layer 3 is provided in FIG. 4. The n-type buffer layer 3 and the $n^-$-type drift layer 1 may be collectively referred to as a drift layer.

In the semiconductor device 100 or the semiconductor device 101, a p-type collector layer 16 is provided on the second-main-surface side of the n-type buffer layer 3. In other words, the p-type collector layer 16 is provided between the $n^-$-type drift layer 1 and the second main surface. The p-type collector layer 16 is a semiconductor layer containing boron or aluminum, for example, as a p-type impurity, and the concentration of p-type impurities is $1.0\times10^{16}/cm^3$ to $1.0\times10^{20}/cm^3$. The p-type collector layer 16 forms the second main surface of the semiconductor substrate. The p-type collector layer 16 is provided not only in the IGBT region 10, but also in the termination region 30, and a part of the p-type collector layer 16 provided in the termination region 30 forms a p-type termination collector layer 16*a*. Further, the p-type collector layer 16 may be provided so as to partially extend off the IGBT region 10 into the diode region 20.

As illustrated in FIG. 4, in the semiconductor device 100 or the semiconductor device 101, there is formed a trench that extends from the first main surface of the semiconductor substrate, penetrates the p-type base layer 15, and reaches the $n^-$-type drift layer 1. The gate trench electrode 11*a* is provided in the trench with the gate trench insulating film 11*b* interposed therebetween, to form the active trench gate 11. The gate trench electrode 11*a* faces the $n^-$-type drift layer 1 with the gate trench insulating film 11*b* interposed therebetween. Further, the dummy trench electrode 12*a* is provided in the trench with the dummy trench insulating film 12*b* interposed therebetween, to form the dummy trench gate 12. The dummy trench electrode 12*a* faces the $n^-$-type drift layer 1 with the dummy trench insulating film 12*b* interposed therebetween. The gate trench insulating film 11*b* of the active trench gate 11 is in contact with the p-type base layer 15 and the $n^+$-type source layer 13. When a gate drive voltage is applied to the gate trench electrode 11*a*, a channel is formed in the p-type base layer 15 in contact with the gate trench insulating film 11*b* of the active trench gate 11.

As illustrated in FIG. 4, an interlayer insulating film 4 is provided on the gate trench electrode 11*a* of the active trench gate 11. A barrier metal 5 is formed on a region where the interlayer insulating film 4 is not provided in the first main surface of the semiconductor substrate and on the interlayer insulating film 4. The barrier metal 5 may be a conductor containing titanium (Ti), for example, may be titanium nitride, or may be TiSi obtained by alloying of titanium and silicon (Si) with each other. As illustrated in FIG. 4, the barrier metal 5 is in ohmic contact with the $n^+$-type source layer 13, the $p^+$-type contact layer 14, and the dummy trench electrode 12*a*, and is electrically connected to the $n^+$-type source layer 13, the $p^+$-type contact layer 14, and the dummy trench electrode 12*a*. On the barrier metal 5, an emitter electrode 6 is provided. The emitter electrode 6 may be formed of an aluminum alloy such as an aluminum-silicon alloy (Al—Si-based alloy), for example, or may be an electrode including a plurality of metal film layers in which a plating film is formed on an electrode formed of an aluminum alloy by electroless plating or electrolytic plating. The plating film formed by electroless plating or electrolytic plating may be a nickel (Ni) plating film, for example. Further, in a case where there is a fine region between adjacent parts of the interlayer insulating film 4 or the like where the emitter electrode 6 cannot offer favorable embeddability, tungsten having better embeddability than the emitter electrode 6 may be placed in such a fine region as described and the emitter electrode 6 may be provided on the tungsten. Additionally, the barrier metal 5 may be omitted and the emitter electrode 6 may be provided on the $n^+$-type source layer 13, the $p^+$-type contact layer 14, and the dummy trench electrode 12*a*. Alternatively, the barrier metal 5 may be provided only on the n-type semiconductor layer such as the $n^+$-type source layer 13. The barrier metal 5 and the emitter electrode 6 may be collectively referred to as an emitter electrode. Additionally, though FIG. 4 illustrates a view in which the interlayer insulating film 4 is not provided on the dummy trench electrode 12*a* of the dummy trench gate 12, the interlayer insulating film 4 may be formed on the dummy trench electrode 12*a* of the dummy trench gate 12. In a ease where the interlayer insulating film 4 is formed on the dummy trench electrode 12*a* of the dummy trench gate 12, the emitter electrode 6 and the dummy trench electrode 12*a* can be electrically connected in another cross section.

A collector electrode 7 is provided on the second-main-surface side of the p-type collector layer 16. Like the emitter electrode 6, the collector electrode 7 may be formed of an aluminum alloy or a combination of an aluminum alloy and a plating film. Further, the collector electrode 7 may have a configuration different from that of the emitter electrode 6. The collector electrode 7 is in ohmic contact with the p-type collector layer 16 and is electrically connected to the p-type collector layer 16.

FIG. 5 is a sectional view taken along a broken line B-B in the semiconductor device 100 or the semiconductor device 101 illustrated in FIG. 3 as seen from the arrow direction, and is a sectional view of the IGBT region 10. A difference thereof from the sectional view of FIG. 4 taken along a broken line A-A as seen from the arrow direction lies in that the $n^+$-type source layer 13 provided on the first-main-surface side in the semiconductor substrate in contact with the active trench gate 11 does not appear in the sectional view taken along a line B-B in FIG. 5 as seen from the arrow direction. In other words, as illustrated in FIG. 3, the $n^+$-type source layer 13 is selectively provided on the first-main-surface side of the p-type base layer. Additionally, the p-type base layer referred to herein means a p-type base layer as a collective name for the p-type base layer 15 and the $p^+$-type contact layer 14.

(4) Typical Configuration of Diode Region 20

Figure 6:
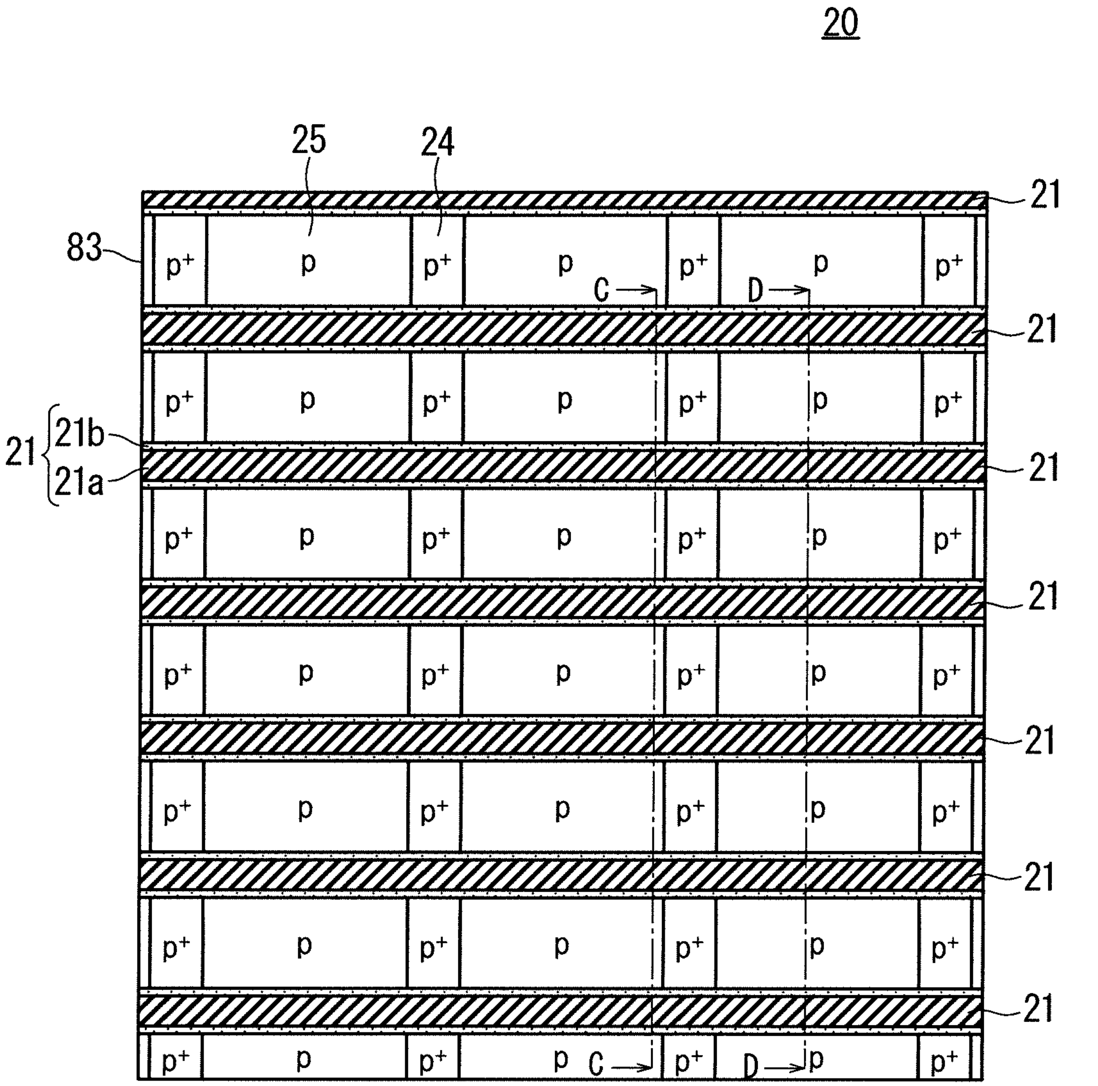
FIG. 6 is a partial plan view of a diode region in the RC-IGBT.
Figure 7:
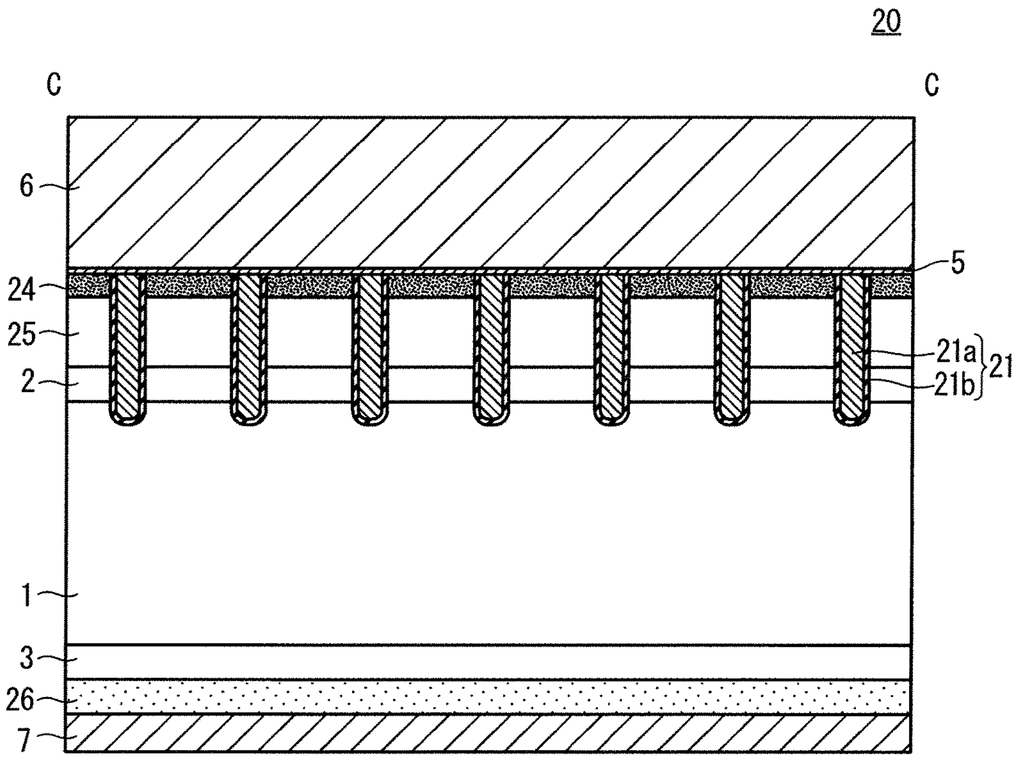
FIGS. 7 and 8 are partial sectional views of the diode region in the RC-IGBT.
Figure 8:
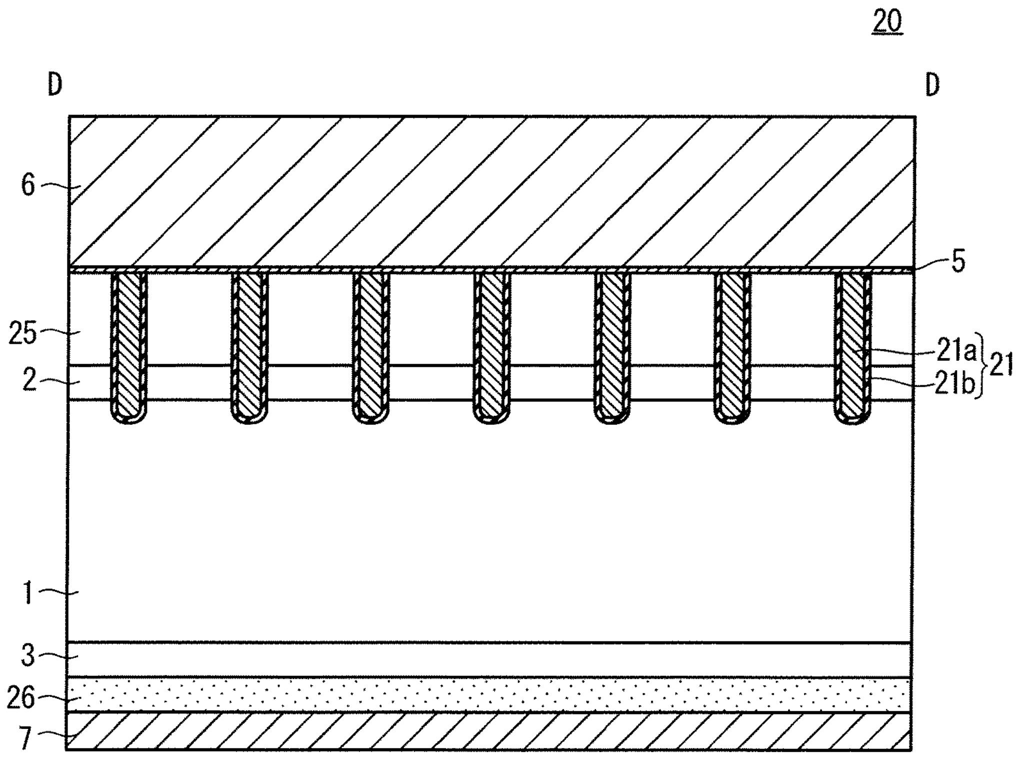

FIG. 6 is an enlarged partial plan view illustrating a configuration of a diode region of a semiconductor device that is an RC-IGBT. Further, FIGS. 7 and 8 are sectional views illustrating a configuration of a diode region of a semiconductor device that is an RC-IGBT. FIG. 6 is an enlarged view of a region 83 surrounded by a broken line in the semiconductor device 100 illustrated in FIG. 1 or the semiconductor device 101. FIG. 7 is a sectional view taken along a broken line C-C in the semiconductor device 100 illustrated in FIG. 6 as seen from the arrow direction. FIG. 8 is a sectional view taken along a broken line D-D in the semiconductor device 100 illustrated in FIG. 6 as seen from the arrow direction.

A diode trench gate 21 extends along the first main surface of the semiconductor device 100 or the semiconductor device 101 from one end of the diode region 20 that is a cell region, toward the opposite end. The diode trench gate 21 is formed of a diode trench electrode 21*a* that is provided in a trench formed in the semiconductor substrate in the diode region 20 with a diode trench insulating film 21*b* interposed therebetween. The diode trench electrode 21*a* faces the $n^-$-type drift layer 1 with the diode trench insulating film 21*b* interposed therebetween. Between two adjacent ones of the diode trench gates 21, a $p^+$-type contact layer 24 and a p-type anode layer 25 that is a third semiconductor layer are provided. The $p^+$-type contact layer 24 is a semiconductor layer containing boron or aluminum, for example, as a p-type impurity, and the concentration of p-type impurities is $1.0 \times 10^{15}/cm^3$ to $1.0 \times 10^{20}/cm^3$. The p-type anode layer 25 is a semiconductor layer containing boron or aluminum, for example, as a p-type impurity, and the concentration of p-type impurities is $1.0 \times 10^{12}/cm^3$ to $1.0 \times 10^{19}/cm^3$. The $p^+$-type contact layer 24 and the p-type anode layer 25 are provided so as to alternate with each other along the lengthwise direction of the diode trench gate 21.

FIG. 7 is a sectional view taken along a broken line C-C in the semiconductor device 100 or the semiconductor device 101 in FIG. 6 as seen from the arrow direction, and is a sectional view of the diode region 20. In the semiconductor device 100 or the semiconductor device 101, the diode region 20, like the IGBT region 10, includes the $n^-$-type drift layer 1 formed of a semiconductor substrate. The $n^-$-type drift layer 1 in the diode region 20 and the $n^-$-type drift layer 1 in the IGBT region 10 are continuously and integrally formed, and are formed of the same semiconductor substrate. In FIG. 7, the semiconductor substrate extends over a range from the $p^+$-type contact layer 24 to an $n^+$-type cathode layer 26 that is a first semiconductor layer. In FIG. 7, the end of the $p^+$-type contact layer 24 on the upper side in the drawing sheet is referred to as a first main surface of the semiconductor substrate, and the end of the $n^+$-type cathode layer 26 on the lower side in the drawing sheet is referred to as a second main surface of the semiconductor substrate. The first main surface of the diode region 20 and the first main surface of the IGBT region 10 are flush with each other, and the second main surface of the diode region 20 and the second main surface of the IGBT region 10 are flush with each other.

As illustrated in FIG. 7, also in the diode region 20, in the same manner as in the IGBT region 10, the n-type carrier stored layer 2 is provided on the first-main-surface side of the $n^-$-type drift layer 1, and the n-type buffer layer 3 is provided on the second-main-surface side of the $n^-$-type drift layer 1. The n-type carrier stored layer 2 and the n-type buffer layer 3 provided in the diode region 20 have the same configurations as the n-type carrier stored layer 2 and the n-type buffer layer 3 provided in the IGBT region 10, respectively. Additionally, the n-type carrier stored layer 2 is not necessarily required to be provided in the IGBT region 10 and the diode region 20. There may be formed a configuration in which the n-type carrier stored layer 2 is provided in the IGBT region 10 while not in the diode region 20. Further, in the same manner as in the IGBT region 10, the $n^-$-type drift layer 1, the n-type carrier stored layer 2, and the n-type buffer layer 3 may be collectively referred to as a drift layer.

The p-type anode layer 25 is provided on the first-main-surface side of the n-type carrier stored layer 2. The p-type anode layer 25 is provided between the $n^-$-type drift layer 1 and the first main surface. The p-type anode layer 25 may be set so as to have the same p-type impurity concentration as that of the p-type base layer 15 in the IGBT region 10, to be formed simultaneously with the p-type base layer 15. Alternatively, the p-type impurity concentration of the p-type anode layer 25 may be set so as to be lower than the p-type impurity concentration of the p-type base layer 15 in the IGBT region 10, so that the amount of holes injected into the diode region 20 during a diode operation is reduced. Reduction of the amount of holes injected during a diode operation can reduce a recovery loss during a diode operation.

The $p^+$-type contact layer 24 is provided on the first-main-surface side of the p-type anode layer 25. The p-type impurity concentration of the $p^+$-type contact layer 24 may be the same as or different from the p-type impurity concentration of the $p^+$-type contact layer 14 in the IGBT region 10. The $p^+$-type contact layer 24 forms the first main surface of the semiconductor substrate. Additionally, the $p^+$-type contact layer 24 is a region having a higher p-type impurity concentration than the p-type anode layer 25. The $p^+$-type contact layer 24 and the p-type anode layer 25 may be individually referred to when it is necessary to distinguish them from each other. Otherwise, the $p^+$-type contact layer 24 and the p-type anode layer 25 may be collectively referred to as a p-type anode layer.

In the diode region 20, an $n^+$-type cathode layer 26 is provided on the second-main-surface side of the n-type buffer layer 3. The $n^+$-type cathode layer 26 is provided between the $n^-$-type drift layer 1 and the second main surface. The $n^+$-type cathode layer 26 is a semiconductor layer containing arsenic or phosphorus, for example, as an n-type impurity, and the concentration of n-type impurities is $1.0\times10^{16}/cm^3$ to $1.0\times10^{21}/cm^3$. As illustrated in FIG. 2, the $n^+$-type cathode layer 26 is provided in a part or all of the diode region 20. The $n^+$-type cathode layer 26 forms the second main surface of the semiconductor substrate. Though not illustrated, a $p^+$-type cathode layer as a p-type semiconductor may be provided in a part of the region where the $n^+$-type cathode layer 26 has been formed as described above, by further selective implantation of p-type impurities into the region where the $n^+$-type cathode layer 26 has been formed. Such a diode in which an $n^+$-type cathode layer and a $p^+$-type cathode layer are arranged so as to alternate with each other along the second main surface of the semiconductor substrate is referred to as a relaxed field-of-cathode (RFC) diode.

As illustrated in FIG. 7, in the diode region 20 of the semiconductor device 100 or the semiconductor device 101, there is formed a trench that extends from the first main surface of the semiconductor substrate, penetrates the p-type anode layer 25, and reaches the $n^-$-type drift layer 1. The diode trench electrode 21*a* is provided in the trench in the diode region 20 with the diode trench insulating film 21*b* interposed therebetween, to form the diode trench gate 21. The diode trench electrode 21*a* faces the $n^-$-type drift layer 1 with the diode trench insulating film 21*b* interposed therebetween.

As illustrated in FIG. 7, the barrier metal 5 is provided on the diode trench electrode 21*a* and the $p^+$-type contact layer 24. The barrier metal 5 is in ohmic contact with the diode trench electrode 21*a* and the $p^+$-type contact layer 24, and is electrically connected to the diode trench electrode and the $p^+$-type contact layer 24. The barrier metal 5 may have the same configuration as that of the barrier metal 5 in the IGBT region 10. On the barrier metal 5, an emitter electrode 6 is provided. The emitter electrode 6 provided in the diode region 20 is formed continuously with the emitter electrode 6 provided in the IGBT region 10. Meanwhile, in the same manner as in the IGBT region 10, the barrier metal 5 may be omitted and the diode trench electrode 21*a* and the $p^+$-type contact layer 24 may be brought into ohmic contact with the emitter electrode 6. Additionally, though FIG. 7 illustrates a view in which the interlayer insulating film 4 is not provided on the diode trench electrode 21*a* of the diode trench gate 21, the interlayer insulating film 4 may be formed on the diode trench electrode 21*a* of the diode trench gate 21. In a case where the interlayer insulating film 4 is formed on the diode trench electrode 21*a* of the diode trench gate 21, the emitter electrode 6 and the diode trench electrode 21*a* can be electrically connected in another cross section.

The collector electrode 7 is provided on the second-main-surface side of the $n^+$-type cathode layer 26. Like the emitter electrode 6, the collector electrode 7 in the diode region 20 is formed continuously with the collector electrode 7 provided in the IGBT region 10. The collector electrode 7 is in ohmic contact with the $n^+$-type cathode layer 26, is electrically connected to the $n^+$-type cathode layer 26, and also functions as a cathode electrode.

FIG. 8 is a sectional view taken along a broken line D-D in the semiconductor device 100 or the semiconductor device 101 in FIG. 6 as seen from the arrow direction, and is a sectional view of the diode region 20 as seen from the arrow direction. A difference thereof from the sectional view of FIG. 7 taken along a line C-C as seen from the arrow direction lies in that the $p^+$-type contact layer 24 is not provided between the p-type anode layer 25 and the barrier metal 5, and the p-type anode layer 25 forms the first main surface of the semiconductor substrate. That is, the $p^+$-type contact layer 24 illustrated in FIG. 7 is selectively provided on the first-main-surface side of the p-type anode layer 25.

(5) Boundary Region Between IGBT Region 10 and Diode Region 20

Figure 9:
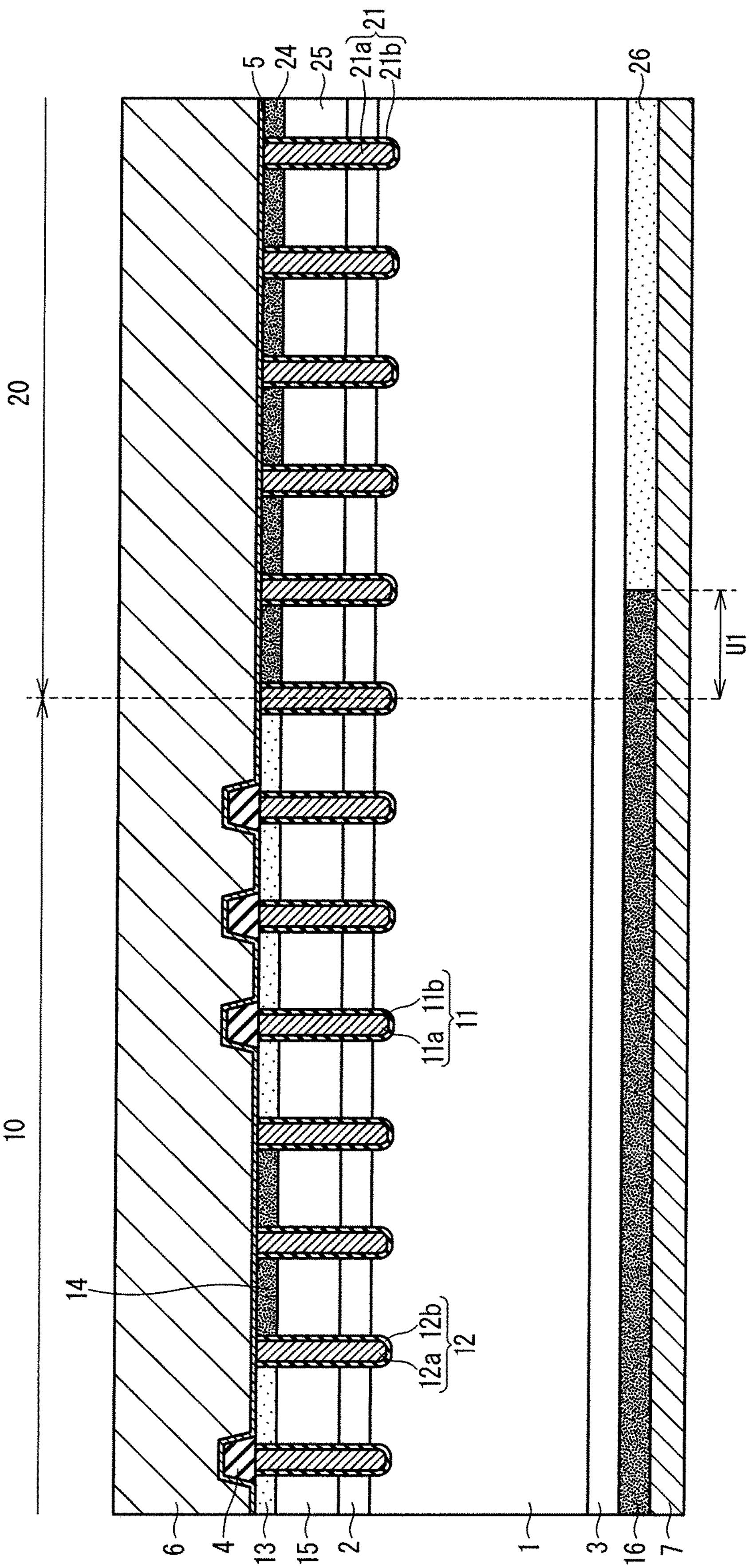
FIG. 9 is a sectional view of a boundary region between the IGBT region and the diode region in the RC-IGBT.

FIG. 9 is a sectional view illustrating a configuration of a boundary between an IGBT region and a diode region in a semiconductor device that is an RC-IGBT. FIG. 9 is a sectional view taken along a broken line G-G as seen from the arrow direction in the semiconductor device 100 illustrated in FIG. 1 or the semiconductor device 101.

As illustrated in FIG. 9, the p-type collector layer 16 provided on the second-main-surface side in the IGBT region 10 is provided so as to extend off a boundary between the IGBT region 10 and the diode region 20 into the diode region 20 by a distance U1. Because of the p-type collector layer 16 extending off into the diode region 20 as described above, a distance between the $n^+$-type cathode layer 26 in the diode region 20 and the active trench gate 11 can be increased. Thus, if a gate drive voltage is applied to the gate trench electrode 11*a* during a freewheeling-diode operation, a current can be suppressed from flowing from a channel formed adjacent to the active trench gate 11 in the IGBT region 10 to the $n^+$-type cathode layer 26. The distance U1 may be 100 μm, for example. Additionally, depending on the application of the semiconductor device 100 or the semiconductor device 101 that is an RC-IGBT, the distance U1 may be equal to zero or is smaller than 100 μm.

(6) Typical Configuration of Termination Region 30

Figure 10:
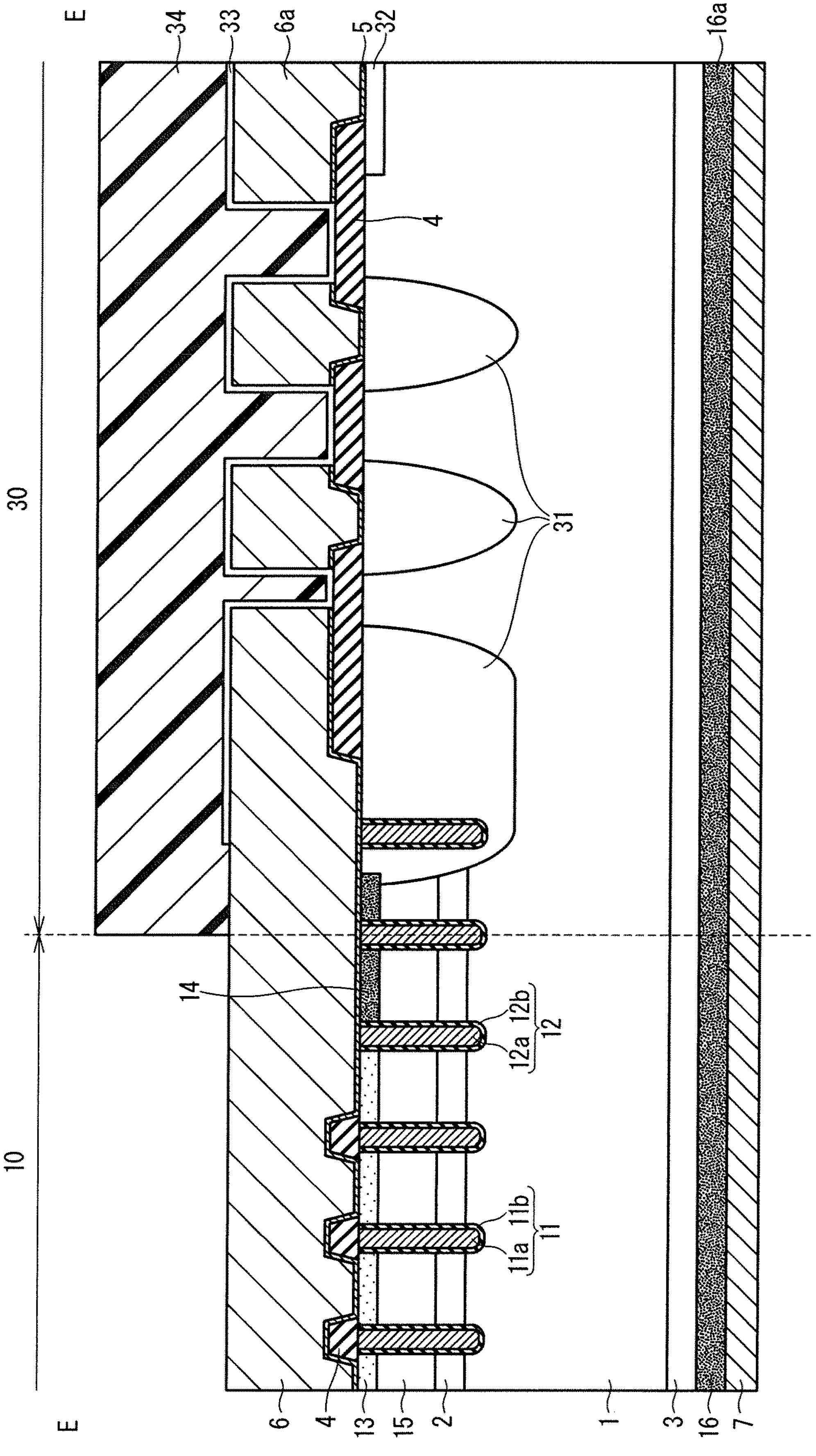
FIGS. 10 and 11 are sectional views of a boundary region between the IGBT region and a termination region in the RC-IGBT.
Figure 11:
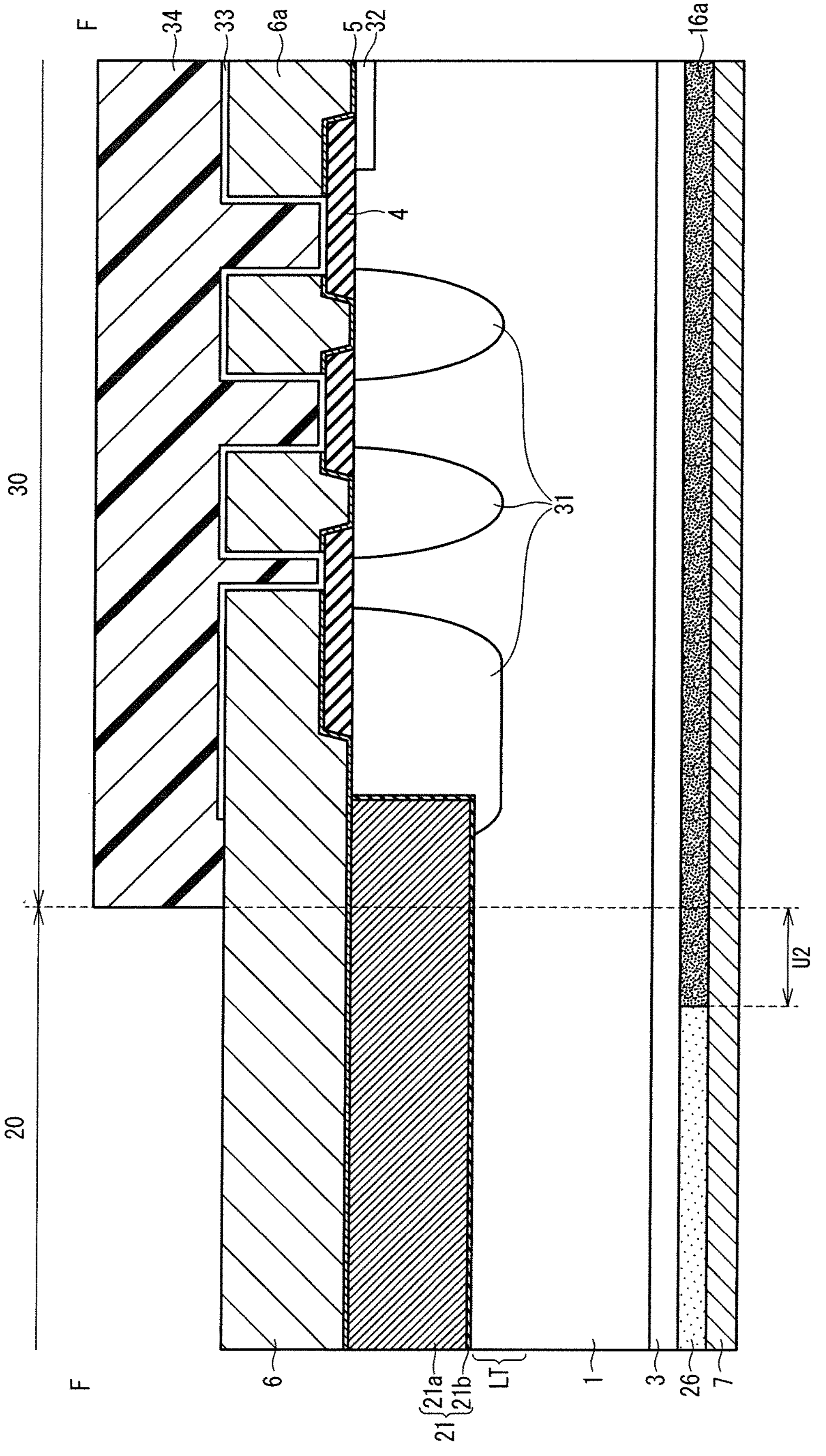

FIGS. 10 and 11 are sectional views illustrating a configuration of a termination region of a semiconductor device that is an RC-IGBT. FIG. 10 is a sectional view taken along a broken line E-E in FIG. 1 or FIG. 2 as seen from the arrow direction, and is a sectional view of a range from the IGBT region 10 to the termination region 30. Further, the FIG. 11 is a sectional view taken along a broken line F-F in FIG. 1 as seen from the arrow direction, and is a sectional view of a range from the diode region 20 to the termination region 30.

As illustrated in FIGS. 10 and 11, the termination region 30 of the semiconductor device 100 includes the $n^-$-type drift layer 1 between the first main surface and the second main surface of the semiconductor substrate. The first main surface and the second main surface of the termination region 30 are flush with the first main surfaces and the second main surfaces of the IGBT region 10 and the diode region 20, respectively. The n-type drift layer 1 in the termination region 30 has the same configuration as, and is formed continuously and integrally with, the $n^-$-type drift layers 1 in the IGBT region 10 and the diode region 20.

A p-type termination well layer 31 is provided on the first-main-surface side of the $n^-$-type drift layer 1, in other words, between the first main surface of the semiconductor substrate and the $n^-$-type drift layer 1. The p-type termination well layer 31 is a semiconductor layer containing boron or aluminum, for example, as a p-type impurity, and the concentration of p-type impurities is $1.0\times10^{14}/cm^3$ to $1.0\times10^{19}/cm^3$. The p-type termination well layer 31 is provided so as to surround the cell region including the IGBT region 10 and the diode region 20. The p-type termination well layer 31 is provided in the shape of plural rings, and the number of the p-type termination well layers 31 is appropriately selected in accordance with the breakdown-voltage design of the semiconductor device 100 or the semiconductor device 101. Further, an $n^+$-type channel stopper layer 32 is provided on the side of the outer edge of the p-type termination well layers 31, and the $n^+$-type channel stopper layer 32 surrounds the p-type termination well layers 31.

A p-type termination collector layer 16*a* is provided between the $n^-$-type drift layer 1 and the second main surface of the semiconductor substrate. The p-type termination collector layer 16*a* is formed continuously and integrally with the p-type collector layer 16 provided in the cell region. Thus, the p-type collector layer 16 including the p-type termination collector layer 16*a* may be referred to as a p-type collector layer 16. Further, in the configuration in which the diode region 20 is provided adjacent to the termination region 30 as in the semiconductor device 100 illustrated in FIG. 1, the p-type termination collector layer 16*a* is provided such that its end closer to the diode region 20 extends off into the diode region 20 by a distance U2 as illustrated in FIG. 11. Because of the p-type termination collector layer 16*a* extending into the diode region 20 as described above, a distance between the $n^+$-type cathode layer 26 in the diode region 20 and the p-type termination well layer 31 can be increased, which can suppress the p-type termination well layer 31 from operating as an anode of a diode. The distance U2 may be 100 μm, for example.

The collector electrode 7 is provided on the second main surface of the semiconductor substrate. The collector electrode 7 is formed continuously and integrally from the cell region including the IGBT region 10 and the diode region 20 to the termination region 30. Meanwhile, on the first main surface of the semiconductor substrate in the termination region 30, the emitter electrode 6 continuous with the emitter electrode 6 in the cell region and a termination electrode 6*a* separated from the emitter electrode 6 are provided.

The emitter electrode 6 and the termination electrode 6*a* are electrically connected to each other with a semi-insulating film 33 interposed therebetween. The semi-insulating film 33 may be a semi-insulating silicon nitride (sinSiN) film, for example. The termination electrode 6*a* is electrically connected to the p-type termination well layer 31 and the $n^+$-type channel stopper layer 32 via a contact hole formed in the interlayer insulating film 4 provided on the first main surface of the termination region 30. Further, in the termination region 30, a termination protection film 34 is provided to cover the emitter electrode 6, the termination electrode 6*a*, and the semi-insulating film 33. The termination protection film 34 may be formed of polyimide, for example.

(7) Typical Manufacturing Method of RC-IGBT

Figure 18:
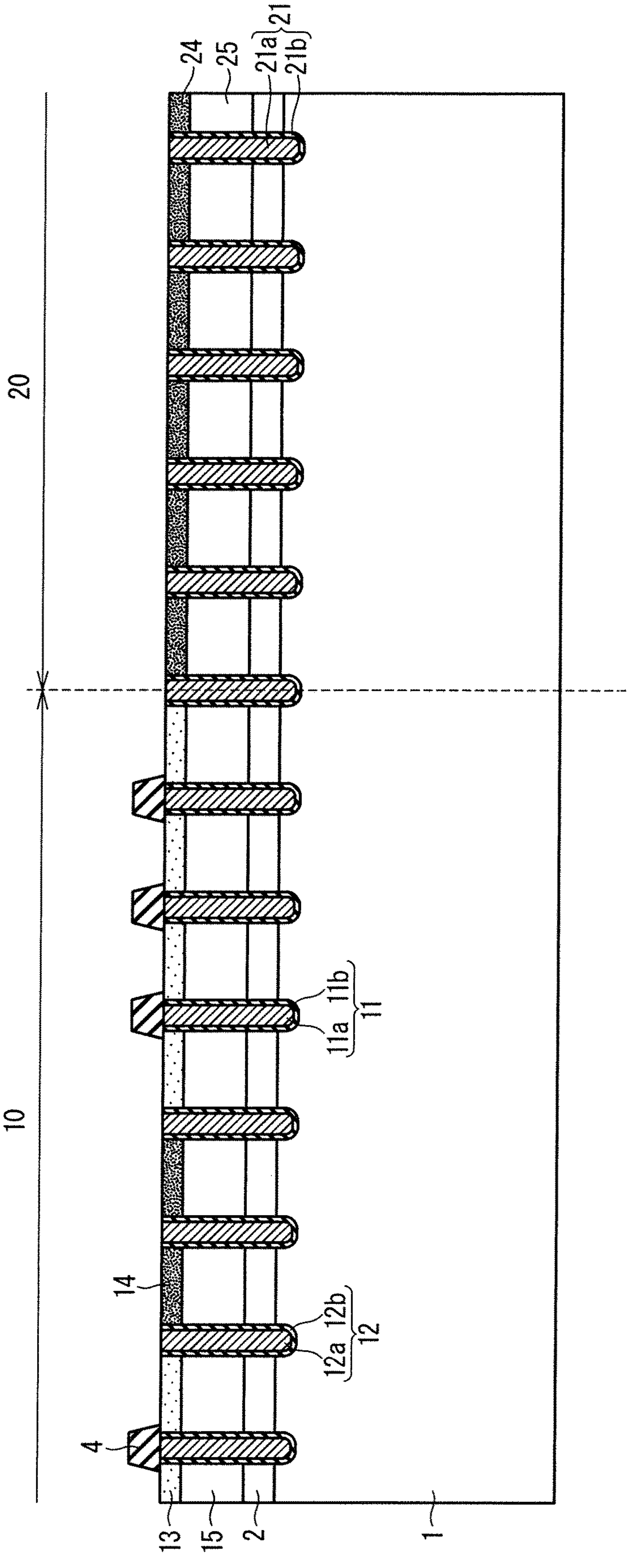
Figure 19:
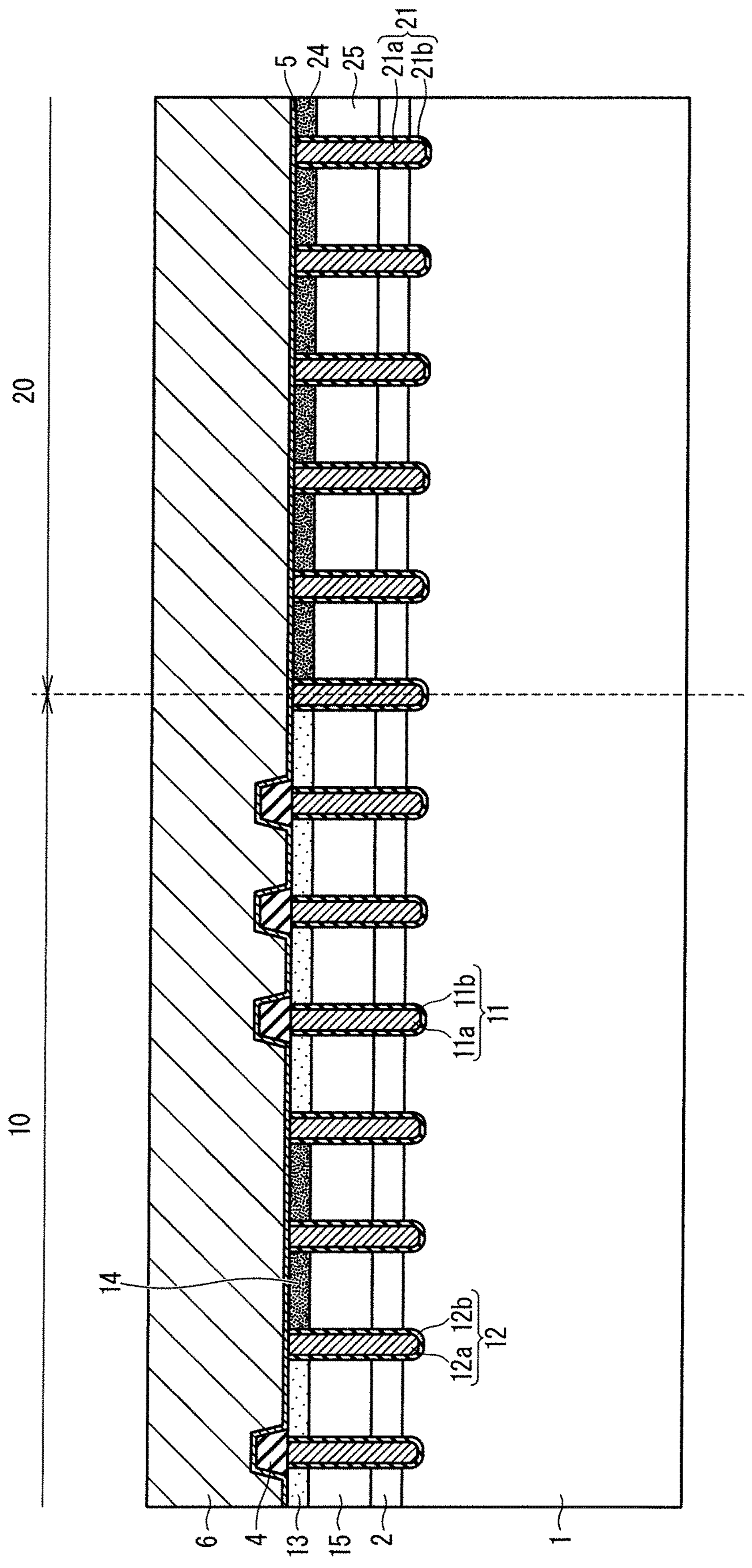
Figure 20:
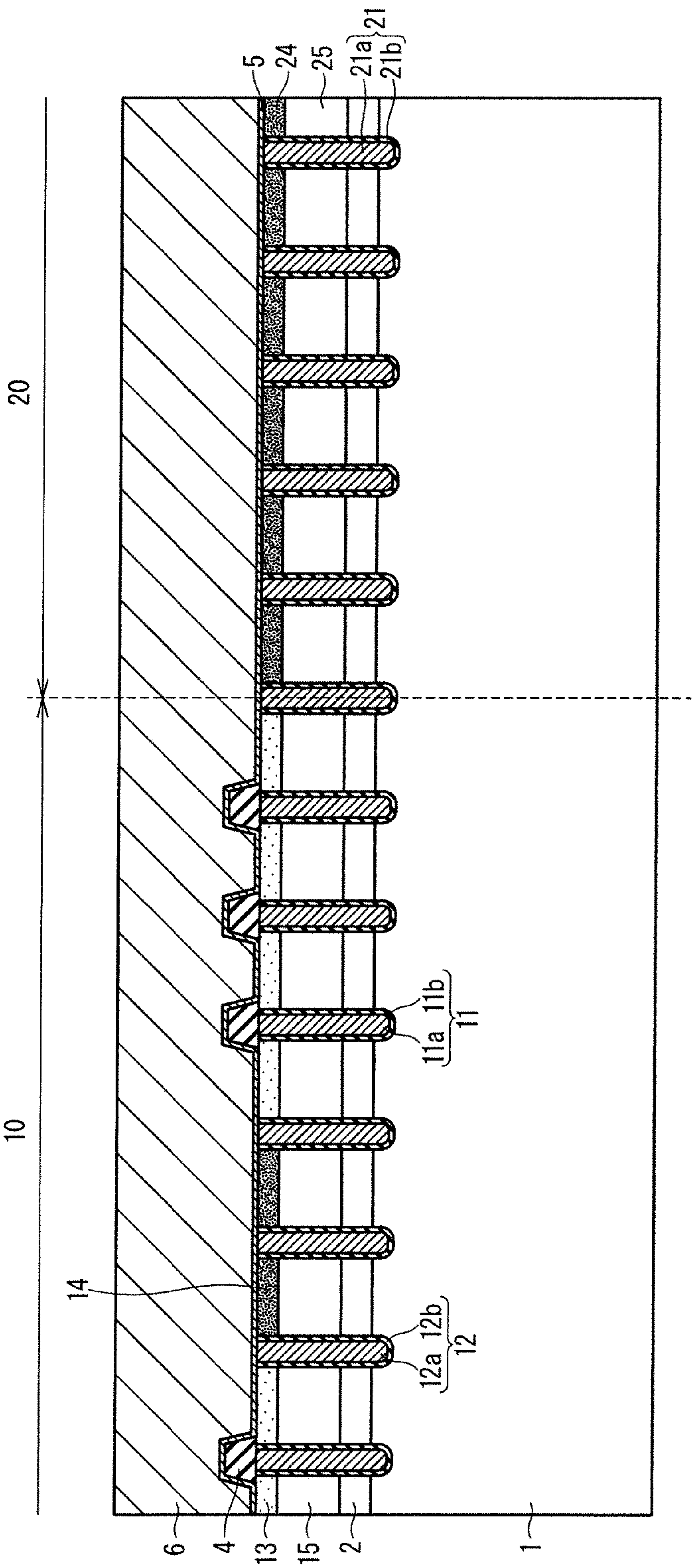
Figure 21:
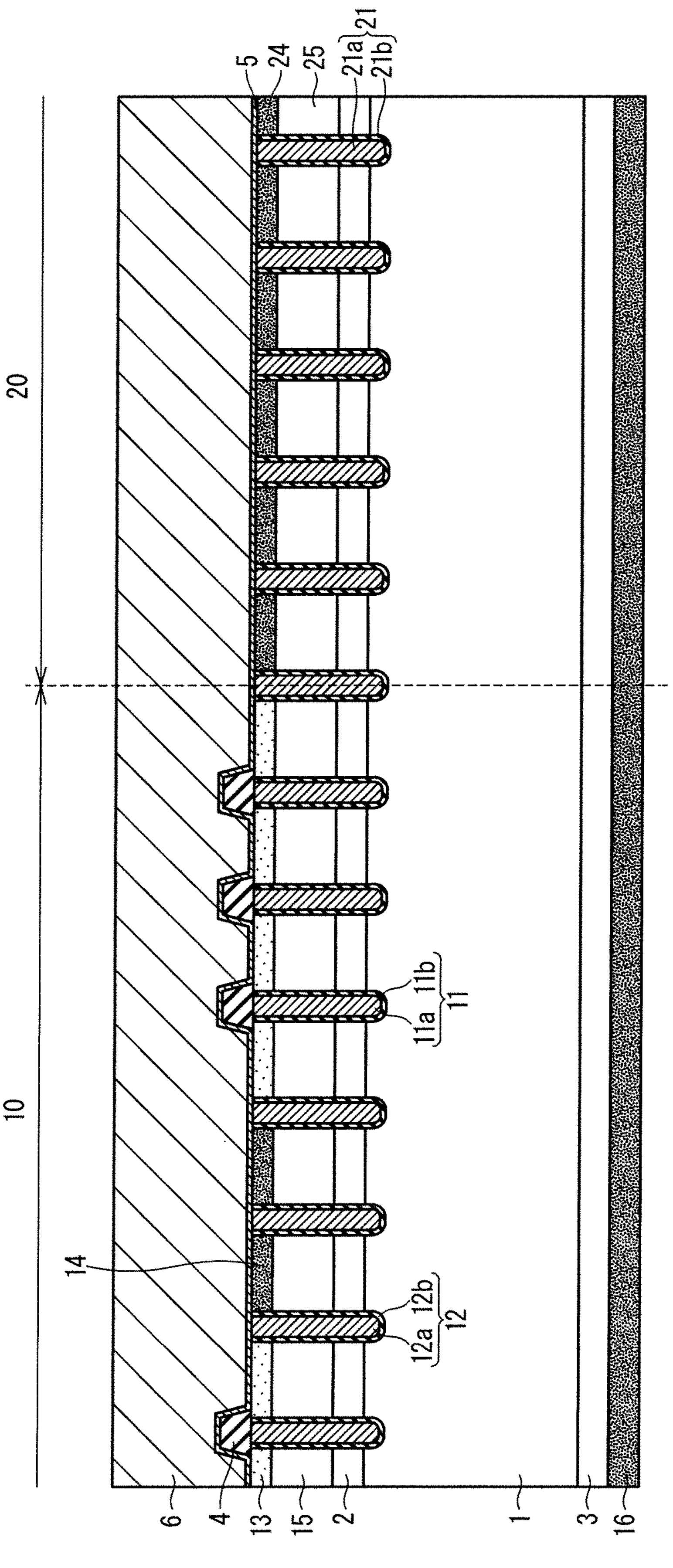
Figure 22:
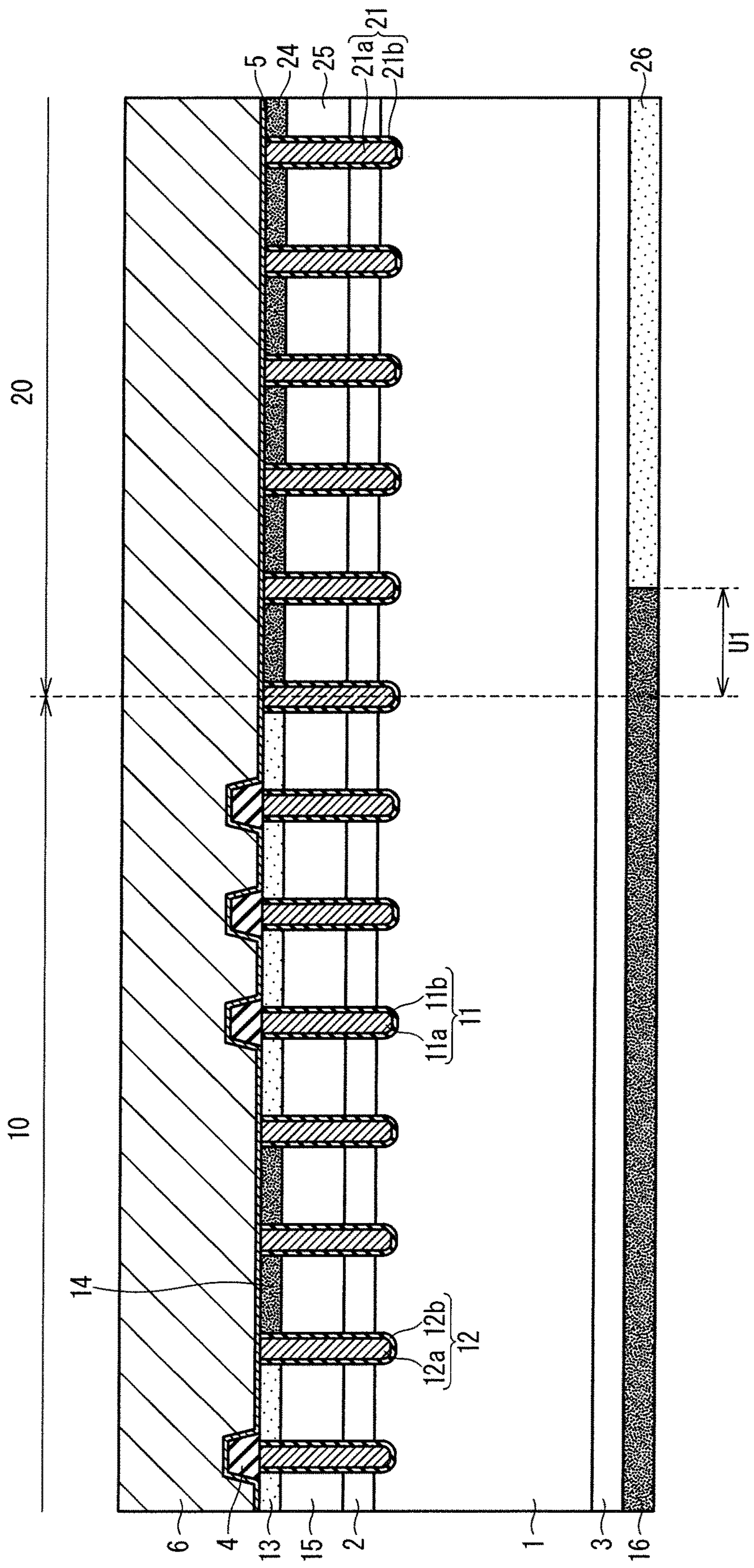

FIGS. 12 to 22 are views illustrating a manufacturing method of a semiconductor device that is an RC-IGBT. FIGS. 12 to 19 are views illustrating steps of forming the front-surface side in the semiconductor device 100 or the semiconductor device 101, and FIGS. 20 to 22 are views illustrating steps of forming the back-surface side in the semiconductor device 100 or the semiconductor device 101.

Figure 12:
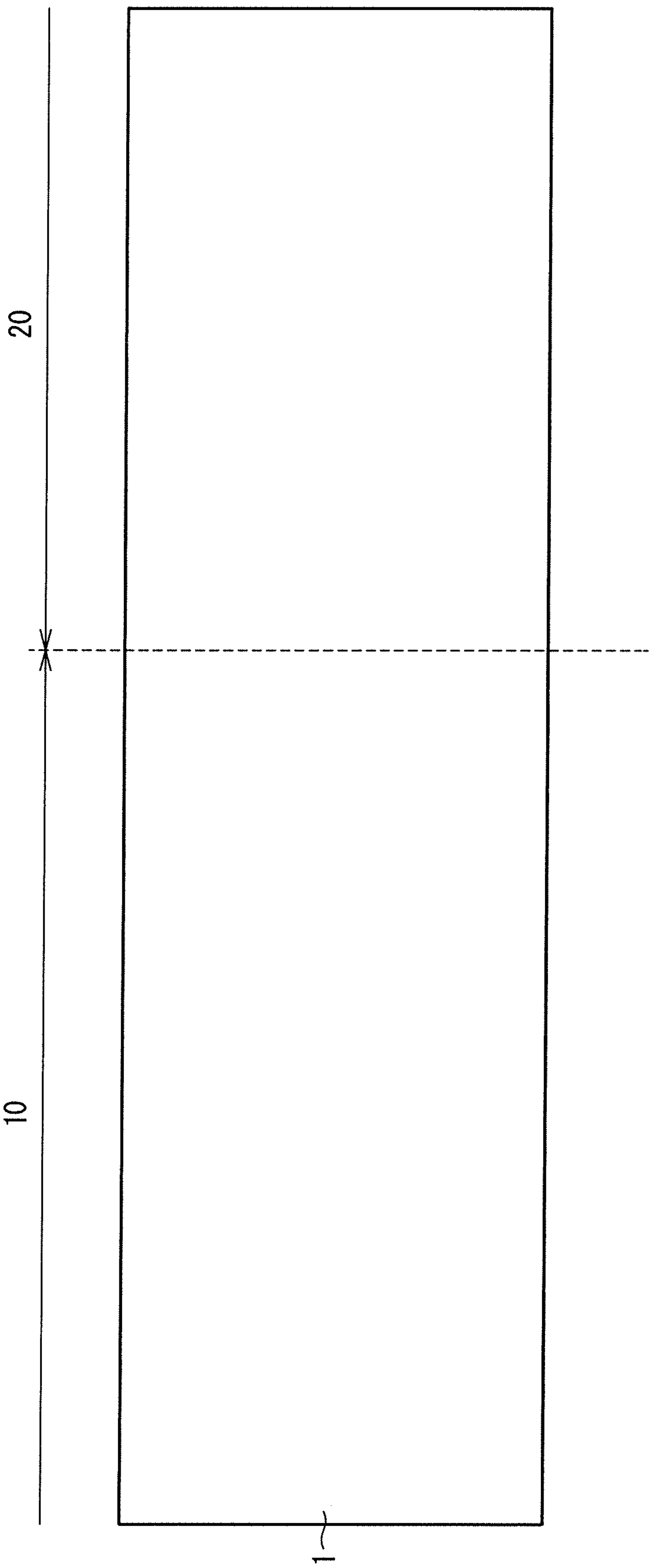
FIGS. 12 to 22 are sectional views for explaining a manufacturing method of the RC-IGBT.

First, as illustrated in FIG. 12, a semiconductor substrate forming the $n^-$-type drift layer 1 is prepared. As the semiconductor substrate, for example, a so-called FZ wafer manufactured by a floating zone (FZ) method or a so-called MCZ wafer manufactured by a magnetic field applied Czochralski (MCZ) method may be used, and an n-type wafer containing n-type impurities may be used. The concentration of n-type impurities contained in the semiconductor substrate is appropriately selected depending on the breakdown voltage of the semiconductor device being manufactured. For example, for a semiconductor device having a breakdown voltage of 1200 V, the n-type impurity concentration is adjusted so as to allow the $n^-$-type drift layer 1 forming the semiconductor substrate to have specific resistance of about 40 to 120 Ω·cm. As illustrated in FIG. 12, in the step of preparing the semiconductor substrate, the entire semiconductor substrate is the $n^-$-type drift layer 1. Then, from the first-main-surface side or the second-main-surface side in this semiconductor substrate, p-type or n-type impurity ions are implanted and are subsequently diffused into the semiconductor substrate using thermal treatment or the like, to form a p-type or n-type semiconductor layer. Thus, the semiconductor device 100 or the semiconductor device 101 is manufactured.

As illustrated in FIG. 12, the semiconductor substrate forming the $n^-$-type drift layer 1 includes a region where the IGBT region 10 and the diode region 20 are to be formed. Further, though not illustrated, a region where the termination region 30 is to be formed is included around the region where the IGBT region 10 and the diode region 20 are to be formed. Below, a method of manufacturing the configurations of the IGBT region 10 and the diode region 20 of the semiconductor device 100 or the semiconductor device 101 will be mainly described. The termination region 30 of the semiconductor device 100 or the semiconductor device 101 may be manufactured by a known manufacturing method. For example, in a case where a FLR including the p-type termination well layer 31 is formed as a breakdown-voltage maintaining structure in the termination region 30, the FLR may be formed by implantation of p-type impurity ions before the IGBT region 10 and the diode region 20 of the semiconductor device 100 or the semiconductor device 101 are processed. Alternatively, the FLR may be formed by implantation of p-type impurity ions at the same time with ion implantation of p-type impurities into the IGBT region 10 or the diode region 20 of the semiconductor device 100.

Figure 13:
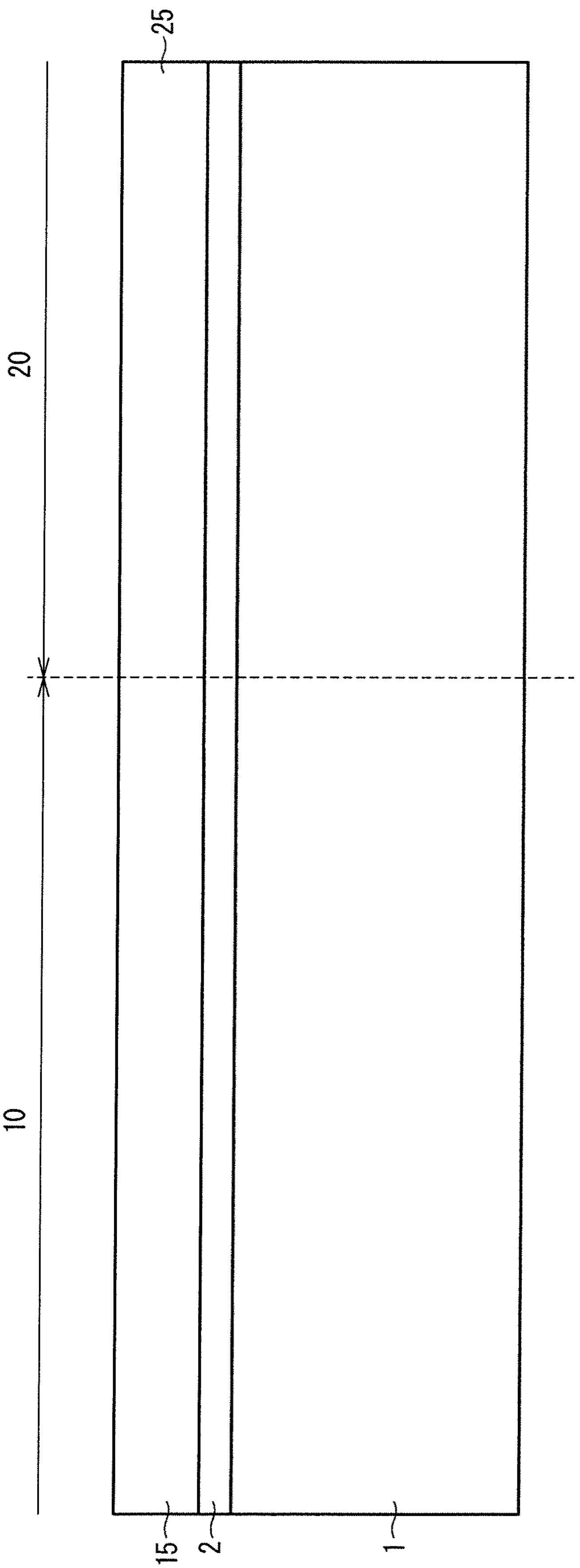

Subsequently, as illustrated in FIG. 13, n-type impurities such as phosphorus (P) are implanted from the first-main-surface side in the semiconductor substrate to form the n-type carrier stored layer 2. Further, p-type impurities such as boron (B) are implanted from the first-main-surface side in the semiconductor substrate to form the p-type base layer 15 and the p-type anode layer 25. The n-type carrier stored layer 2, the p-type base layer 15, and the p-type anode layer 25 are formed by implantation of impurity ions into the semiconductor substrate and subsequent diffusion of the impurity ions using thermal treatment. The n-type impurities and the p-type impurities are ion-implanted after a mask process is performed on the first main surface of the semiconductor substrate. Thus, the n-type carrier stored layer 2, the p-type base layer 15, and the p-type anode layer 25 are selectively formed on the first-main-surface side in the semiconductor substrate. The n-type carrier stored layer 2, the p-type base layer 15, and the p-type anode layer 25 are formed in the IGBT region 10 and the diode region 20, and are connected to the p-type termination well layer 31 in the termination region 30. Additionally, a mask process refers to a process in which a resist is applied onto a semiconductor substrate, an opening is formed in a predetermined region of the resist using photolithography technique, and a mask is formed on the semiconductor substrate for the purpose of performing ion implantation or etching on a predetermined region of the semiconductor substrate through the opening.

The p-type base layer 15 and the p-type anode layer 25 may be formed by ion implantation of p-type impurities at the same time. In this case, the p-type base layer 15 and the p-type anode layer 25 have the same depth and the same p-type impurity concentration and thus have the same configuration. Alternatively, the p-type base layer 15 and the p-type anode layer 25 may have different depths and different p-type impurity concentrations by being subjected to ion implantation of p-type impurities separately from each other using a mask process.

Further, the p-type termination well layer 31 formed in another cross section may be formed by ion implantation of p-type impurities at the same time with the p-type anode layer 25. In this case, the p-type termination well layer 31 and the p-type anode layer 25 can have the same depth and the same p-type impurity concentration and thus can have the same configuration. Alternatively, the p-type termination well layer 31 and the p-type anode layer 25 can have different p-type impurity concentrations though the p-type termination well layer 31 and the p-type anode layer 25 are formed by ion implantation of p-type impurities at the same time. In this case, an opening ratio is changed by using a mesh-like mask as one or both of masks for the layers.

Further alternatively, the p-type termination well layer 31 and the p-type anode layer 25 may have different depths and different p-type impurity concentrations by being subjected to ion implantation of p-type impurities separately from each other using a mask process. The p-type termination well layer 31, the p-type base layer 15, and the p-type anode layer 25 may be formed by ion implantation of p-type impurities at the same time.

Figure 14:
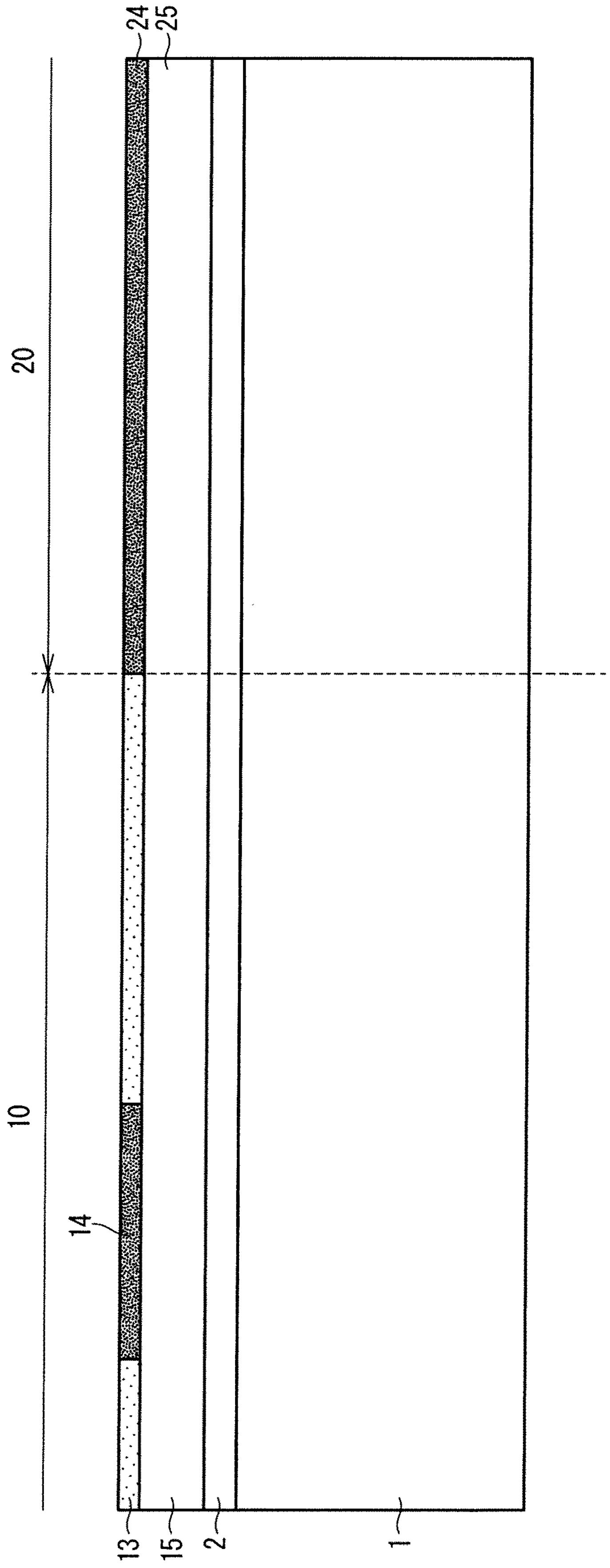

Subsequently, as illustrated in FIG. 14, n-type impurities are selectively implanted into the first-main-surface side in the p-type base layer 15 in the IGBT region 10 using a mask process, to form the $n^+$-type source layer 13. The n-type impurities implanted at that time may be, for example, arsenic (As) or phosphorus (P). Further, by using a mask process, p-type impurities are selectively implanted into the first-main-surface side in the p-type base layer 15 in the IGBT region 10, to form the $p^+$-type contact layer 14, and p-type impurities are selectively implanted into the first-main-surface side in the p-type anode layer 25 in the diode region 20, to form the $p^+$-type contact layer 24. The p-type impurities implanted at that time may be, for example, boron (B) or aluminum (Al).

Figure 15:
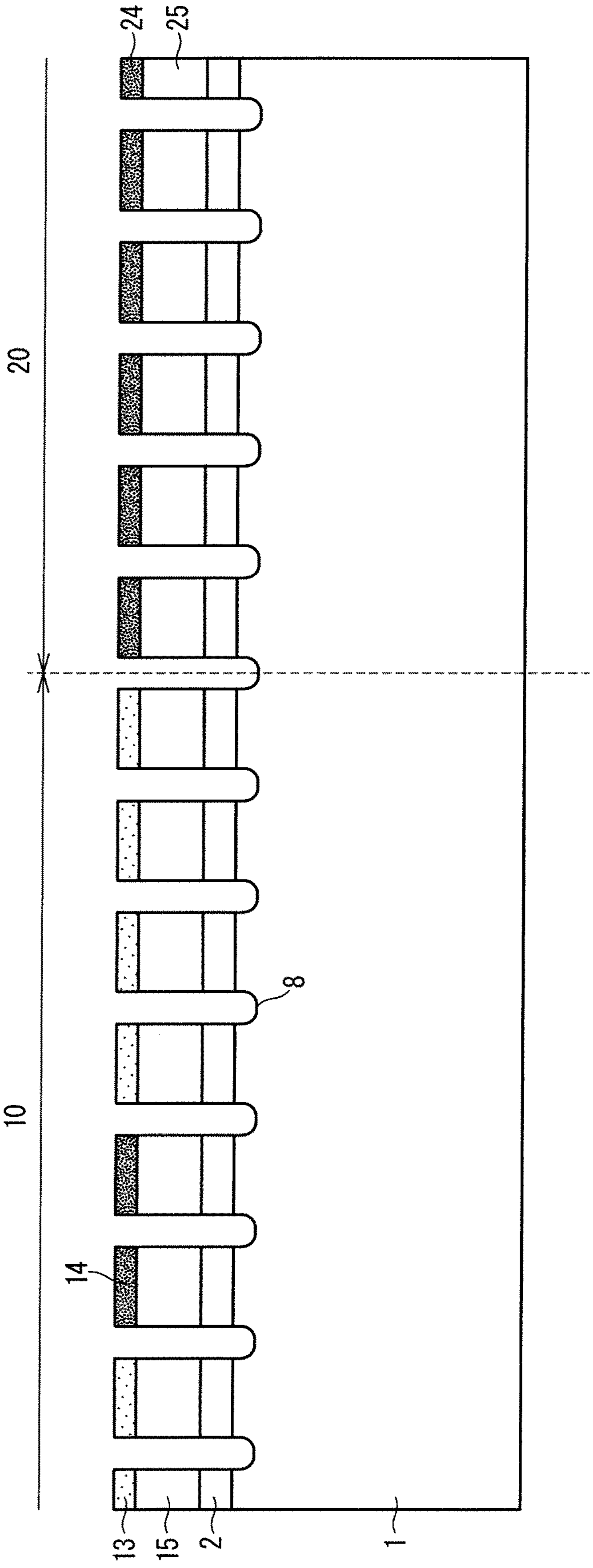

Then, as illustrated in FIG. 15, a trench 8 is formed which extends from the first-main-surface side in the semiconductor substrate, penetrates the p-type base layer 15 and the p-type anode layer 25, and reaches the $n^-$-type drift layer 1. In the IGBT region 10, a sidewall of the trench 8 penetrating the $n^+$-type source layer 13 forms a part of the $n^+$-type source layer 13. The trench 8 may be formed by a process in which an oxide film such as $SiO_2$ is deposited on the semiconductor substrate, an opening is formed in a part of the oxide film where the trench 8 is to be formed using a mask process, and the semiconductor substrate is etched using the oxide film having the opening as a mask. While the IGBT region 10 and the diode region 20 are formed with the same pitch between the trenches 8 in FIG. 15, the IGBT region 10 and the diode region 20 may have different pitches between the trenches 8. The pattern of the pitches between the trenches 8 in plan view can be appropriately changed in accordance with a mask pattern in a mask process.

Figure 16:
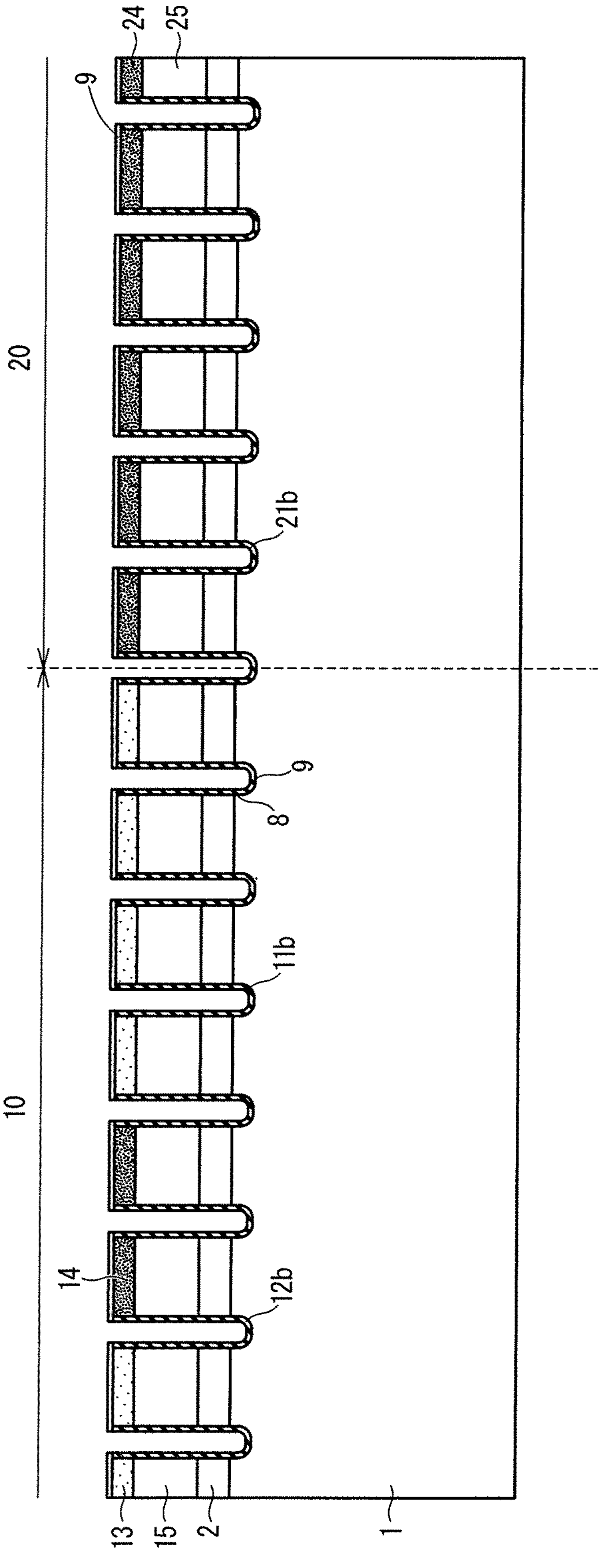

Subsequently, as illustrated in FIG. 16, the semiconductor substrate is heated in an atmosphere containing oxygen, and oxide films 9 are formed on the inner walls of the trenches 8 and the first main surface of the semiconductor substrate. Among the oxide films 9 formed on the inner walls of the trenches 8, the oxide films 9 formed on the trenches 8 in the IGBT region 10 are to each serve as the gate trench insulating film **11*b* of the active trench gate 11 and the dummy trench insulating film 12*b* of the dummy trench gate 12. Further, the oxide films 9 formed on the trenches 8 in the diode region 20 are to each serve as the diode trench insulating film 21***b*. The oxide films 9 formed on the first main surface of the semiconductor substrate are removed in a later step.

Figure 17:
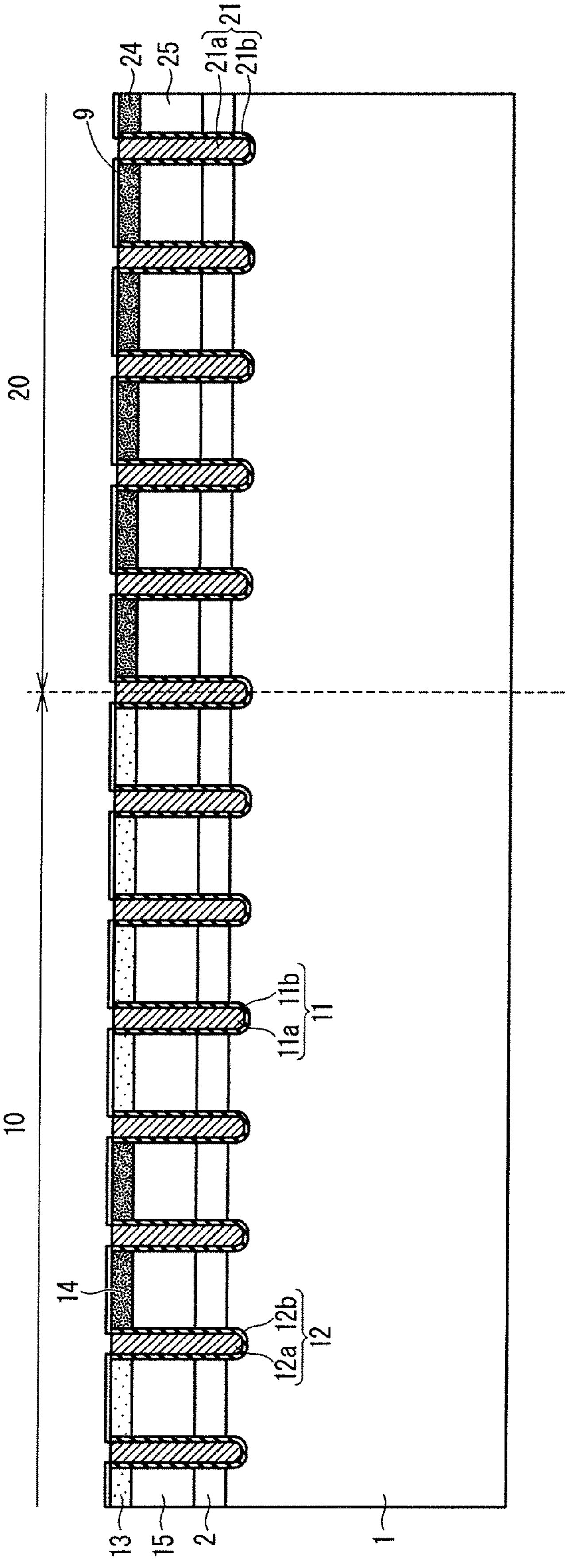

Subsequently, as illustrated in FIG. 17, polysilicon doped with n-type or p-type impurities by chemical vapor deposition (CVD) or the like is deposited in the trenches 8 having the oxide films 9 formed on the inner walls thereof, to form the gate trench electrode 11*a*, the dummy trench electrode 12*a*, and the diode trench electrode 21*a*.

Subsequently, as illustrated in FIG. 18, the interlayer insulating film 4 is formed on the gate trench electrode 11*a* of the active trench gate 11 in the IGBT region 10, and then the oxide film 9 formed on the first main surface of the semiconductor substrate is removed. The interlayer insulating film 4 may be $SiO_2$, for example. Then, contact holes are formed in the deposited interlayer insulating film 4 by a mask process. The contact holes are formed on the $n^+$-type source layer 13, the $p^+$-type contact layer 14, the $p^+$-type contact layer 24, the dummy trench electrode 12*a*, and the diode trench electrode 21*a*.

Subsequently, as illustrated in FIG. 19, the barrier metal 5 is formed on the first main surface of the semiconductor substrate and the interlayer insulating film 4, and further, the emitter electrode 6 is formed on the barrier metal 5. The barrier metal 5 is formed of a titanium nitride film formed by physical vapor deposition (PDV) or CVD.

The emitter electrode 6 may be formed by deposition of an aluminum-silicon alloy (Al—Si-based alloy) on the barrier metal 5 by PVD such as sputtering or vapor deposition, for example. Alternatively, a nickel alloy (Ni alloy) may be further formed on the formed aluminum-silicon alloy by electroless plating or electrolytic plating to form the emitter electrode 6. In a case where the emitter electrode 6 is formed of a plating, a thick metal film can be easily formed as the emitter electrode 6, whereby thermal capacitance of the emitter electrode 6 is increased and the heat resistance is improved. Additionally, in a case where a nickel alloy is further formed by a plating process after the emitter electrode 6 formed of an aluminum-silicon alloy is formed by PVD, the plating process for forming the nickel alloy may be performed after the second-main-surface side in the semiconductor substrate is processed.

Subsequently, as illustrated in FIG. 20, the second-main-surface side in the semiconductor substrate is ground to thin the semiconductor substrate to a designed predetermined thickness. The thickness of the semiconductor substrate after grinding may be, for example, 80 μm to 200 μm.

Subsequently, as illustrated in FIG. 21, n-type impurities are implanted from the second-main-surface side in the semiconductor substrate to form the n-type buffer layer 3. Further, p-type impurities are implanted from the second-main-surface side in the semiconductor substrate to form the p-type collector layer 16. The n-type buffer layer 3 may be formed in the IGBT region 10, the diode region 20, and the termination region 30, or may be formed only in the IGBT region 10 or the diode region 20.

The n-type buffer layer 3 may be formed by implantation of phosphorus (P) ions, for example. Alternatively, protons ($H^+$) may be implanted to form the n-type buffer layer 3. Further alternatively, both protons and phosphorus may be implanted to form the n-type buffer layer 3. Protons can be implanted from the second main surface of the semiconductor substrate to a great depth with relatively low accelerating energy. In addition, the depth to which protons are implanted can be relatively easily changed by a change in accelerating energy Thus, in forming the n-type buffer layer 3 using protons, by implanting protons many times while changing accelerating energy, it is possible to form the n-type buffer layer 3 having a larger width along a thickness direction than that in a case where phosphorus is used.

Meanwhile, phosphorus can have a higher activation rate as an n-type impurity as compared with a proton, and thus can more reliably suppress punch-through of a depletion layer also in a semiconductor substrate that is thinned because of use of phosphorus for forming the n-type buffer layer 3. In order to further thin the semiconductor substrate, it is preferable to form the n-type buffer layer 3 by implanting both protons and phosphorus, and in this case, protons are implanted to a greater depth from the second main surface than phosphorus.

The p-type collector layer 16 may be formed by implantation of boron (B), for example. The p-type collector layer 16 is formed also in the termination region 30, and the p-type collector layer 16 in the termination region 30 serves as the p-type termination collector layer 16*a*. After ion implantation from the second-main-surface side in the semiconductor substrate, the second main surface is irradiated with a laser to be laser-annealed, whereby the implanted boron is activated to form the p-type collector layer 16. At that time, also phosphorus for the n-type buffer layer 3 implanted at a relatively shallow position from the second main surface of the semiconductor substrate is also activated at the same time. Meanwhile, protons are activated at a relatively low annealing temperature such as 350° C. to 500° C. For this reason, after protons are implanted, it is necessary to pay attention to keep the temperature of the entire semiconductor substrate from rising higher than 350° C. to 500° C., except for a step of activating protons. Laser annealing, which can raise the temperature of only the vicinity of the second main surface of the semiconductor substrate, can be used for activating n-type impurities and p-type impurities also after implantation of protons.

Subsequently, as illustrated in FIG. 22, the $n^+$-type cathode layer 26 is formed in the diode region 20. The $n^+$-type cathode layer 26 may be formed by implantation of phosphorus (P), for example. As illustrated in FIG. 22, phosphorus is selectively implanted from the second-main-surface side using a mask process such that the boundary between the p-type collector layer 16 and the $n^+$-type cathode layer 26 is located at a position at the distance U1 from the boundary between the IGBT region 10 and the diode region 20, in the diode region 20. The amount of n-type impurities implanted for forming the $n^+$-type cathode layer 26 is larger than the amount of p-type impurities implanted for forming the p-type collector layer 16. Though the depths of the p-type collector layer 16 and the $n^+$-type cathode layer 26 from the second main surface are the same in FIG. 22, the depth of the $n^+$-type cathode layer 26 is equal to or greater than the depth of the p-type collector layer 16. For the region where the $n^+$-type cathode layer 26 is formed, it is necessary to implant n-type impurities into the region into which p-type impurities have been implanted, in order to form an n-type semiconductor there. For this reason, the concentration of p-type impurities implanted in all the region where the $n^+$-type cathode layer 26 is to be formed is made higher than the concentration of n-type impurities.

Subsequently, the collector electrode 7 is formed on the second main surface of the semiconductor substrate, so that the sectional configuration illustrated in FIG. 9 can be obtained. The collector electrode 7 is formed over the entire surface including the IGBT region 10, the diode region 20, and the termination region 30 in the second main surface. Further, the collector electrode 7 may be formed over the entire second main surface of the n-type wafer that is the semiconductor substrate. The collector electrode 7 may be formed of an aluminum-silicon alloy (Al—Si-based alloy), titanium (Ti), or the like that is deposited by PVD such as sputtering or vapor deposition, or may be formed of a plurality of stacked metal layers of an aluminum-silicon alloy, titanium, nickel, gold, or the like. Furthermore, a metal film may be further formed on the metal film formed by PVD by electroless plating or electrolytic plating to form the collector electrode 7.

The semiconductor device 100 or the semiconductor device 101 is manufactured by the above-described steps. A plurality of semiconductor devices 100 or a plurality of semiconductor devices 101 are manufactured in a matrix in a single n-type wafer. Then, the wafer is cut into individual semiconductor devices 100 or individual semiconductor devices 101 by laser dicing or blade dicing, so that the semiconductor device 100 or the semiconductor device 101 is completed.

First Preferred Embodiment

<Configuration>

Figure 23:
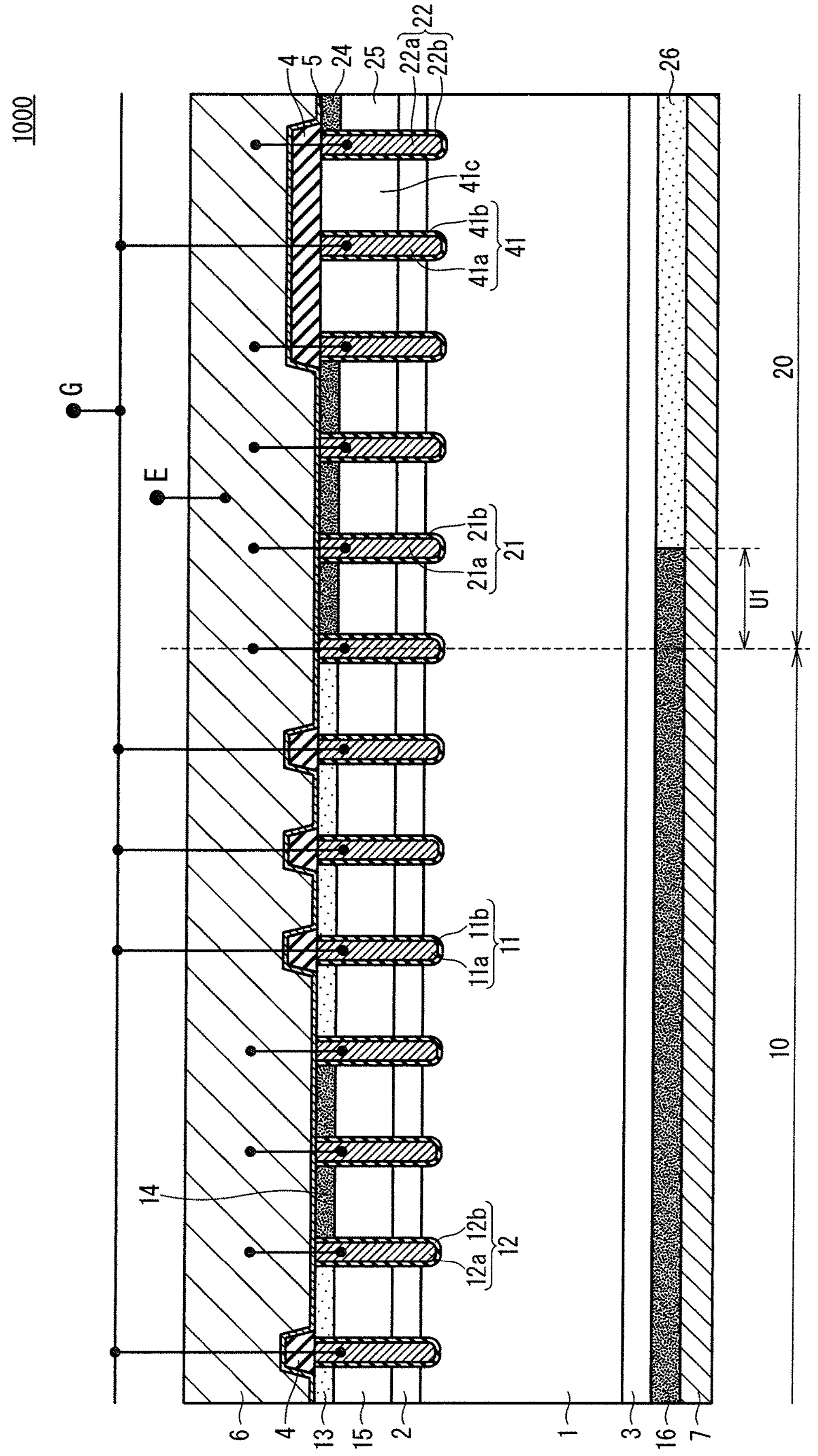
FIG. 23 is a partial sectional view illustrating a configuration of an RC-IGBT according to a first preferred embodiment.

FIG. 23 is a partial sectional view illustrating a configuration of an RC-IGBT 1000 according to a first preferred embodiment, and is a sectional view corresponding to a sectional view taken along a broken line G-G in the semiconductor device 100 illustrated in FIG. 1 or the semiconductor device 101 illustrated in FIG. 2 as seen from the arrow direction. Additionally, the same components as those in FIG. 9 that is a sectional view of the semiconductor device 100 or the semiconductor device 101 are denoted by the same reference signs and duplicated description is omitted.

As illustrated in FIG. 23, the p-type collector layer 16 provided on the second-main-surface side in the IGBT region 10 is provided so as to extend off a boundary between the IGBT region 10 and the diode region 20 into the diode region 20 by the distance U1. Because of the p-type collector layer 16 extending off into the diode region 20 as described above, a distance between the $n^+$-type cathode layer 26 in the diode region 20 and the active trench gate 11 can be increased. Thus, if a gate drive voltage is applied to the gate trench electrode 11*a* during a freewheeling-diode operation, a current can be suppressed from flowing from a channel formed adjacent to the active trench gate 11 in the IGBT region 10 to the $n^+$-type cathode layer 26.

In the RC-IGBT 1000 illustrated in FIG. 23, the diode region 20 includes the plurality of active trench gates 11, the plurality of dummy trench gates 12, the plurality of diode trench gates 21, a plurality of diode semi-trench gates 22, and a diode dummy active trench gate 41 that extend from the ends of the $n^+$-type source layer 13, the $p^+$-type contact layer 14, the $p^+$-type contact layer 24, and the p-type anode layer 25 on the upper side in the drawing sheet, forming the first main surface of the semiconductor substrate, and reach the $n^-$-type drift layer 1.

As the features of the present disclosure lie in the configuration of the diode region 20, the configuration of the diode region 20 will be mainly described below.

As illustrated in FIG. 23, the diode dummy active trench gate 41 is provided so as to be interposed between two diode semi-trench gates 22, and a p-type anode layer 41*c* that is the third semiconductor layer is provided between the diode dummy active trench gate 41 and the diode semi-trench gates 22. The two diode semi-trench gates 22 and the diode dummy active trench gate 41 are covered with the continuous interlayer insulating film 4, and the p-type anode layer 41*c* is not applied with an emitter potential corresponding to a first potential, to be in a floating state.

In the diode trench gate 21, a diode trench electrode 21*a* is provided in a trench that penetrates the $p^+$-type contact layer 24, the p-type anode layer 25, and the n-type carrier stored layer 2 and reaches the $n^-$-type drift layer 1, with the diode trench insulating film 21*b* interposed therebetween, and the diode trench electrode 21*a* is electrically connected to the emitter electrode 6.

In the diode semi-trench gate 22, a diode semi-trench electrode 22*a* is provided in a trench that penetrates the p-type anode layer 25 and the n-type carrier stored layer 2 and reaches the $n^-$-type drift layer 1, with a diode semi-trench insulating film 22*b* interposed therebetween, and the diode semi-trench electrode 22*a* is electrically connected to the emitter electrode 6.

On one of the two side surfaces of the diode semi-trench gate 22, the p-type anode layer 25 electrically connected to the emitter electrode 6 is provided, and on the other side surface, the p-type anode layer 41*c* that is not electrically connected to the emitter electrode 6 to be in a floating state is provided. Such a configuration having a p-type anode layer in a floating state on one of side surfaces of a trench gate is referred to as a "semi-trench gate".

In the diode dummy active trench gate 41, a diode dummy active trench electrode 41*a* is provided in a trench that penetrates the p-type anode layer 41*c* and the n-type carrier stored layer 2 and reaches the $n^-$-type drift layer 1, with a diode dummy active trench insulating film 41*b* interposed therebetween, and the diode dummy active trench electrode 41*a* is electrically connected to a gate electrode not illustrated.

On both side surfaces of the diode dummy active trench gate 41, the p-type anode layer 41*c* that is not electrically connected to the emitter electrode 6 to be in a floating state is provided. Such a configuration in which a trench electrode is electrically connected to a gate electrode and a p-type anode layer in a floating state is provided on one of side surfaces of the gate is referred to as a "dummy active trench gate".

As described above, in the diode region 20 of the RC-IGBT 1000, an emitter potential E is applied to the diode trench electrode 21*a* of the diode trench gate 21 and the diode semi-trench electrode 22*a* of the diode semi-trench gate 22, and a gate potential G is applied to the diode dummy active trench electrode 41*a* of the diode dummy active trench gate 41.

By placing the diode dummy active trench gate 41 in the diode region as described above, it is possible to reduce a displacement current. Specifically, in the diode region, holes are injected from the anode while no holes are injected from the cathode during a diode operation. Thus, the potential of the p-type anode layer 41*c* is suppressed from varying due to holes injected from the cathode, so that a displacement current flowing through the diode dummy active trench gate 41 can be reduced.

Further, the p-type collector layer 16 provided on the second-main-surface side in the IGBT region 10 extends off the boundary between the IGBT region 10 and the diode region 20 into the diode region 20 by the distance U1. On the first-main-surface side, in a region corresponding to the region where the p-type collector layer 16 extends off, the diode dummy active trench gate 41 is not placed. This also can reduce a displacement current flowing through the diode dummy active trench gate 41.

Additionally, since no dummy active trench gate is provided in the IGBT' region, holes injected from the collector layer at the time of turn-on do not cause variation in the potential of the floating p-type base layer 15. As a result, a displacement current is suppressed from flowing through the dummy active trench gate, which can mitigate reduction of the gate-resistance controllability of dV/dt.

Further, the diode dummy active trench gate 41 is interposed between the two diode semi-trench gates 22, the p-type anode layer 41*c* is provided between the diode dummy active trench gate 41 and the diode semi-trench gates 22, and the p-type anode layer 41*c* is not connected to the emitter potential to be in a floating state.

Thus, the diode dummy active trench electrode 41*a* and the diode dummy active trench insulating film 41*b* of the diode dummy active trench gate 41, the floating p-type anode layer 41*c*, and the $n^-$-type drift layer 1 form a capacitor. In other words, a capacitor is formed between the diode dummy active trench electrode 41*a* and the collector electrode 7, that is, the cathode electrode applying a second potential. This means that the gate-collector capacitance (feedback capacitance) Cgc between the gate and the collector of the IGBT is increased. An increase of the feedback capacitance (Cgc) can reduce a turn-on loss under a condition that dV/dt that is variation in the drain voltage V with the time t, is constant.

Additionally, though the p-type anode layer 41*c* placed on both sides of the diode dummy active trench gate 41 is at a floating potential in FIG. 23, the p-type anode layer 41*c* may be connected to the emitter electrode 6 in the cell region. Further, the p-type anode layer 41*c* may or may not be connected to the p-type termination well layer 31 (FIG. 11) in the termination region. In this case, the p-type termination well layer 31 may be electrically connected to the emitter electrode 6. That is, the p-type anode layer 41*c* may or may not be electrically connected to the emitter electrode 6 and an electrode in the termination region. In a case where the p-type anode layer 41*c* is not electrically connected to the emitter electrode 6 immediately thereabove but is electrically connected to the emitter electrode 6 in a position far therefrom, the p-type anode layer 41*c* is connected to the emitter electrode 6 via high resistance to be in a pseudo floating state. This can produce the effect of increasing the feedback capacitance (Cgc).

<Effects>

As described above, with the RC-IGBT 1000 according to the first preferred embodiment, a displacement current flowing through the diode dummy active trench gate 41 can be reduced, and the feedback capacitance Cgc between the gate and the collector of the IGBT can be increased by inclusion of the diode dummy active trench gate 41 in the diode region 20 and inclusion of the p-type anode layer 41*c* in a floating state adjacent to the gate 41, so that a turn-on loss can be reduced under a condition that dV/dt is constant.

<Modification>

The configuration has been described in which only a single diode dummy active trench gate 41 is interposed between the two diode semi-trench gates 22, in the RC-IGBT 1000 illustrated in FIG. 23. However, the present disclosure is not limited to the configuration. A plurality of diode dummy active trench gates 41 may be provided.

Figure 24:
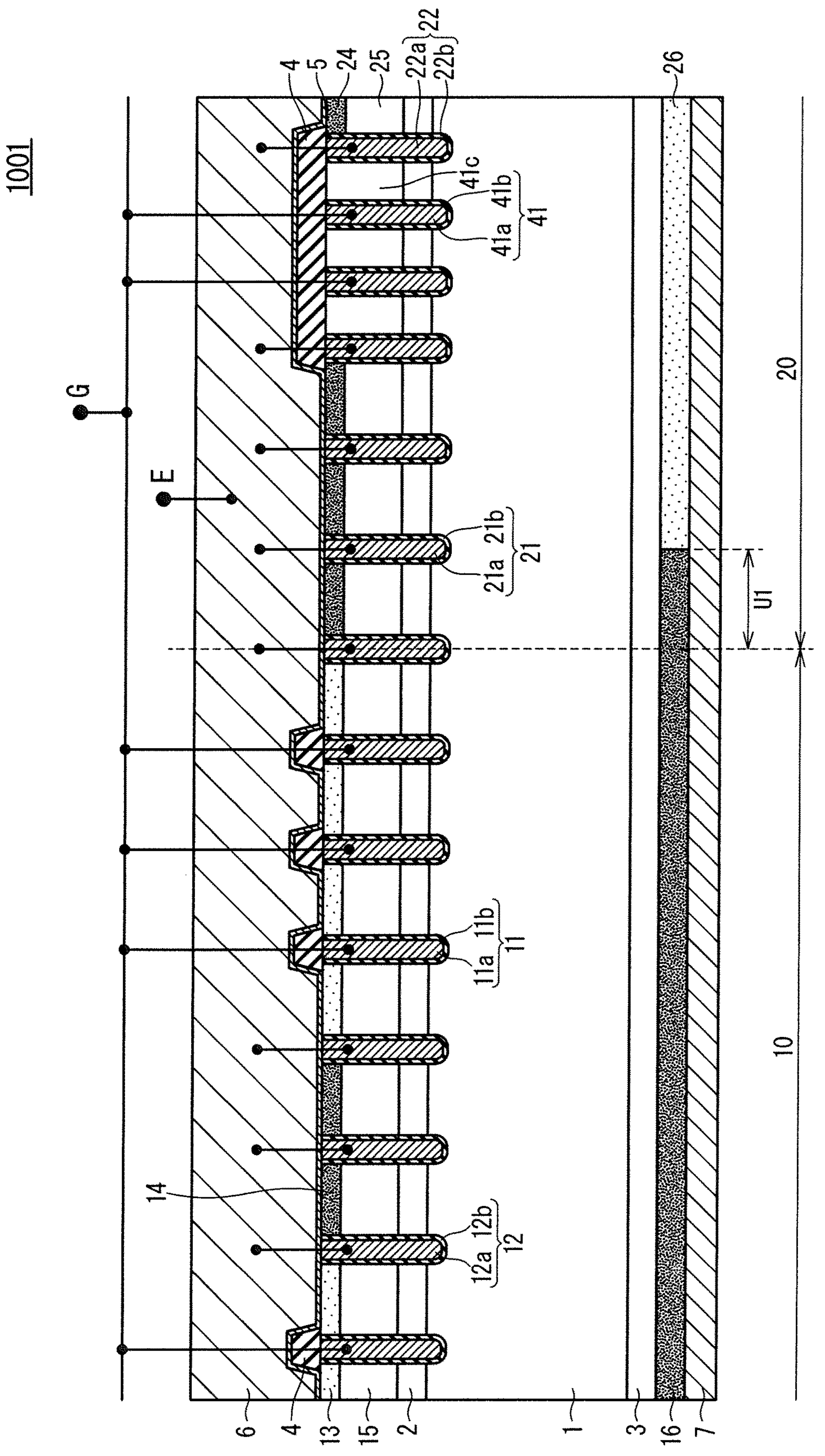
FIG. 24 is a partial sectional view illustrating a configuration of a modification of the RC-IGBT according to the first preferred embodiment.

For example, an RC-IGBT 1001 illustrated in FIG. 24 has a configuration in which two diode dummy active trench gates 41 are provided between the two diode semi-trench gates 22.

The diode dummy active trench gates 41 are provided so as to be interposed between the two diode semi-trench gates 22. In a case where the diode dummy active trench gate 41 and the diode semi-trench gate 22 are arranged adjacent to each other as described above, the gate-emitter capacitance Cge that is a coupling capacitance is generated between the diode dummy active trench gate 41 at a gate potential and the diode semi-trench gate 22 at an emitter potential. When the gate-emitter capacitance Cge is generated, the gate capacitance ratio Cgc/Cge decreases, which is undesirable for reducing a turn-on loss.

Then, by increasing the number of the diode dummy active trench gates 41 as in the RC-IGBT 1001 illustrated in FIG. 24, it is possible to further increase the gate capacitance ratio Cgc/Cge, thereby further reducing a turn-on loss.

Second Preferred Embodiment

<Configuration>

Figure 25:
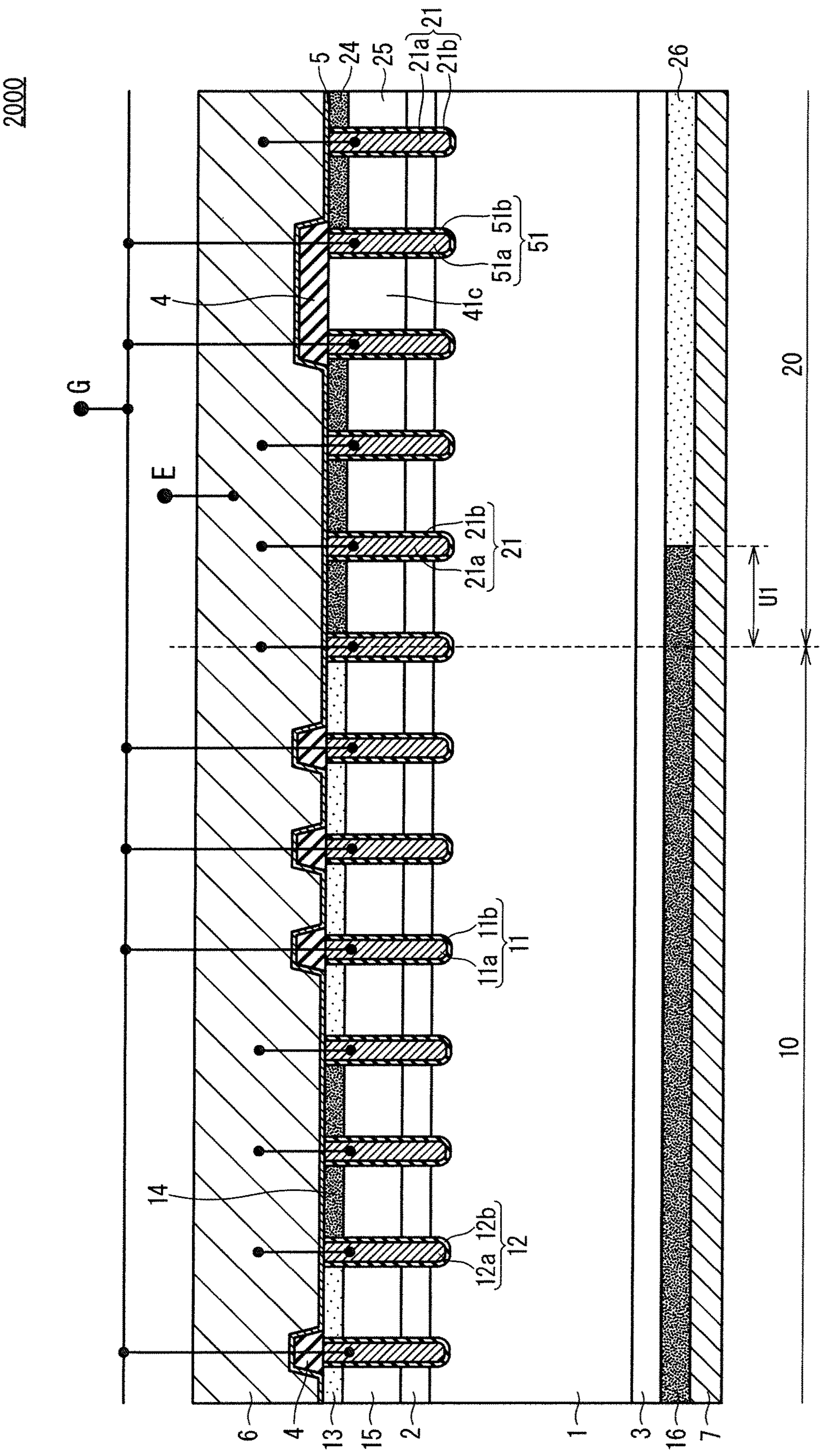
FIG. 25 is a partial sectional view illustrating a configuration of an RC-IGBT according to a second preferred embodiment.

FIG. 25 is a partial sectional view illustrating a configuration of an RC-IGBT 2000 according to a second preferred embodiment, and is a sectional view corresponding to a sectional view taken along a line G-G in the semiconductor device 100 illustrated in FIG. 1 or the semiconductor device 101 illustrated in FIG. 2 as seen from the arrow direction. Additionally, the same components as those in FIG. 9 that is a sectional view of the semiconductor device 100 or the semiconductor device 101 are denoted by the same reference signs and duplicated description is omitted.

In the RC-IGBT 2000 illustrated in FIG. 25, the diode region 20 includes the plurality of diode trench gates 21 that extend from the end of the p-type anode layer 25 on the upper side in the drawing sheet, forming the first main surface of the semiconductor substrate, and reach the $n^-$-type drift layer 1, and includes two diode dummy active semi-trench gates 51 arranged adjacent to each other. Then, the p-type anode layer 41*c* is provided between the two diode dummy active semi-trench gates 51. The two diode dummy active semi-trench gates 51 are covered with the continuous interlayer insulating film 4, and the p-type anode layer 41*c* is not applied with an emitter potential to be in a floating state.

In the diode dummy active semi-trench gate 51, a diode dummy active semi-trench electrode 51*a* is provided in a trench that penetrates the p-type anode layer 41*c* and the n-type carrier stored layer 2 and reaches the $n^-$-type drift layer 1, with a diode dummy active semi-trench insulating film 51*b* interposed therebetween, and the diode dummy active semi-trench electrode 51*a* is electrically connected to a gate electrode not illustrated.

On one of the two side surfaces of the diode dummy active semi-trench gate 51, the p-type anode layer 25 electrically connected to the emitter electrode 6 is provided. On the other side surface, the p-type anode layer 41*c* in a floating state is provided.

As described above, in the diode region 20 of the RC-IGBT 2000, the emitter potential E is applied to the diode trench electrode 21*a* of the diode trench gate 21 and the diode semi-trench electrode 22*a* of the diode semi-trench gate 22, and the gate potential G is applied to the diode dummy active semi-trench electrode 51*a* of the diode dummy active semi-trench gate 51.

By placing the diode dummy active semi-trench gate 51 in the diode region as described above, it is possible to reduce a displacement current. Specifically, in the diode region, holes are injected from the anode while no holes are injected from the cathode during a diode operation. Thus, the potential of the p-type anode layer 41*c* is suppressed from varying due to holes injected from the cathode, so that a displacement current flowing through the diode dummy active semi-trench gate 51 can be reduced.

Further, the p-type collector layer 16 provided on the second-main-surface side in the IGBT region 10 extends off the boundary between the IGBT region 10 and the diode region 20 into the diode region 20 by the distance U1. On the first-main-surface side, in a region corresponding to the region where the p-type collector layer 16 extends off, the diode dummy active semi-trench gate 51 is not placed. This also can reduce a displacement current flowing through the diode dummy active semi-french gate 51.

Additionally, since no dummy active trench gate is provided in the IGBT region, holes injected from the collector layer at the time of turn-on do not cause variation in the potential of the floating p-type base layer 15. As a result, a displacement current is suppressed from flowing through the dummy active trench gate, which can mitigate reduction of the gate-resistance controllability of dV/dt.

Further, the p-type anode layer 41*c* is provided between the two diode dummy active semi-trench gates 51, and the p-type anode layer 41*c* is not connected to an emitter potential to be in a floating state.

Thus, the diode dummy active semi-trench electrode 51*a* and the diode dummy active semi-trench insulating film 51*b* of the diode dummy active semi-trench gate 51, the floating p-type anode layer 41*c*, and the $n^-$-type drift layer 1 form a capacitor. In other words, a capacitor is formed between the diode dummy active semi-trench electrode 51*a* and the collector electrode 7, that is, the cathode electrode applying the second potential. This means that the gate-collector capacitance (feedback capacitance) Cgc between the gate and the collector of the IGBT is increased. An increase of the feedback capacitance (Cgc) can reduce a turn-on loss under a condition that dV/dt that is variation in the drain voltage V with the time t, is constant.

<Effects>

As described above, with the RC-IGBT 2000 according to the second preferred embodiment, a displacement current flowing through the diode dummy active semi-trench gate 51 can be reduced, and the feedback capacitance Cgc between the gate and the collector of the IGBT can be increased by inclusion of the diode dummy active semi-trench gate 51 in the diode region 20 and inclusion of the p-type anode layer 41*c* in a floating state adjacent to the gate 51, so that a turn-on loss can be reduced under a condition that dV/dt is constant.

First Modification

The configuration has been described in which the p-type anode layer 41*c* in a floating state is provided between the diode dummy active semi-trench gates 51, in the RC-IGBT 2000 illustrated in FIG. 25. However, there may alternatively be formed a configuration in which the diode dummy active trench gate 41 is provided adjacent to the diode dummy active semi-trench gate 51 as in an RC-IGBT 2001 illustrated in FIG. 26.

Figure 26:
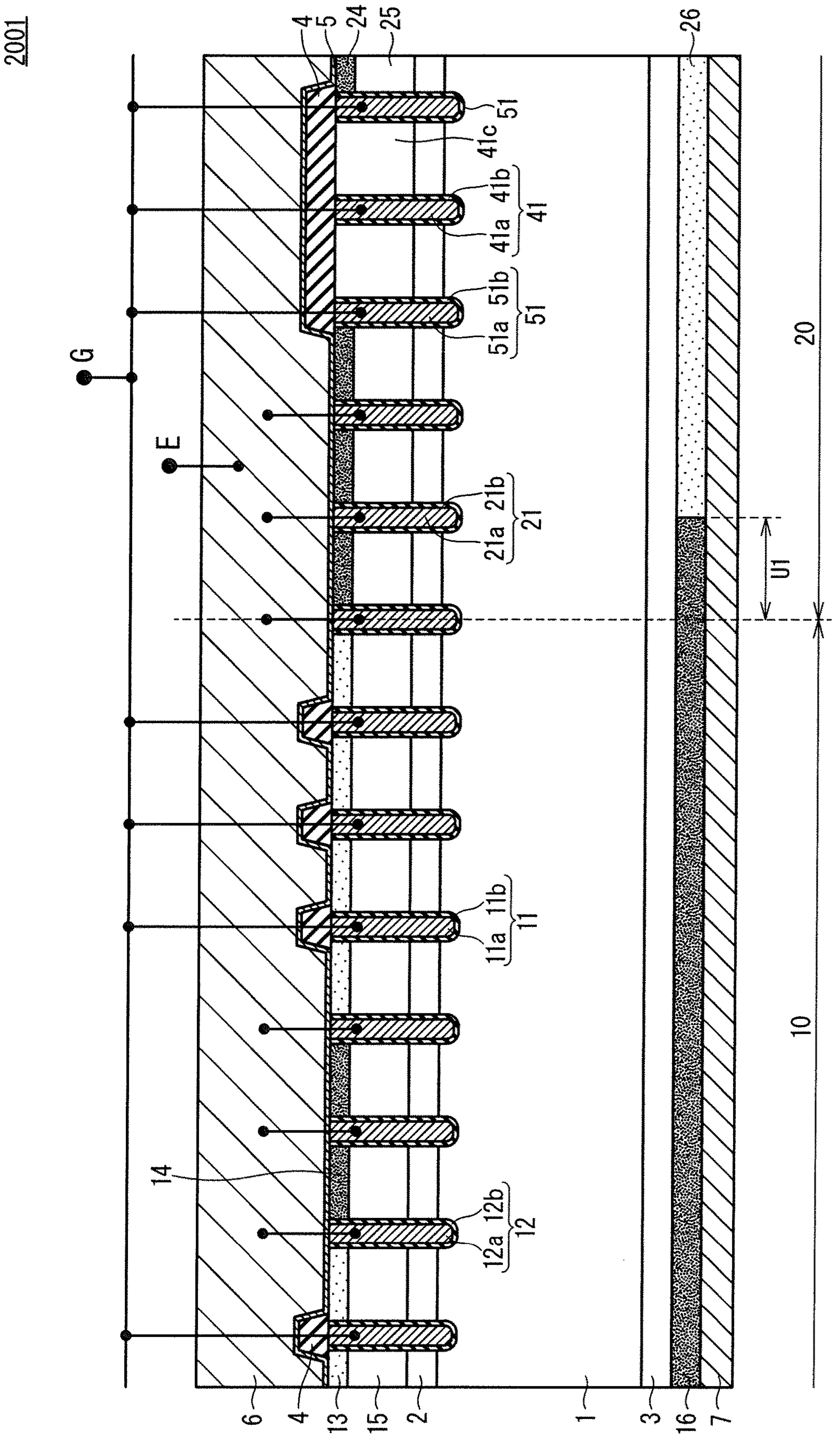
FIG. 26 is a partial sectional view illustrating a configuration of a first modification of the RC-IGBT according to the second preferred embodiment.

As illustrated in FIG. 26, in the diode dummy active trench gate 41, the diode dummy active trench electrode 41*a* is provided in a trench that penetrates the p-type anode layer 41*c* and the n-type carrier stored layer 2 and reaches the $n^-$-type drift layer 1 with the diode dummy active trench insulating film 41*b* interposed therebetween, and the diode dummy active trench electrode 41*a* is electrically connected to a gate electrode not illustrated. Then, the two diode dummy active semi-trench gates 51 and the diode dummy active trench gate 41 are covered with the continuous interlayer insulating film 4, and the p-type anode layer 41*c* is not applied with an emitter potential to be in a floating state.

By placing the diode dummy active trench gate 41 adjacent to the diode dummy active semi-trench gate 51 in the diode region as described above, it is possible to reduce a displacement current. Specifically, in the diode region, holes are injected from the anode while no holes are injected from the cathode during a diode operation. Thus, the potential of the p-type anode layer 41*c* is suppressed from varying due to holes injected from the cathode, so that a displacement current flowing through the diode dummy active trench gate 41 can be reduced.

Further, as a result of the placement of the diode dummy active trench gate 41, the diode dummy active trench electrode 41*a* and the diode dummy active trench insulating film 41*b* of the diode dummy active trench gate 41, the floating p-type anode layer 41*c*, and the $n^-$-type drift layer 1 form a capacitor. Thus, the gate-collector capacitance (feedback capacitance) Cgc between the gate and the collector of the IGBT can be further increased. A further increase of the feedback capacitance (Cgc) can further reduce a turn-on loss under a condition that dV/dt that is variation in the drain voltage V with the time t, is constant.

Further, because of the arrangement of the diode dummy active trench gate 41 applied with a gate potential and the diode dummy active semi-trench gate 51 adjacent to each other, the gate-emitter capacitance Cge that is a coupling capacitance is not generated between the gates, and the gate capacitance ratio Cgc/Cge can be increased, so that a turn-on loss can be reduced.

While the configuration has been described in which only a single diode dummy active trench gate 41 is interposed between the two diode dummy active semi-trench gates 51 in the RC-IGBT 2001 illustrated in FIG. 26, the present disclosure is not limited to the configuration. A plurality of diode dummy active trench gates 41 may be provided.

By increasing the number of the diode dummy active trench gates 41, it is possible to further increase the gate capacitance ratio Cgc/Cge, thereby further reducing a turn-on loss.

Second Modification

Figure 27:
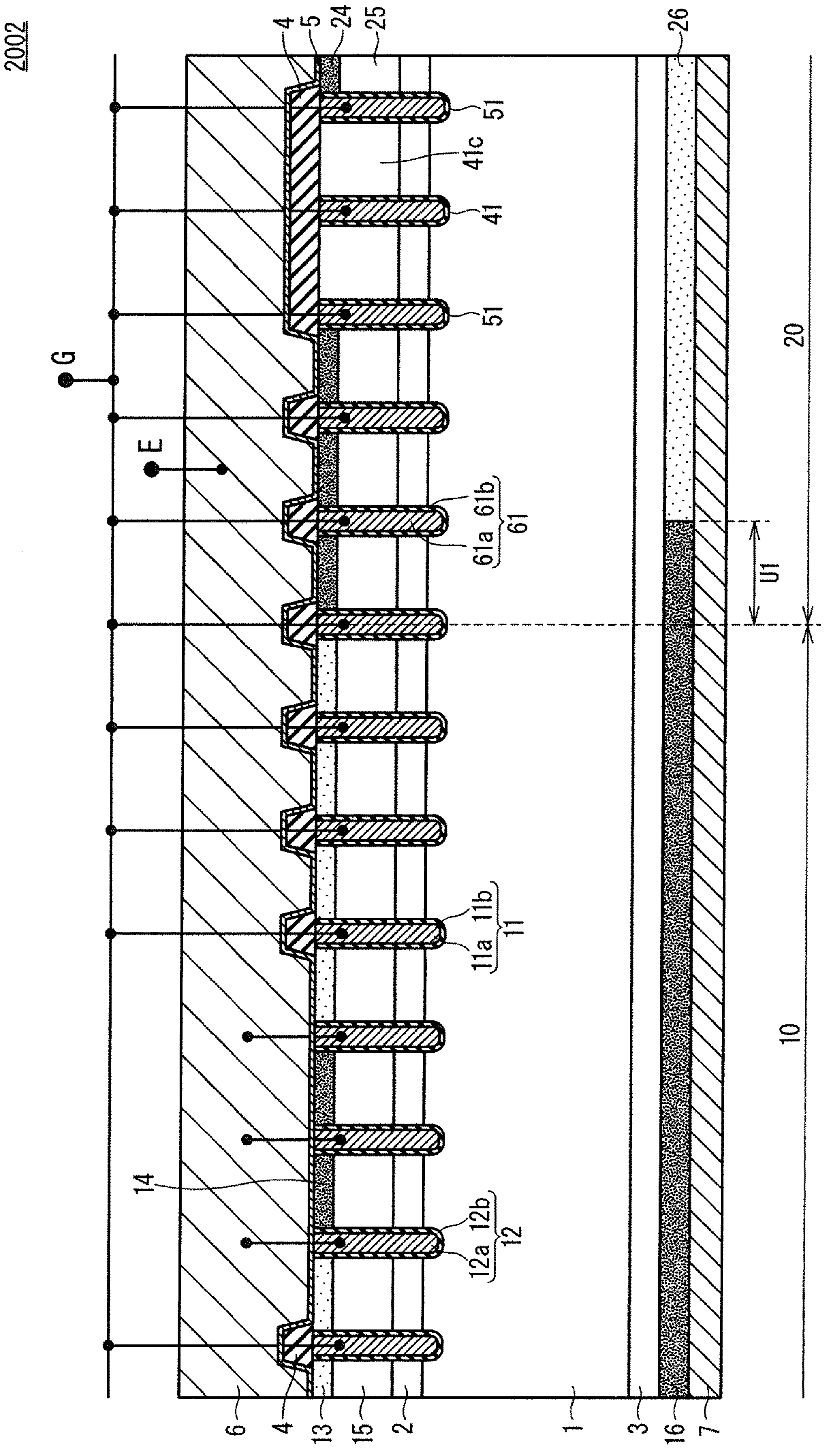
FIG. 27 is a partial sectional view illustrating a configuration of a second modification of the RC-IGBT according to the second preferred embodiment.

The configuration has been described in which the plurality of diode trench gates 21 that extend from the end of the p-type anode layer 25 on the upper side in the drawing sheet, forming the first main surface of the semiconductor substrate, and reach the $n^-$-type drift layer 1, are provided, in the RC-IGBT 2001 illustrated in FIG. 26. However, there may alternatively be formed a configuration in which a plurality of diode active trench gates 61 that extend from the first main surface of the semiconductor substrate and reach the $n^-$-type drift layer 1 are provided in place of the plurality of diode trench gates 21 as in an RC-IGBT 2002 illustrated in FIG. 27.

In the diode active trench gate 61, a diode active trench electrode 61*a* is provided in a trench that penetrates the $p^+$-type contact layer 24, the p-type anode layer 25, and the n-type carrier stored layer 2 and reaches the $n^-$-type drift layer 1, with a diode active trench insulating film 61*b* interposed therebetween, and the diode active trench electrode 61*a* is electrically connected to a gate electrode not illustrated.

Thus, the diode active trench electrode 61*a* and the diode active trench insulating film 61*b* of the diode active trench gate 61, and the p-type anode layer 25 electrically connected to the emitter electrode 6 form a capacitor, which generates the gate-emitter capacitance Cge. However, at the same time, the capacitor formed by the diode active trench electrode 61*a*, the diode active trench insulating film 61*b*, and the n⁻-type drift layer 1 generates also the gate-collector capacitance (feedback capacitance) Cgc. As a result, the feedback capacitance (Cgc), combined with the gate-collector capacitance (feedback capacitance) Cgc generated by the arrangement of the diode dummy active trench gate 41 and the diode dummy active semi-trench gate 51, can be further increased. Thus, a turn-on loss can be further reduced under a condition that dV/dt that is variation in the drain voltage V with the time t, is constant.

Third Preferred Embodiment

<Configuration>

Figure 28:
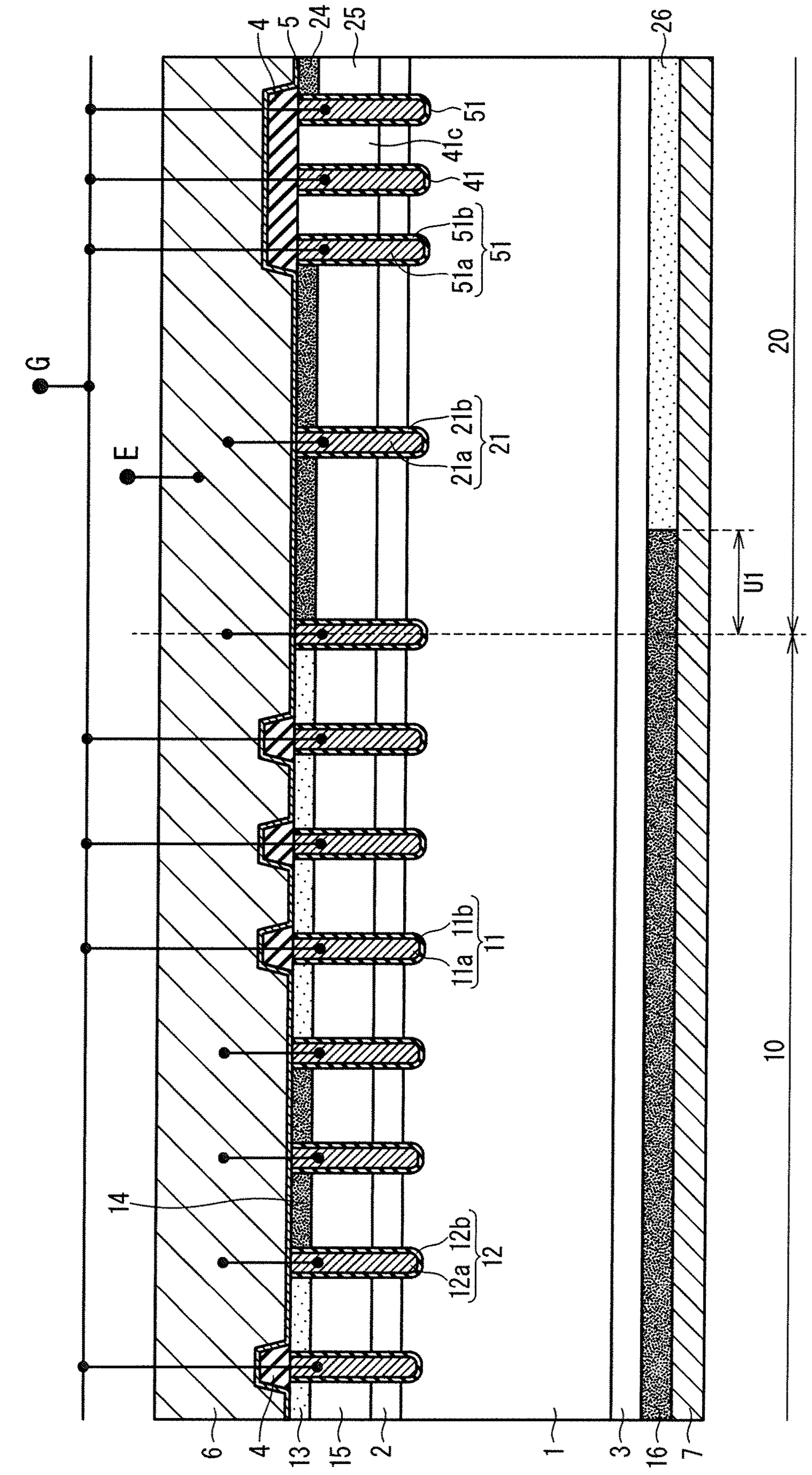
FIG. 28 is a partial sectional view illustrating a configuration of an RC-IGBT according to a third preferred embodiment.

FIG. 28 is a partial sectional view illustrating a configuration of an RC-IGBT 3000 according to a third preferred embodiment, and is a sectional view corresponding to a sectional view taken along a line G-G in the semiconductor device 100 illustrated in FIG. 1 or the semiconductor device 101 illustrated in FIG. 2 as seen from the arrow direction. Additionally, the same components as those in FIG. 9 that is a sectional view of the semiconductor device 100 or the semiconductor device 101 are denoted by the same reference signs and duplicated description is omitted.

The RC-IGBT 3000 illustrated in FIG. 28, like the RC-IGBT 2001 illustrated in FIG. 26, has a configuration in which the diode dummy active trench gate 41 is provided adjacent to the diode dummy active semi-trench gate 51. However, the interval between the diode dummy active trench gate 41 and the diode dummy active semi-trench gate 51 is set so as to be shorter than the interval between the adjacent diode trench gates 21, the interval between the adjacent active trench gates 11, or the interval between the active trench gate 11 and the dummy trench gate 12 adjacent to each other.

Additionally, while the number of the arranged diode dummy active trench gates 41 is one in FIG. 28, the number of the gates 41 is not limited thereto. A plurality of diode dummy active trench gates 41 can be arranged.

In that case, the interval between the diode dummy active trench gate 41 and the diode dummy active semi-trench gate 51 and the interval between the adjacent diode dummy active trench gates 41 can be set so as to be a half to a quarter of the interval between the other adjacent trench gates.

<Effects>

Narrowing the interval between the diode dummy active trench gate 41 and the diode dummy active semi-trench gate 51 enables high-density arrangement of the diode dummy active trench gate 41 and the diode dummy active semi-trench gate 51. Then, the number of the arranged diode dummy active trench gates 41 can be increased, which allows an increase of the gate-collector capacitance (feedback capacitance) Cgc between the gate and the collector of the IGBT. This can reduce a turn-on loss under a condition that dV/dt that is variation in the drain voltage V with the time t, is constant.

<Modification>

The configuration has been disclosed in which the interval between the diode dummy active trench gate 41 and the diode dummy active semi-trench gate 51 is made narrower than the interval between the other adjacent trench gates and the number of the arranged diode dummy active trench gates 41 is increased, thereby increasing the feedback capacitance Cgc in the RC-IGBT 3000 according to the above-described third preferred embodiment. However, arranging the diode dummy active trench gate 41 in a grid pattern as in an R.C-IGBT 3001 illustrated in FIG. 29 also can increase the feedback capacitance Cgc.

Figure 29:
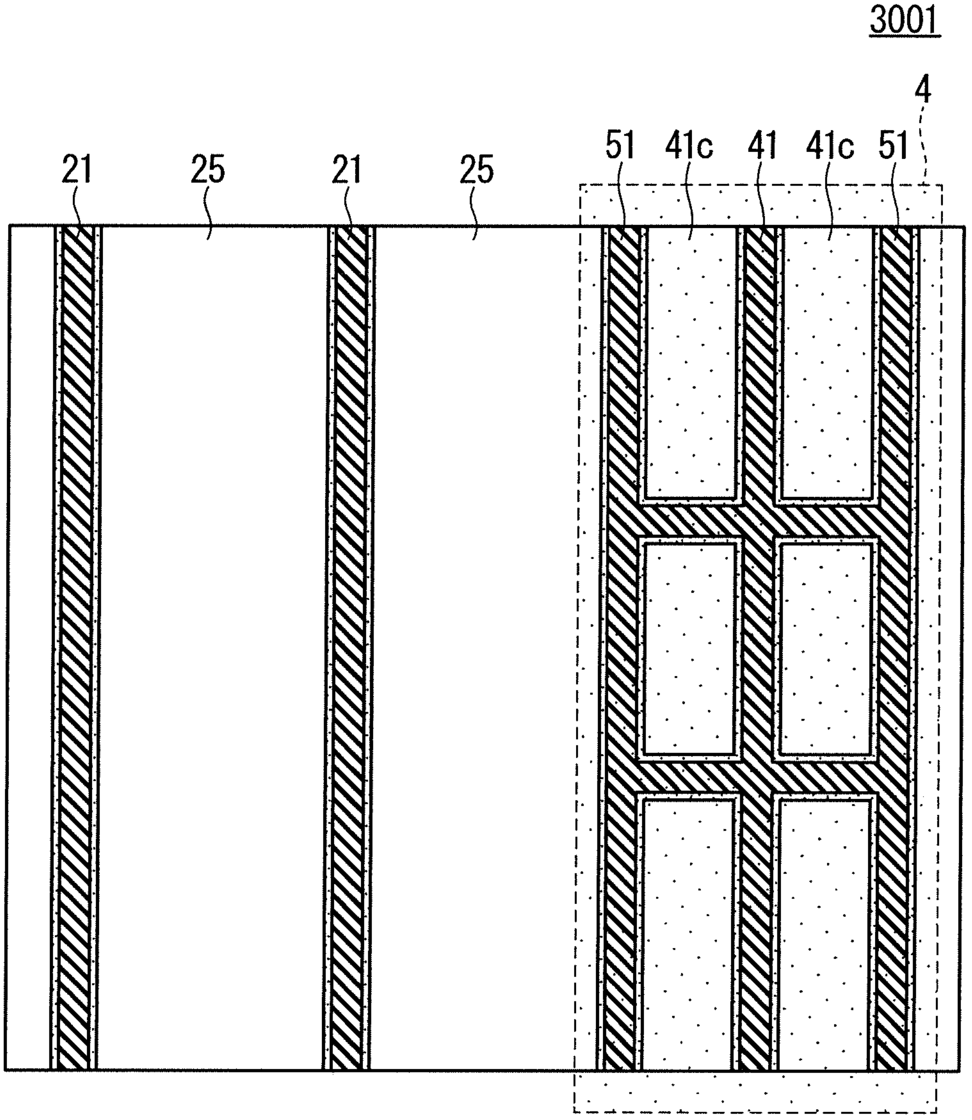
FIG. 29 is a partial sectional view illustrating a configuration of a modification of the RC-IGBT according to the third preferred embodiment.

FIG. 29 is a partial plan view illustrating a configuration of the RC-IGBT 3001, and is a view of a part of the diode region 20 including the diode dummy active trench gate 41 and the diode dummy active semi-trench gate 51 as seen from above. Additionally, in FIG. 29, the components such as the emitter electrode 6 and the like are omitted for the sake of convenience.

As illustrated in FIG. 29, the diode dummy active trench gate 41 branches in a direction perpendicular to the extending direction of the trench at a plurality of positions along the extending direction of the trench, and is connected to the diode dummy active semi-trench gate 51 adjacent thereto. As a result, the diode dummy active trench gate 41 and the diode dummy active semi-trench gate 51 form a grid-shaped trench gate, and the p-type anode layer 41*c* is a rectangular region surrounded by the grid-shaped trench gate in plan view.

Thus, the gate-collector capacitance (feedback capacitance) Cgc generated by arrangement of the diode dummy active trench gate 41 and the diode dummy active semi-trench gate 51 is increased, so that a turn-on loss can be reduced under a condition that dV/dt that is variation in the drain voltage V with the time t, is constant.

Additionally, the number of the formed p-type anode layers 41*c* that are rectangular in plan view is not limited to any particular number as long as the p-type anode layers 41*c* can be placed within the length of the stripe-shaped diode dummy active trench gate 41 and the size of the p-type anode layer 41*c* is within a range that allows formation of the diode dummy active trench insulating film 41*b* and the diode dummy active trench electrode 41*a*.

Fourth Preferred Embodiment

<Configuration>

Figure 30:
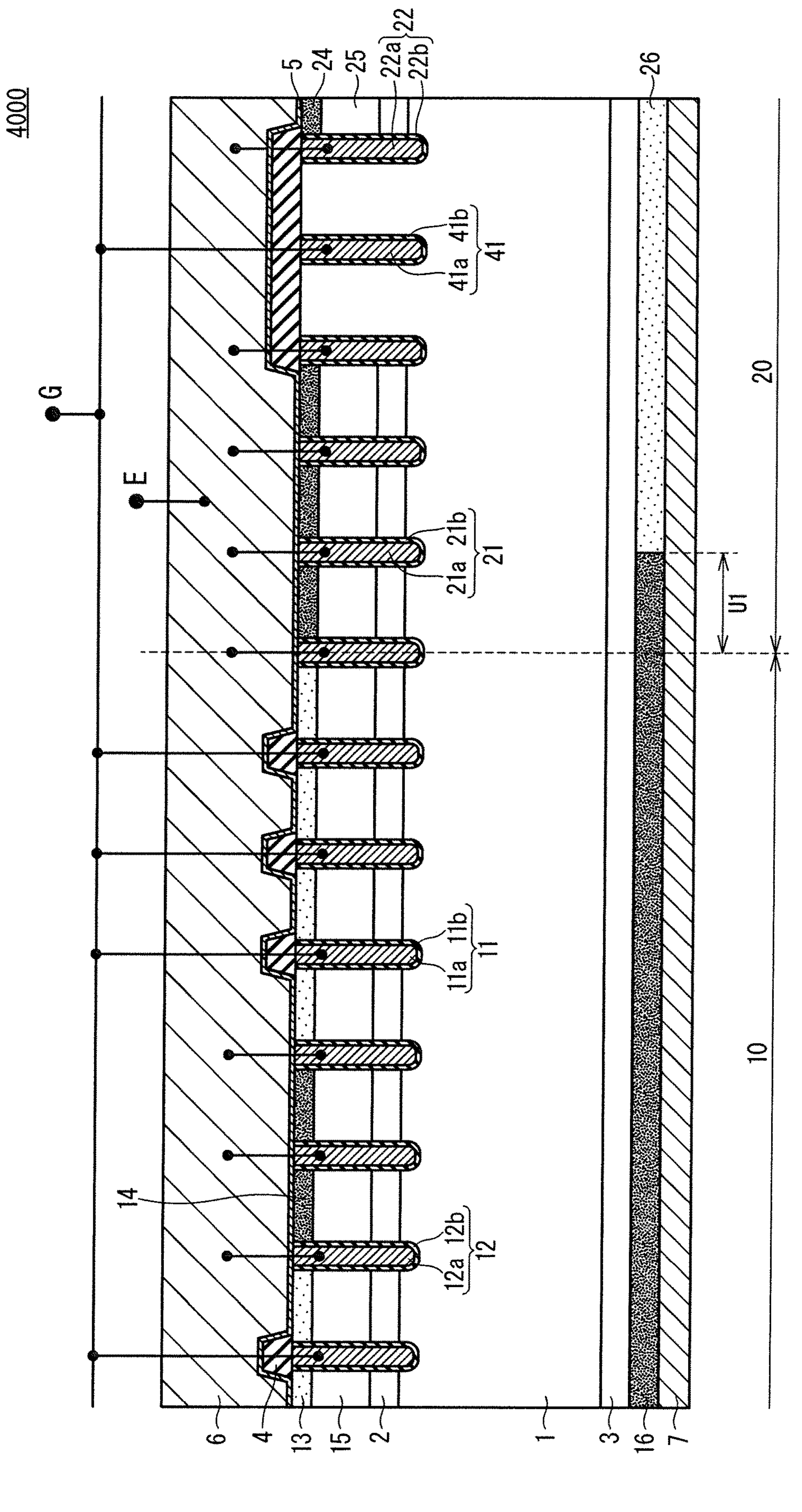
FIG. 30 is a partial sectional view illustrating a configuration of an RC-IGBT according to a fourth preferred embodiment.

FIG. 30 is a partial sectional view illustrating a configuration of an RC-IGBT 4000 according to a fourth preferred embodiment, and is a sectional view corresponding to a sectional view taken along a line G-G in the semiconductor device 100 illustrated in FIG. 1 or the semiconductor device 101 illustrated in FIG. 2 as seen from the arrow direction. Additionally, the same components as those in FIG. 9 that is a sectional view of the semiconductor device 100 or the semiconductor device 101 are denoted by the same reference signs and duplicated description is omitted.

In the RC-IGBT 4000 illustrated in FIG. 30, in the same manner as in the RC-IGBT 1001 illustrated in FIG. 23, the diode dummy active trench gate 41 is provided so as to be interposed between two diode semi-trench gates 22. However, in a mesa region between the diode dummy active trench gate 41 and the diode semi-trench gate 22, the p-type anode layer 41*c* is not provided, but the n⁻-type drift layer 1 is provided there. Further, the n-type carrier stored layer 2 is not provided, either.

<Effects>

In a configuration in which the p-type anode layer 41*c* is provided in the mesa region between the diode dummy active trench gate 41 and the diode semi-trench gate 22, a small number of holes caused by a reverse recovery current cause variation in the potential of the floating p-type anode layer 41*c* during a recovery operation of the diode to generate a displacement current in some cases. However, with no p-type semiconductor layer being formed there, the influence of a displacement current on the diode dummy active trench gate 41 can be reduced.

Fifth Preferred Embodiment

<Configuration>

Figure 31:
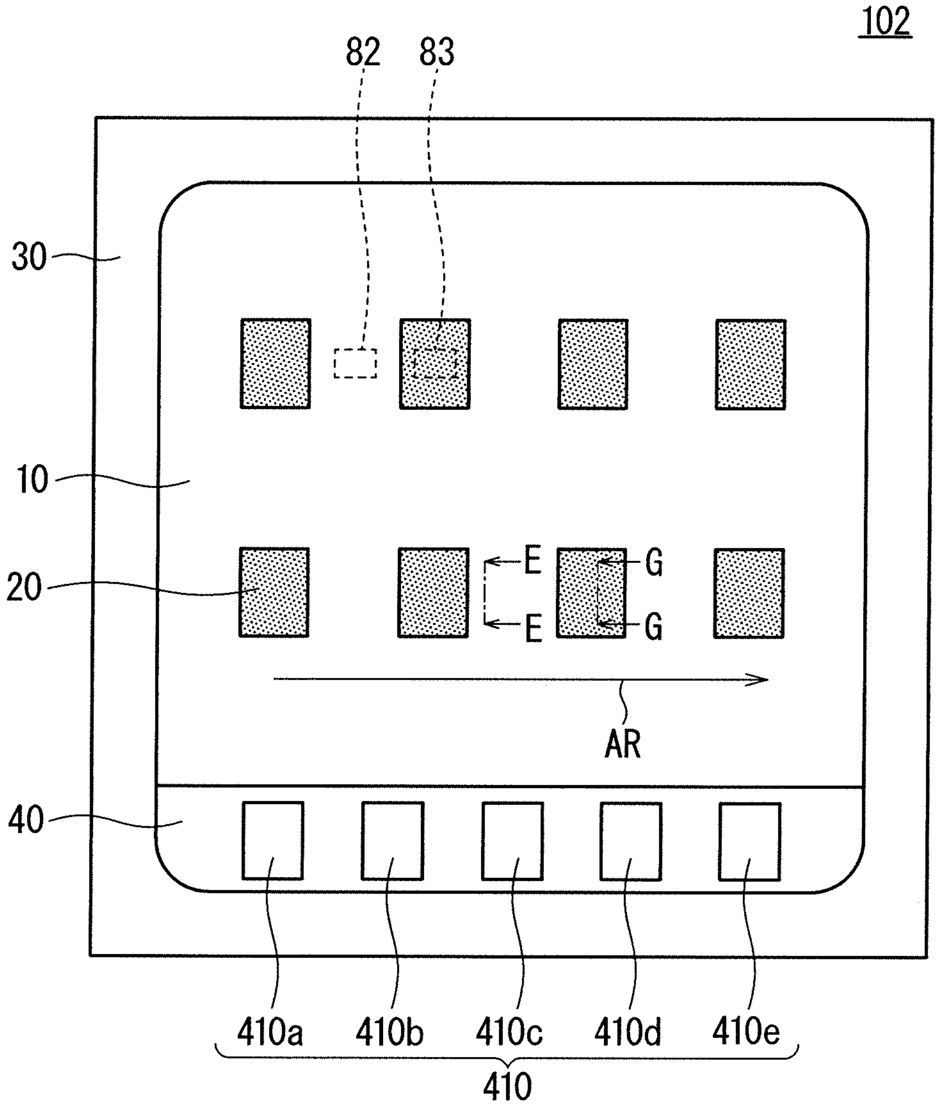
FIG. 31 is a plan view illustrating a semiconductor device according to a fifth preferred embodiment.

FIG. 31 is a plan view illustrating an island-type semiconductor device 102 as a semiconductor device according to a fifth preferred embodiment. The IGBT region 10 and the diode region 20 are included in one semiconductor device. In FIG. 31, the extending direction of a trench gate is indicated by an arrow AR. As illustrated in FIG. 31, the trench gate extends along the arrangement direction of the control pad 410. Additionally, the same components as those in the semiconductor device 101 illustrated in FIG. 2 are denoted by the same reference signs and duplicated description is omitted.

Figure 32:
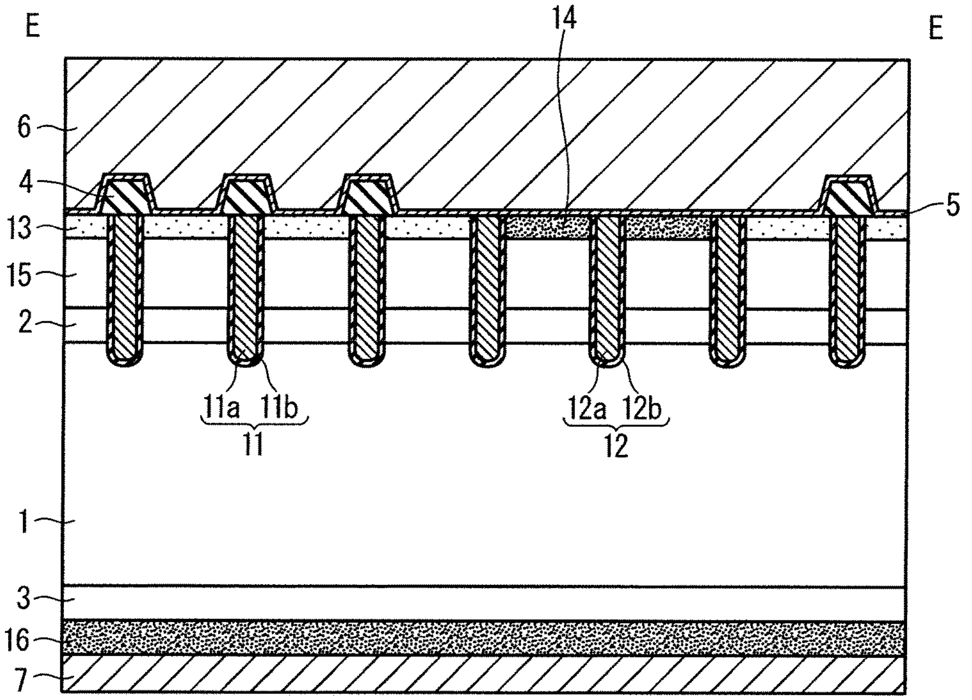
FIG. 32 is a partial sectional view of a diode region in the semiconductor device according to the fifth preferred embodiment.

FIG. 32 is a sectional view taken along a line E-E in FIG. 31 as seen from the arrow direction. The sectional configuration of the IGBT region 10 illustrated in FIG. 32 is the same as the sectional configuration of the IGBT region 10 illustrated in FIG. 4, the same components are denoted by the same reference signs, and duplicated description is omitted.

Figure 33:
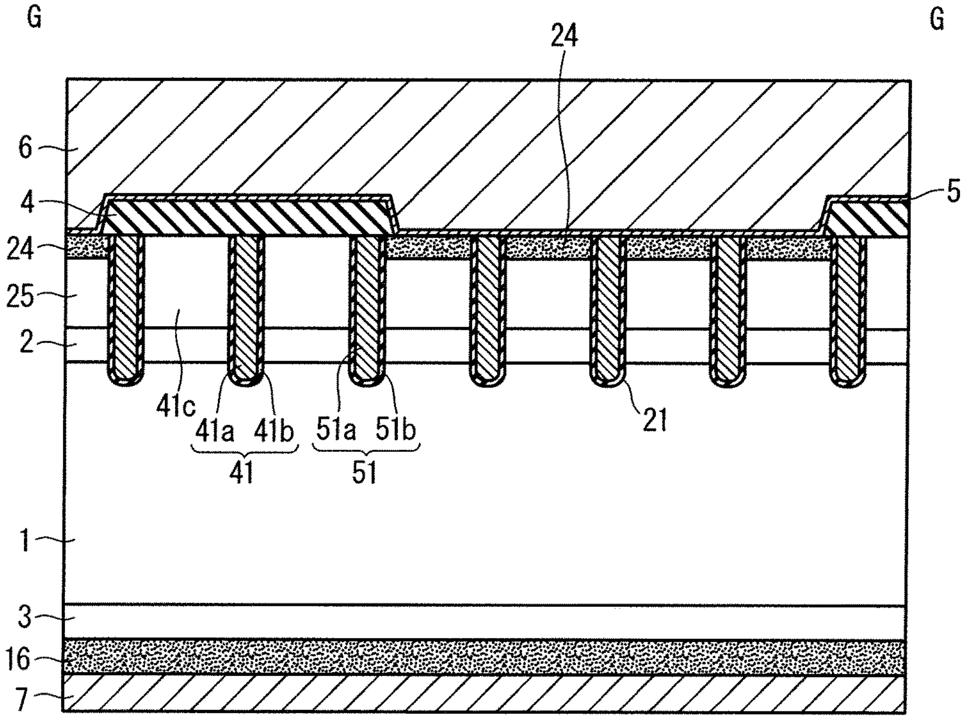
FIG. 33 is a partial sectional view of an IGBT region in the semiconductor device according to the fifth preferred embodiment.

FIG. 33 is a sectional view taken along a line G-G in FIG. 31 as seen from the arrow direction. The sectional configuration of the diode region 20 illustrated in FIG. 33 is basically the same as the sectional configuration of the RC-IGBT 2001 illustrated in FIG. 26, in which the diode dummy active trench gate 41 is provided adjacent to the diode dummy active semi-trench gate 51. Additionally, the same components as those in the RC-IGBT 2001 are denoted by the same reference signs and duplicated description is omitted.

As illustrated in FIG. 31, the IGBT region 10 and the diode region 20 are arranged so as to alternate with each other along the extending direction of the trench gate, and the trench gate penetrates the IGBT region 10 and the diode region 20 in plan view.

In this configuration, in the IGBT region 10, as illustrated in FIG. 32, the $n^+$-type source layer 13 is provided outside of one or both of two side surfaces of the active trench gate 11 including the gate trench electrode 11*a* electrically connected to the gate pad 410*c* (FIG. 31), for example, and the $n^+$-type source layer 13 is electrically connected to the emitter electrode 6.

On the other hand, in the diode region 20, as illustrated in FIG. 33, in the two diode dummy active semi-trench gates 51 and the diode dummy active trench gate 41 provided therebetween, the diode dummy active semi-trench electrodes 51*a* and the diode dummy active trench electrode 41*a* are electrically connected to the gate pad 410*c* (FIG. 31), respectively. Meanwhile, the p-type anode layer 41*c* provided between the diode dummy active trench gate 41 and the diode dummy active semi-trench gate 51 is not electrically connected to the emitter electrode 6 to be in a floating state.

<Effects>

As described above, the active trench gate 11 in the IGBT region 10 and the diode dummy active trench gate 41 and the diode dummy active semi-trench gate 51 in the diode region 20 are formed of trench gates continuous with each other, so that the feedback capacitance Cgc can be increased. The reason for it lies in addition of the feedback capacitance Cgc generated by the capacitor formed by the gate trench electrode 11*a*, the gate trench insulating film 11*b*, and the $n^-$-type drift layer 1 in the IGBT region 10.

<Modification>

Figure 34:
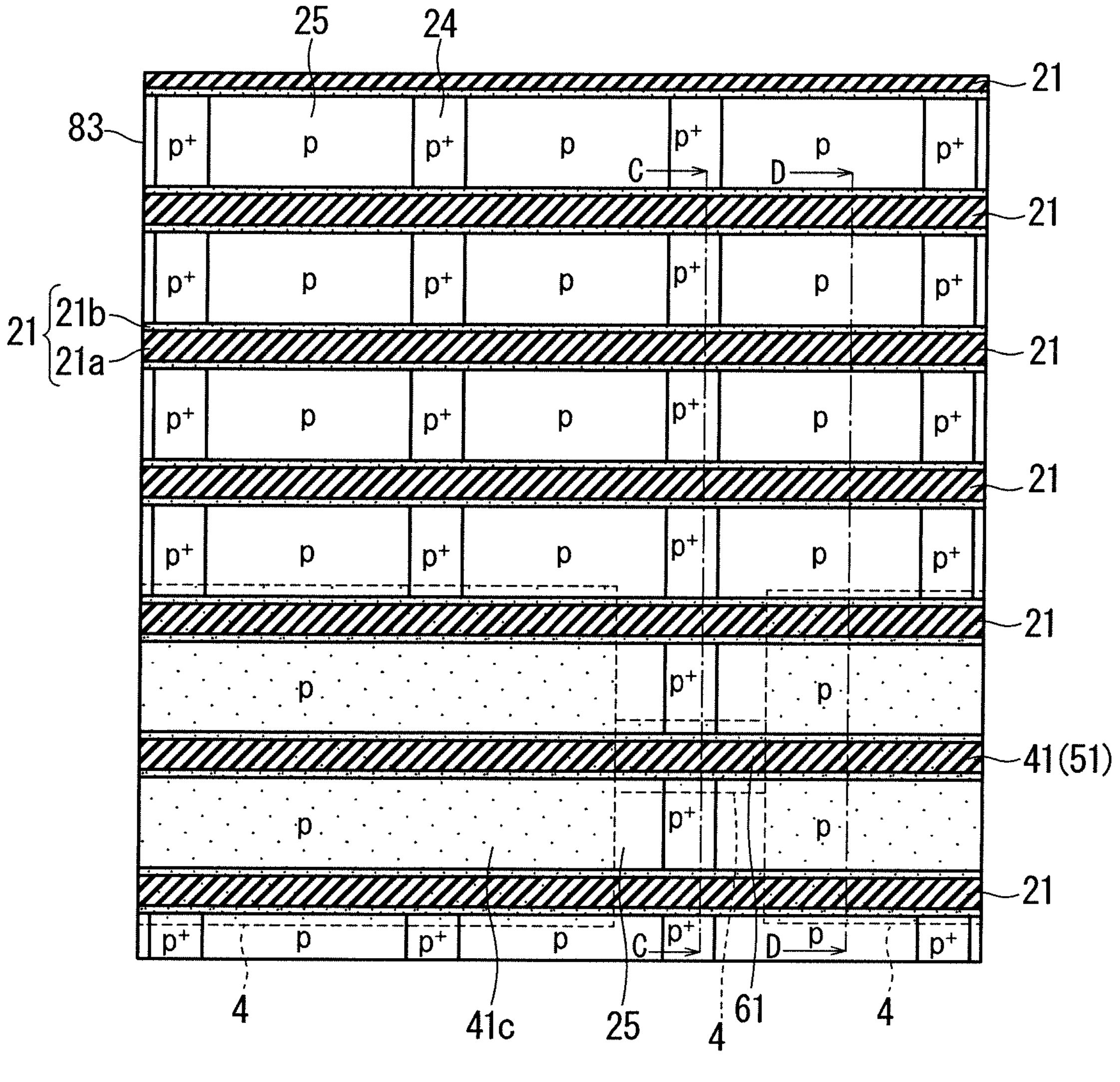
FIG. 34 is a partial plan view of the diode region in the semiconductor device according to the fifth preferred embodiment.

FIG. 34 is an enlarged partial plan view of a region 83 surrounded by a broken line in the diode region 20 in the semiconductor device 102 illustrated in FIG. 31. As illustrated in FIG. 34, in the diode region 20, the diode trench gate 21 extends along the first main surface of the semiconductor device 102 from one end of the diode region 20 that is the cell region, toward the opposite end. Between two adjacent diode trench gates 21, the $p^+$-type contact layer 24 and the p-type anode layer 25 are provided. Further, the diode dummy active trench gate 41 is provided so as to be interposed between the two diode trench gates 21.

Then, a part of the diode dummy active trench gate 41 along the extending direction thereof is formed as a diode active trench gate 61, which has an upper part covered with the interlayer insulating film 4. However, parts of the $p^+$-type contact layers 24 and the p-type anode layers 25 between which the diode active trench gate 61 is interposed are electrically connected to the emitter electrode.

Meanwhile, the p-type anode layers 41*c* between which the diode dummy active trench gate 41 is interposed have upper parts covered with the interlayer insulating film 4, and are not electrically connected to the emitter electrode to be in a floating state.

Figure 35:
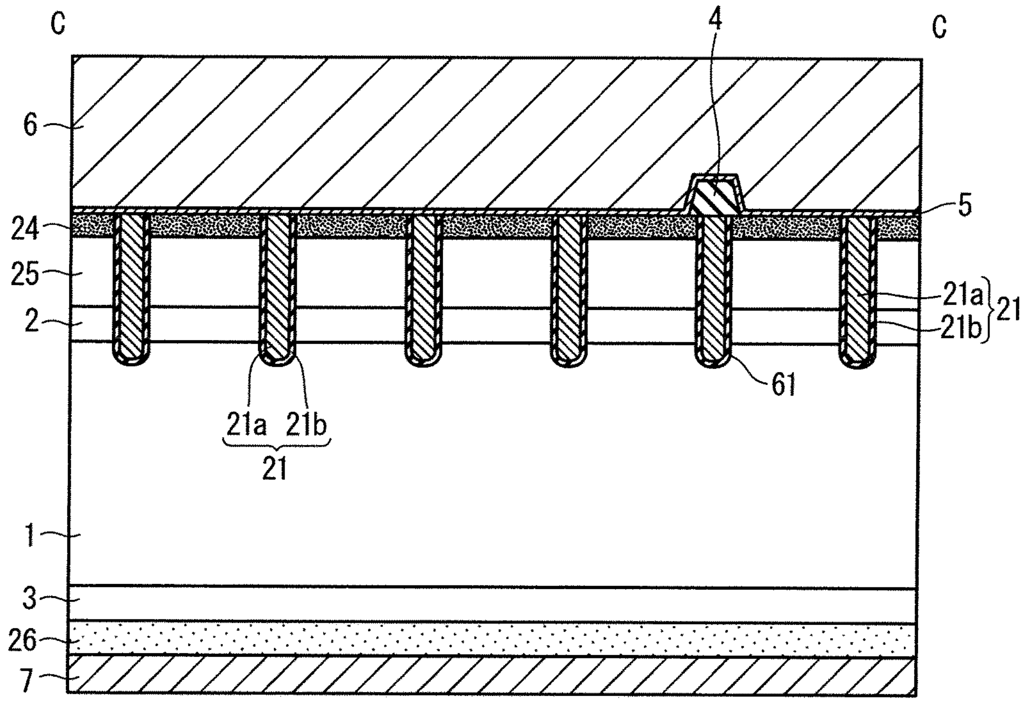
FIGS. 35 and 36 are partial sectional views of the diode region in the semiconductor device according to the fifth preferred embodiment.

FIG. 35 is a sectional view taken along a line C-C in FIG. 34 as seen from the arrow direction. As illustrated in FIG. 35, while the upper part of the diode active trench gate 61 is covered with the interlayer insulating film 4, the $p^+$-type contact layers 24 outside of the two side surfaces of the diode active trench gate 61 are electrically connected to the emitter electrode 6.

Figure 36:
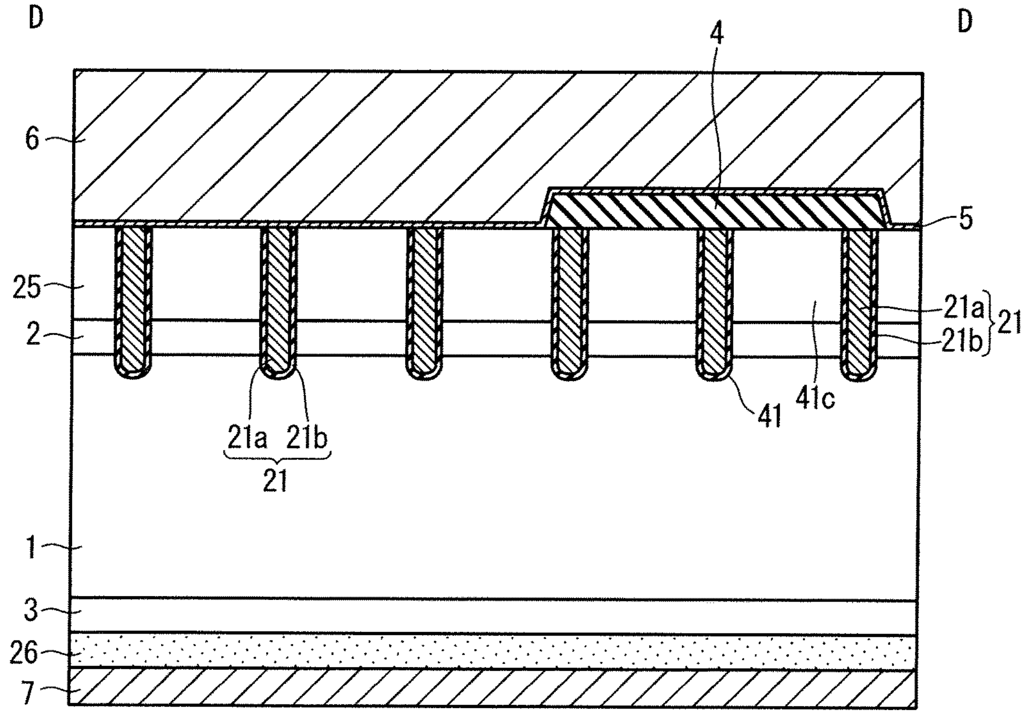

FIG. 36 is a sectional view taken along a line D-D in FIG. 34 as seen from the arrow direction. As illustrated in FIG. 36, the diode dummy active trench gate 41 and the two diode trench gates 21 between which the diode dummy active trench gate 41 is interposed are covered with the continuous interlayer insulating film 4, and the p-type anode layer 41*c* is not applied with an emitter potential to be in a floating state.

As described above, in the diode region 20, the region where the diode dummy active trench gate 41 is to be formed and the region where the diode active trench gate 61 is to be formed alternate with each other along the extending direction of the trench gate, and the trench electrodes of these trench gates are electrically connected to the gate pad 410*c*. Further, the trench electrodes of these trench gates serve as the gate trench electrodes 11*a* of the active trench gates 11 in the IGBT region 10. The active trench gate 11, the diode dummy active trench gate 41, and the diode active trench gate 61 are formed of trench gates continuous with each other. Additionally, the diode dummy active semi-trench gate 51 may be provided in place of the diode dummy active trench gate 41.

<Effects>

As described above, the active trench gate 11 in the IGBT region 10 and the diode dummy active trench gate 41 and the diode active trench gate 61 in the diode region 20 are formed of trench gates continuous with each other, so that the feedback capacitance Cgc can be increased. The reason for it lies in addition of the feedback capacitance Cgc generated by the capacitor formed by the gate trench electrode 11*a*, the gate trench insulating film 11*b*, and the $n^-$-type drift layer 1 in the IGBT region 10.

<Applicable Semiconductor Material>

While materials forming the semiconductor substrate have not been specifically described in the above-described first to fifth preferred embodiments, the material forming the semiconductor substrate can be formed of silicon (Si) or silicon carbide (SiC).

A switching element formed of SiC has a small switching loss and can perform a high-speed switching operation.

Further, a switching element formed of SiC has a small power loss and high heat resistance. Therefore, in forming a power module including a cooling unit, a heat-dissipation fin of a heat sink can be downsized, which enables further downsizing of a semiconductor module.

Moreover, a switching element formed of SiC is suitable for a high-frequency switching operation. For this reason, in a case where a switching element is applied to a converter circuit that is considerably required to increase a frequency, a reactor, a capacitor, or the like connected to the converter circuit can be downsized by increase of a switching frequency.

A wide-bandgap semiconductor other than SiC can be formed of a gallium nitride-based material, a gallium oxide-based material, diamond, or the like.

Additionally, in the present disclosure, the respective preferred embodiments can be freely combined and each of the preferred embodiments can be appropriately modified or omitted within the scope of the disclosure.

While the disclosure has been shown and described in detail, the foregoing description is in all aspects illustrative and not restrictive. It is therefore understood that numerous modifications and variations can be devised.

What is claimed is:

1. A semiconductor device in which a transistor and a diode are formed on a common semiconductor substrate, wherein the semiconductor substrate includes:

a transistor region in which the transistor is formed; and a diode region in which the diode is formed, the diode region includes:

a first semiconductor layer of a first conductivity type provided on a second-main-surface side in the semiconductor substrate;

a second semiconductor layer of the first conductivity type provided on the first semiconductor layer;

a third semiconductor layer of a second conductivity type provided closer to a first main surface of the semiconductor substrate than the second semiconductor layer;

a first main electrode that applies a first potential to the diode;

a second main electrode that applies a second potential to the diode; and at least one dummy active trench gate provided so as to extend from the first main surface of the semiconductor substrate and reach the second semiconductor layer, the at least one dummy active trench gate includes the third semiconductor layer that is not applied with the first potential to be in a floating state on at least one of two side surfaces, and the at least one dummy active trench gate is applied with a gate potential of the transistor.

2. The semiconductor device according to claim 1, wherein the diode region includes a plurality of trench gates provided so as to extend from the first main surface of the semiconductor substrate and reach the second semiconductor layer, the at least one dummy active trench gate is provided so as to be interposed between two semi-trench gates, the third semiconductor layer in a floating state is provided between the at least one dummy active trench gate and the two semi-trench gates, each of the plurality of trench gates includes the third semiconductor layer applied with the first potential on both of two side surfaces, each of the two semi-trench gates includes the third semiconductor layer in a floating state on one of two side surfaces that is closer to the at least one dummy active trench gate, and includes the third semiconductor layer applied with the first potential on the other side surface, and the plurality of trench gates and the two semi-trench gates are applied with the first potential.

3. The semiconductor device according to claim 2, wherein the at least one dummy active trench gate includes a plurality of dummy active trench gates provided between the two semi-trench gates.

4. The semiconductor device according to claim 1, wherein the diode region includes a plurality of trench gates provided so as to extend from the first main surface of the semiconductor substrate and reach the second semiconductor layer, the at least one dummy active trench gate is provided as two dummy active semi-trench gates arranged to face each other, each of the two dummy active semi-trench gates includes the third semiconductor layer in a floating state on one of two side surfaces that faces the other dummy active semi-trench gate, and includes the third semiconductor layer applied with the first potential on the other side surface, each of the plurality of trench gates includes the third semiconductor layer applied with the first potential on both of two side surfaces, the two dummy active semi-trench gates are applied with the gate potential of the transistor, and the plurality of trench gates are applied with the first potential.

5. The semiconductor device according to claim 1, wherein the diode region includes a plurality of trench gates provided so as to extend from the first main surface of the semiconductor substrate and reach the second semiconductor layer, the at least one dummy active trench gate is provided so as to be interposed between two dummy active semi-trench gates, the third semiconductor layer in a floating state is provided between the at least one dummy active trench gate and the two dummy active semi-trench gates, each of the plurality of trench gates includes the third semiconductor layer applied with the first potential on both of two side surfaces, each of the two dummy active semi-trench gates includes the third semiconductor layer in a floating state on one of two side surfaces that is closer to the at least one dummy active trench gate, and includes the third semiconductor layer applied with the first potential on the other side surface, the two dummy active semi-trench gates are applied with the gate potential of the transistor, and the plurality of trench gates are applied with the first potential.

6. The semiconductor device according to claim 5, wherein the at least one dummy active trench gate includes a plurality of dummy active trench gates provided between the two dummy active semi-trench gates.

7. The semiconductor device according to claim 5, wherein an interval between the at least one dummy active trench gate and the two dummy active semi-trench gates is smaller than an interval between the plurality of trench gates, at maximum.

8. The semiconductor device according to claim 5, wherein the at least one dummy active trench gate branches in a direction perpendicular to an extending direction at a plurality of positions along the extending direction, and is connected to the two dummy active semi-trench gates, so that the at least one dummy active trench gate and the two dummy active semi-trench gates form a grid-shaped pattern in plan view.

9. The semiconductor device according to claim 1, wherein the diode region includes a plurality of active trench gates and a plurality of trench gates provided so as to extend from the first main surface of the semiconductor substrate and reach the second semiconductor layer, the at least one dummy active trench gate is provided so as to be interposed between two dummy active semi-trench gates, the third semiconductor layer in a floating state is provided between the at least one dummy active trench gate and the two dummy active semi-trench gates, each of the plurality of active trench gates includes the third semiconductor layer applied with the first potential on both of two side surfaces, each of the two dummy active semi-trench gates includes the third semiconductor layer in a floating state on one of two side surfaces that is closer to the at least one dummy active trench gate, and includes the third semiconductor layer applied with the first potential on the other side surface, and the plurality of active trench gates and the two dummy active semi-trench gates are applied with the gate potential of the transistor.

10. The semiconductor device according to claim 9, wherein the at least one dummy active trench gate includes a plurality of dummy active trench gates provided between the two dummy active semi-trench gates.

11. The semiconductor device according to claim 9, wherein an interval between the at least one dummy active trench gate and the two dummy active semi-trench gates is smaller than an interval between a plurality of trench gates, at maximum.

12. The semiconductor device according to claim 9, wherein the at least one dummy active trench gate branches in a direction perpendicular to an extending direction at a plurality of positions along the extending direction, and is connected to the two dummy active semi-trench gates, so that the at least one dummy active trench gate and the two dummy active semi-trench gates form a grid-shaped pattern in plan view.

13. The semiconductor device according to claim 1, wherein the transistor region and the diode region are arranged so as to alternate with each other along an extending direction of a trench gate, the trench gate is provided so as to penetrate the transistor region and the diode region in plan view, and the at least one dummy active trench gate is provided so as to extend from the first main surface of the semiconductor substrate and reach the second semiconductor layer and is provided so as to be continuous with an active trench gate applied with the gate potential of the transistor, in the transistor region.

14. The semiconductor device according to claim 1, wherein the transistor region and the diode region are arranged so as to alternate with each other along an extending direction of a trench gate, the trench gate is provided so as to penetrate the transistor region and the diode region in plan view, the diode region includes a region where the at least one dummy active trench gate is provided and a region where at least one active trench gate provided so as to extend from the first main surface of the semiconductor substrate and reach the second semiconductor layer is provided, the regions being arranged so as to alternate with each other, and the at least one dummy active trench gate and the at least one active trench gate are provided so as to extend from the first main surface of the semiconductor substrate and reach the second semiconductor layer and are provided so as to be continuous with an active trench gate applied with the gate potential of the transistor, in the transistor region.

15. The semiconductor device according to claim 1, wherein the semiconductor substrate is formed of a material selected from a group consisting of silicon, silicon carbide, a gallium nitride-based material, a gallium oxide-based material, and diamond.

16. A semiconductor device in which a transistor and a diode are formed on a common semiconductor substrate, wherein the semiconductor substrate includes:

a transistor region in which the transistor is formed; and a diode region in which the diode is formed, the diode region includes:

a first semiconductor layer of a first conductivity type provided on a second-main-surface side in the semiconductor substrate;

a second semiconductor layer of the first conductivity type provided on the first semiconductor layer;

a third semiconductor layer of a second conductivity type provided closer to a first main surface of the semiconductor substrate than the second semiconductor layer;

a first main electrode that applies a first potential to the diode;

a second main electrode that applies a second potential to the diode; and at least one dummy active trench gate provided so as to extend from the first main surface of the semiconductor substrate and reach the second semiconductor layer, the at least one dummy active trench gate includes the second semiconductor layer that is not applied with the first potential to be in a floating state on at least one of two side surfaces, and the at least one dummy active trench gate is applied with a gate potential of the transistor.

* * * * *